United States Patent

Nagai et al.

[11] Patent Number: 5,852,469
[45] Date of Patent: Dec. 22, 1998

[54] MOVING PICTURE CODING AND/OR DECODING SYSTEMS, AND VARIABLE-LENGTH CODING AND/OR DECODING SYSTEM

[75] Inventors: Takeshi Nagai, Higashi-Murayama; Yoshihiro Kikuchi; Toshiaki Watanabe, both of Yokohama; Takeshi Chujoh, Tokyo-to, all of Japan

[73] Assignee: Kabushiki Kaisha Toshiba, Kawasaki, Japan

[21] Appl. No.: 616,809

[22] Filed: Mar. 15, 1996

[30] Foreign Application Priority Data

| Mar. 15, 1995 | [JP] | Japan | 7-056285 |
| Apr. 14, 1995 | [JP] | Japan | 7-089772 |
| Oct. 6, 1995 | [JP] | Japan | 7-260383 |
| Oct. 25, 1995 | [JP] | Japan | 7-277982 |
| Mar. 8, 1996 | [JP] | Japan | 8-080550 |

[51] Int. Cl.$^6$ ............ H04N 7/18; H03M 13/00
[52] U.S. Cl. ............ 348/384; 348/466; 348/419; 341/67; 341/82
[58] Field of Search ............ 348/415, 419, 348/416, 384, 465, 466, 845.1; 341/67, 94, 107, 82; 371/30

[56] References Cited

U.S. PATENT DOCUMENTS

| 5,302,949 | 4/1994 | Yoshinari et al. | 341/67 |
| 5,392,037 | 2/1995 | Kato | 341/67 |
| 5,469,273 | 11/1995 | Demura | 348/426 |
| 5,488,616 | 1/1996 | Takishima | 371/30 |
| 5,563,593 | 10/1996 | Puri | 341/67 |
| 5,625,356 | 4/1997 | Lee et al. | 341/67 |

FOREIGN PATENT DOCUMENTS 5-300027  11/1993  Japan.

Primary Examiner—Tommy P. Chin
Assistant Examiner—Anand Rao
Attorney, Agent, or Firm—Foley & Lardner

[57] ABSTRACT

A moving picture coding and/or decoding system includes a encoder for coding input image data, a divider for dividing a code string supplied from the encoder, into a plurality of code string, a reorderer for arranging at least one of the plurality of code string in the forward direction from the head to the end, and at least one of the other code string in the backward direction from the head to the end. A variable-length coding system includes a code-word table for storing a plurality of code words so that the code words correspond to source symbols, and an encoder for selecting a code word corresponding to the source symbol inputted from the code-word table and for outputting the selected code word as coded data. The plurality of code words can be decoded in either of the forward and backward directions. The plurality of code words are configured so that the pause between codes can be detected by a predetermined weight of the code word (in the case of a binary code, the number of "1" or "0" in the code word).

8 Claims, 67 Drawing Sheets

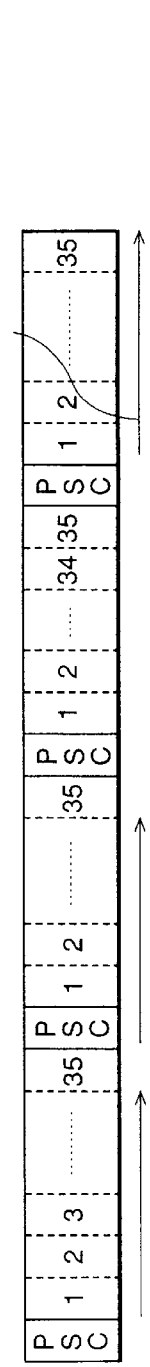
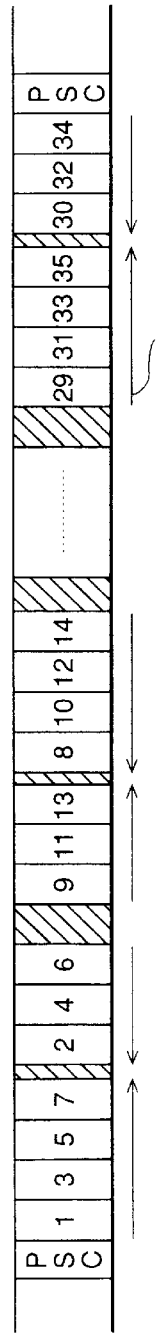
FIG.2A PRIOR ART
FIG.2B PRIOR ART
FIG.2C PRIOR ART

|   |   |   |   |   |   |   |
|---|---|---|---|---|---|---|
| 1 |   | 2 |   | 3 |   | 4 |
|   | 5 |   | 6 |   | 7 |   |
| 8 |   | 9 |   | 10|   | 11|
|   | 12|   | 13|   | 14|   |
| 15|   | 16|   | 17|   | 18|

FIG.8A

|   |   |   |   |   |   |   |
|---|---|---|---|---|---|---|
|   | 35|   | 34|   | 33|   |
| 32|   | 31|   | 30|   | 29|
|   | 28|   | 27|   | 26|   |
| 25|   | 24|   | 23|   | 22|
|   | 21|   | 20|   | 19|   |

FIG.8B

|   | 9 |   | 10 |   | 11 |   |
|---|---|---|----|---|----|---|
| 15 |   | 3 |   | 4 |   | 16 |
|   | 8 |   | 1 |   | 12 |   |
| 14 |   | 2 |   | 5 |   | 17 |
|   | 7 |   | 6 |   | 13 |   |

FIG.10A

| 33 |   | 25 |   | 24 |   | 32 |
|----|---|----|---|----|---|----|
|   | 26 |   | 19 |   | 23 |   |
| 34 |   | 20 |   | 18 |   | 31 |
|   | 27 |   | 21 |   | 22 |   |
| 35 |   | 28 |   | 29 |   | 30 |

FIG.10B

| 18 | 17 | 16 | 15 | 14 | 13 | 12 |
|----|----|----|----|----|----|----|
| 11 | 10 | 9  | 8  | 7  | 6  | 5  |
| 4  | 3  | 2  | 1  |    |    |    |
|    |    |    |    |    |    |    |
|    |    |    |    |    |    |    |

FIG.11A

|    |    |    |    |    |    |    |
|----|----|----|----|----|----|----|
|    |    |    |    |    |    |    |
|    |    |    |    | 19 | 20 | 21 |
| 22 | 23 | 24 | 25 | 26 | 27 | 28 |
| 29 | 30 | 31 | 32 | 33 | 34 | 35 |

FIG.11B

|    | 12 |    | 13 |    | 14 |    |
|----|----|----|----|----|----|----|
| 11 |    | 5  |    | 6  |    | 17 |
|    | 4  | 1  | 2  |    | 15 |    |
| 10 |    | 3  |    | 7  |    | 18 |
|    | 9  |    | 8  |    | 16 |    |

▨ : MOST IMPORTANT REGION

FIG.12A

| 25 |    | 24 |    | 31 |    | 36 |
|----|----|----|----|----|----|----|
|    | 20 |    | 23 |    | 33 |    |
| 26 |    | 19 |    | 30 |    | 35 |
|    | 21 |    | 22 |    | 32 |    |
| 27 |    | 28 |    | 29 |    | 34 |

▨ : MOST IMPORTANT REGION

FIG.12B

| 54 | 46 | 53 | 47 | 52 | 48 | 51 | 49 | 50 |
|----|----|----|----|----|----|----|----|----|
| 33 | 67 | 34 | 66 | 35 | 65 | 36 | 64 | 37 |
| 68 | 19 | 81 | 20 | 80 | 21 | 79 | 22 | 63 |
| 32 | 82 | 9  | 91 | 10 | 90 | 11 | 78 | 38 |
| 69 | 18 | 92 | 3  | 97 | 4  | 89 | 23 | 62 |
| 31 | 83 | 8  | 98 | 1  | 96 | 12 | 77 | 39 |
| 70 | 17 | 93 | 2  | 99 | 5  | 88 | 24 | 61 |
| 30 | 84 | 7  | 94 | 6  | 95 | 13 | 76 | 40 |
| 71 | 16 | 85 | 15 | 86 | 14 | 87 | 25 | 60 |
| 29 | 72 | 28 | 73 | 27 | 74 | 26 | 75 | 41 |
| 55 | 45 | 56 | 44 | 57 | 43 | 58 | 42 | 59 |

FIG.13

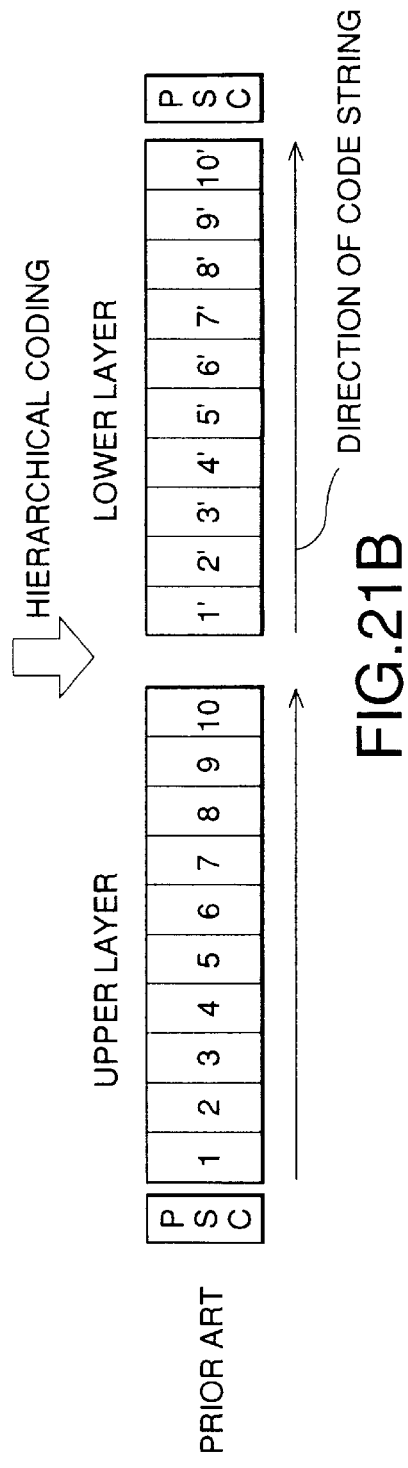
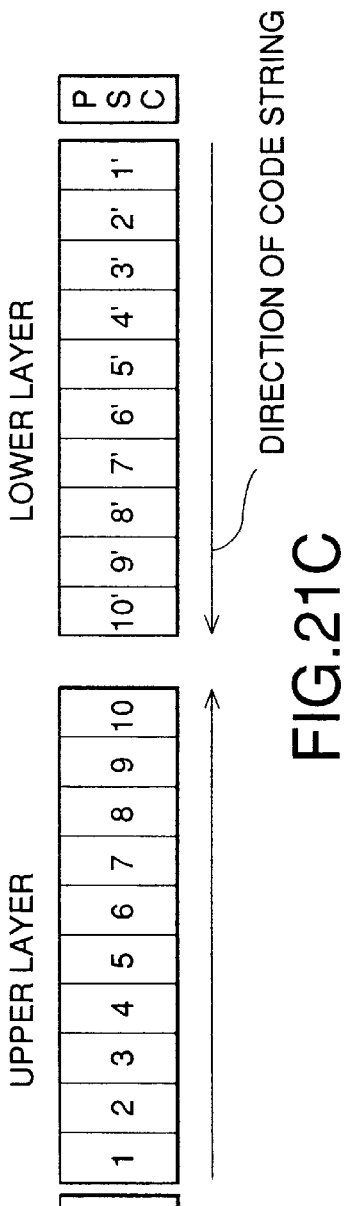
FIG.21A
FIG.21B  PRIOR ART
FIG.21C  THIS INVENTION

FIRST CODE STRING : $b_{1,1}\ b_{1,2}\ b_{1,3}\ \cdots\ \cdots\ \cdot\ b_{1,m}$

SECOND CODE STRING : $b_{2,1}\ b_{2,2}\ b_{2,3}\ \cdots\ \cdots\ \cdot\ b_{2,n}$ THIRD CODE STRING : $b_{3,1}\ b_{3,2}\ b_{3,3}\ \cdots\ \cdots\ \cdot\ b_{3,s}$

DIRECTION OF CODE STRING

DIRECTION OF CODE STRING

DIRECTING HEAD OF INVERSED CODE STRING

|   | ORDER | REVERSE |
|---|-------|---------|
| A | 0     | 0       |
| B | 1 0 0 | 0 0 1   |
| C | 1 0 1 | 1 0 1   |
| D | 1 1   | 1 1     |
FIG.34A PRIOR ART
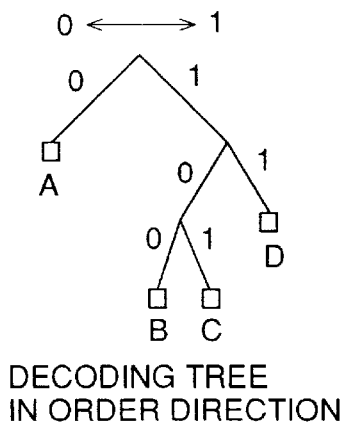
DECODING TREE
IN ORDER DIRECTION
FIG.34B PRIOR ART
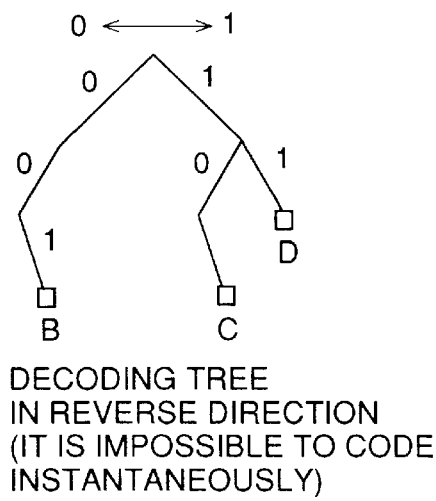
DECODING TREE
IN REVERSE DIRECTION
(IT IS IMPOSSIBLE TO CODE
INSTANTANEOUSLY)
FIG.34C PRIOR ART

|   | ORDER DIRECTION | REVERSE DIRECTION |
|---|---|---|
| A | 0 | 0 |
| B | 1 1 1 | 1 1 1 |
| C | 1 0 1 1 | 1 1 0 1 |
| D | 1 1 0 1 | 1 0 1 1 |
FIG.35A PRIOR ART
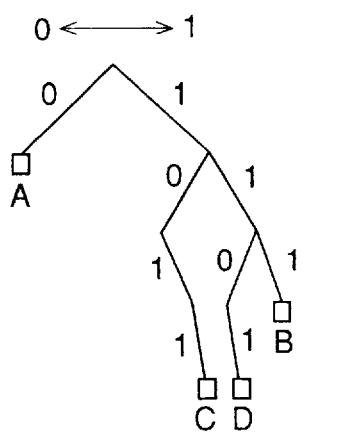
DECODING TREE
IN ORDER DIRECTION
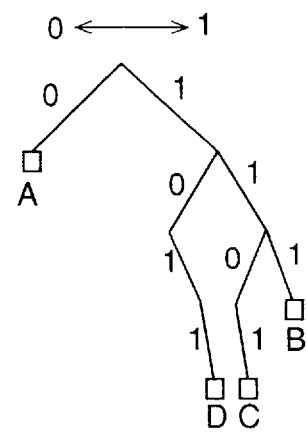
DECODING TREE
INVERSE DIRECTION
FIG.35B
PRIOR ART
FIG.35C
PRIOR ART

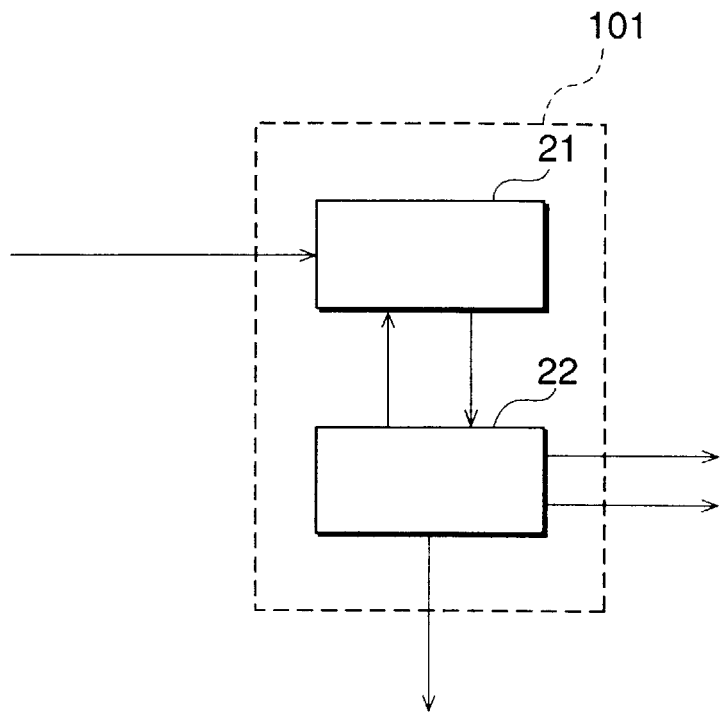
FIG.38
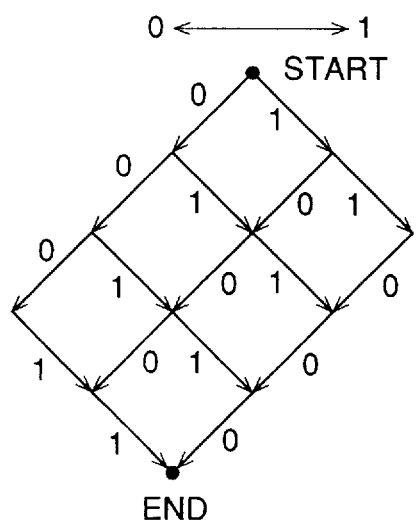
FIG.39A
$$\begin{array}{ccccc} 0 & 0 & 0 & 1 & 1 \\ 0 & 0 & 1 & 0 & 1 \\ 0 & 0 & 1 & 1 & 0 \\ 0 & 1 & 0 & 0 & 1 \\ 0 & 1 & 0 & 1 & 0 \\ 0 & 1 & 1 & 0 & 0 \\ 1 & 0 & 0 & 0 & 1 \\ 1 & 0 & 0 & 1 & 0 \\ 1 & 0 & 1 & 0 & 0 \\ 1 & 1 & 0 & 0 & 0 \end{array} \Bigg\} \binom{5}{2}=10$$
FIG.39B

DECODING TREE IN THE ORDER

DECODING TREE IN REVERSE DIRECTION

DECODING TREE IN THE ORDER DIRECTION

DECODING TREE IN REVERSE DIRECTION

```
A    0  1
B    1  0
C    0  0  1  1
D    1  1  0  0
E    0  0  0  1  1  1
F    0  0  1  0  1  1
G    1  1  0  1  0  0
H    1  1  1  0  0  0
```

DECODING TREE IN ORDER DIRECTION

DECODING TREE IN REVERSE DIRECTION

| | | | | | | | | | |
|---|---|---|---|---|---|---|---|---|---|
| A | 0 | 0 | 0 | | A | 0 | 0 | 0 | |
| B | 1 | 1 | 1 | | B | 1 | 1 | 1 | |
| C | 0 | 1 | 0 | 0 | C | 0 | 1 | 0 | 0 |
| D | 1 | 0 | 1 | 1 | D | 1 | 0 | 1 | 1 |
| E | 0 | 0 | 1 | 0 | E | 0 | 0 | 1 | 0 |
| F | 1 | 1 | 0 | 1 | F | 1 | 1 | 0 | 1 |
| G | 0 | 1 | 1 | 0 | 0 | G | 0 | 1 | 1 | 0 |
| H | 1 | 0 | 0 | 1 | 1 | H | 1 | 0 | 0 | 1 |
| I | 0 | 1 | 0 | 1 | 0 | I | 0 | 1 | 0 | 1 |
| J | 1 | 0 | 1 | 0 | 1 | J | 1 | 0 | 1 | 0 |

SHORTENING →

FIG.46

DECODING TREE IN ORDER DIRECTION

DECODING TREE IN REVERSE DIRECTION

| SYMBOL | OCCURRENCE PROBABILITY | HUFFMAN'S CODE | PRIOR ART | THE PRESENT INVENTION |
|---|---|---|---|---|
| E | 0.14878570 | 001 | 001 | 000 |
| T | 0.09354149 | 110 | 110 | 001 |
| A | 0.08833733 | 0000 | 0000 | 010 |
| O | 0.07245796 | 0100 | 0100 | 011 |
| R | 0.06872164 | 0101 | 1000 | 1100 |
| N | 0.06498532 | 0110 | 1010 | 1101 |
| H | 0.05831331 | 1000 | 0101 | 1110 |
| I | 0.05644515 | 1001 | 11100 | 1111 |
| S | 0.05537763 | 1010 | 01100 | 10100 |
| D | 0.04376834 | 00010 | 00010 | 10101 |
| L | 0.04123298 | 00011 | 10010 | 10110 |
| U | 0.02762209 | 10110 | 01111 | 10111 |
| P | 0.02575393 | 10111 | 10111 | 100100 |
| F | 0.02455297 | 11100 | 11111 | 100101 |
| M | 0.02361889 | 11110 | 111101 | 100110 |
| C | 0.02081665 | 11111 | 101101 | 100111 |
| W | 0.01868161 | 011100 | 000111 | 1000100 |
| G | 0.01521216 | 011101 | 011101 | 1000101 |
| Y | 0.01521216 | 011110 | 100111 | 1000110 |
| B | 0.01267680 | 011111 | 1001101 | 1000111 |
| V | 0.01160928 | 111011 | 01110011 | 10000100 |
| K | 0.00867360 | 1110100 | 00011011 | 10000101 |
| X | 0.00146784 | 11101011 | 000110011 | 10000110 |
| J | 0.00080064 | 111010101 | 0001101011 | 10000111 |
| Q | 0.00080064 | 1110101000 | 00011010011 | 100000100 |
| Z | 0.00053376 | 1110101001 | 000110100011 | 100000101 |
|  |  | 4.155572453 | 4.36068869 | 4.23658855 |

FIG.49

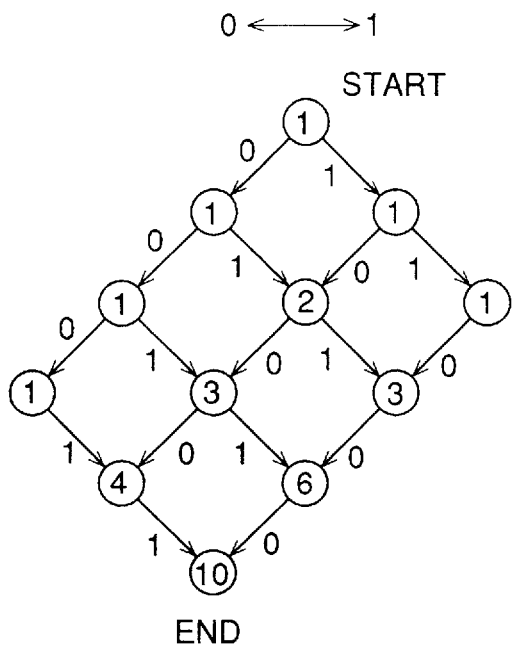
FIG.52A
| ORDER VALUE | CODE |
|---|---|
| 0 | 0 0 0 1 1 |
| 1 | 0 0 1 0 1 |
| 2 | 0 1 0 0 1 |
| 3 | 1 0 0 0 1 |
| 4 | 0 0 1 1 0 |
| 5 | 0 1 0 1 0 |
| 6 | 1 0 0 1 0 |
| 7 | 0 1 1 0 0 |
| 8 | 1 0 1 0 0 |
| 9 | 1 1 0 0 0 |
FIG.52B
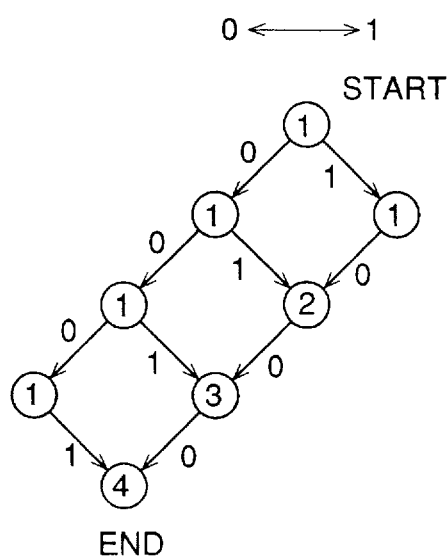
FIG.53A
| DECODE VALUE | ORDER VALUE | CODE |
|---|---|---|
| 0 |  | 0 |
| 1 | 0 | 0 1 1 |
| 2 | 0 | 1 0 1 |
| 3 | 1 | 1 1 0 |
| 4 | 0 | 1 0 0 1 |
| 5 | 1 | 1 0 1 1 |
| 6 | 2 | 1 1 0 1 |
| 7 | 0 | 1 0 0 1 1 |
| 8 | 1 | 1 0 0 0 1 |
| 9 | 2 | 1 0 1 0 1 |
FIG.53B

DECODING TREE

DECODING GRAPH

| DECODE VALUE | DATA SYMBOL |
|---|---|
| 0 | A |
| 1 | B |
| 2 | ESCAPE |
| 3 | C |
| 4 | D |
| 5 | E |
| 6 | F |
| 7 | G |
| 8 | H |
| 9 | I |

DECODE VALUE TABLE OF CODE (1)

FIG.55A

| DECODE VALUE | DATA SYMBOL |
|---|---|
| 0 | J |
| 1 | K |
| 2 | L |
| 3 | M |
| 4 | N |
| 5 | O |
| 6 | P |
| 7 | Q |

DECODE VALUE TABLE
OF FIXED-LENGTH CODE

FIG.55B

PICTURE LAYER

UPPER LAYER

LOWER LAYER

| Index | INTRA LAST | INTRA RUN | INTRA LEVEL | INTER LAST | INTER RUN | INTER LEVEL | VLC_CODE |
|---|---|---|---|---|---|---|---|
| 0 | 0 | 0 | 1 | 0 | 0 | 1 | 000s |
| 1 | 0 | 0 | 2 | 0 | 1 | 1 | 111s |
| 3 | 0 | 1 | 1 | 0 | 2 | 1 | 0010s |
| 4 | 0 | 0 | 3 | 0 | 3 | 1 | 1011s |
| 5 | 0 | 2 | 1 | 0 | 0 | 2 | 1101s |
| 7 | 0 | 0 | 4 | 0 | 4 | 1 | 01010s |
| 8 | 0 | 3 | 1 | 0 | 5 | 1 | 00110s |
| 9 | 0 | 1 | 2 | 0 | 6 | 1 | 10011s |
| 10 | 0 | 4 | 1 | 0 | 7 | 1 | 10101s |
| 11 | 0 | 0 | 5 | 0 | 8 | 1 | 11001s |
| 16 | 0 | 5 | 1 | 0 | 9 | 1 | 100011s |
| 17 | 0 | 6 | 1 | 0 | 10 | 1 | 100101s |
| 18 | 0 | 1 | 3 | 0 | 11 | 1 | 101001s |
| 19 | 0 | 7 | 1 | 0 | 0 | 3 | 110001s |
| 25 | 0 | 0 | 6 | 0 | 1 | 2 | 1000011s |
| 26 | 0 | 2 | 2 | 0 | 12 | 1 | 1000101s |
| 27 | 0 | 3 | 2 | 0 | 13 | 1 | 1001001s |
| 28 | 0 | 8 | 1 | 0 | 14 | 1 | 1010001s |
| 29 | 0 | 0 | 7 | 0 | 2 | 2 | 1100001s |
| 36 | 0 | 1 | 4 | 0 | 15 | 1 | 10000011s |
| 37 | 0 | 9 | 1 | 0 | 8 | 2 | 10000101s |
| 38 | 0 | 4 | 2 | 0 | 17 | 1 | 10001001s |
| 39 | 0 | 10 | 1 | 0 | 0 | 4 | 10010001s |
| 40 | 0 | 0 | 8 | 0 | 16 | 1 | 10100001s |
| 47 | 0 | 1 | 5 | 0 | 4 | 2 | 010111110s |
| 48 | 0 | 5 | 2 | 0 | 5 | 2 | 001111110s |
| 49 | 0 | 0 | 9 | 0 | 18 | 1 | 100000011s |
| 50 | 0 | 7 | 2 | 0 | 25 | 1 | 100000101s |
| 51 | 0 | 2 | 3 | 0 | 19 | 1 | 100001001s |
| 52 | 0 | 11 | 1 | 0 | 1 | 3 | 100010001s |
| 53 | 0 | 12 | 1 | 0 | 0 | 5 | 100100001s |
| 54 | 0 | 1 | 6 | 0 | 20 | 1 | 101000001s |
| 55 | 0 | 0 | 11 | 0 | 6 | 2 | 110000001s |
| 64 | 0 | 13 | 1 | 0 | 23 | 1 | 1000000011s |
| 65 | 0 | 3 | 3 | 0 | 7 | 2 | 1000000101s |
| 66 | 0 | 8 | 2 | 0 | 21 | 1 | 1000001001s |
| 67 | 0 | 0 | 10 | 0 | 24 | 1 | 1000010001s |
| 68 | 0 | 6 | 2 | 0 | 22 | 1 | 1000100001s |
| 69 | 0 | 5 | 3 | 0 | 27 | 1 | 1001000001s |
| 70 | 0 | 9 | 2 | 0 | 8 | 2 | 1010000001s |
| 71 | 0 | 10 | 2 | 0 | 9 | 2 | 1100000001s |
| 78 | 0 | 2 | 4 | 0 | 1 | 4 | 01101111110s |
| 79 | 0 | 3 | 4 | 0 | 26 | 1 | 01011111110s |
| 80 | 0 | 0 | 12 | 0 | 3 | 3 | 00111111110s |
| 81 | 0 | 1 | 7 | 0 | 29 | 1 | 10000000011s |
| 82 | 0 | 3 | 5 | 0 | 2 | 3 | 10000000101s |
| 83 | 0 | 6 | 3 | 0 | 31 | 1 | 10000001001s |
| 84 | 0 | 11 | 2 | 0 | 0 | 6 | 10000010001s |
| 85 | 0 | 4 | 3 | 0 | 5 | 3 | 10000100001s |
| 86 | 0 | 7 | 3 | 0 | 10 | 2 | 10001000001s |
| 87 | 0 | 0 | 15 | 0 | 40 | 1 | 10010000001s |
| 88 | 0 | 1 | 8 | 0 | 2 | 4 | 10100000001s |
| 89 | 0 | 0 | 14 | 0 | 14 | 2 | 11000000001s |

FIG.59

| Index | INTRA LAST | RUN | LEVEL | INTER LAST | RUN | LEVEL | VLC_CODE |
|---|---|---|---|---|---|---|---|
| 99  | 0 | 8  | 3  | 0 | 28 | 1  | 001111111110s |
| 100 | 0 | 15 | 1  | 0 | 11 | 2  | 100000000011s |
| 101 | 0 | 1  | 10 | 0 | 12 | 2  | 100000000101s |
| 102 | 0 | 2  | 5  | 0 | 0  | 7  | 100000001001s |
| 103 | 0 | 3  | 6  | 0 | 30 | 1  | 100000010001s |
| 104 | 0 | 5  | 4  | 0 | 33 | 1  | 100000100001s |
| 105 | 0 | 0  | 13 | 0 | 6  | 3  | 100001000001s |
| 106 | 0 | 11 | 3  | 0 | 13 | 2  | 100010000001s |
| 107 | 0 | 14 | 1  | 0 | 1  | 5  | 100100000001s |
| 108 | 0 | 4  | 4  | 0 | 4  | 4  | 101000000001s |
| 109 | 0 | 7  | 4  | 0 | 7  | 3  | 110000000001s |
| 117 | 0 | 1  | 9  | 0 | 32 | 1  | 0111011111110s |
| 118 | 0 | 6  | 4  | 0 | 37 | 1  | 0110111111110s |
| 119 | 0 | 1  | 11 | 0 | 15 | 2  | 0101111111110s |
| 120 | 0 | 20 | 1  | 0 | 38 | 1  | 0011111111110s |
| 121 | 0 | 3  | 10 | 0 | 4  | 3  | 1000000000011s |
| 122 | 0 | 3  | 9  | 0 | 8  | 3  | 10000000000101s |
| 123 | 0 | 5  | 5  | 0 | 44 | 1  | 1000000001001s |
| 124 | 0 | 14 | 2  | 0 | 9  | 3  | 1000000010001s |
| 125 | 0 | 0  | 16 | 0 | 34 | 1  | 1000000100001s |
| 126 | 0 | 4  | 6  | 0 | 36 | 1  | 1000001000001s |
| 127 | 0 | 10 | 3  | 0 | 39 | 1  | 1000010000001s |
| 128 | 0 | 12 | 2  | 0 | 42 | 1  | 1000100000001s |
| 129 | 0 | 3  | 7  | 0 | 52 | 1  | 1001000000001s |
| 130 | 0 | 7  | 5  | 0 | 0  | 8  | 1010000000001s |
| 131 | 0 | 8  | 4  | 0 | 3  | 4  | 1100000000001s |
| 143 | 0 | 11 | 4  | 0 | 17 | 2  | 00111111111110s |
| 144 | 0 | 13 | 2  | 0 | 45 | 1  | 10000000000011s |
| 145 | 0 | 16 | 1  | 0 | 1  | 6  | 10000000000101s |
| 146 | 0 | 18 | 1  | 0 | 5  | 4  | 10000000001001s |
| 147 | 0 | 1  | 13 | 0 | 20 | 2  | 10000000010001s |
| 148 | 0 | 3  | 8  | 0 | 41 | 1  | 10000000100001s |
| 149 | 0 | 5  | 6  | 0 | 43 | 1  | 10000001000001s |
| 150 | 0 | 0  | 18 | 0 | 2  | 5  | 10000010000001s |
| 151 | 0 | 0  | 20 | 0 | 4  | 5  | 10000100000001s |
| 152 | 0 | 9  | 3  | 0 | 10 | 3  | 10001000000001s |
| 153 | 0 | 17 | 1  | 0 | 47 | 1  | 10010000000001s |
| 154 | 0 | 23 | 1  | 0 | 3  | 5  | 10100000000001s |
| 155 | 0 | 0  | 25 | 0 | 5  | 7  | 11000000000001s |
| 167 | 0 | 1  | 12 | 0 | 7  | 4  | 010111111111110s |
| 168 | 0 | 2  | 7  | 0 | 12 | 3  | 001111111111110s |
| 169 | 0 | 10 | 4  | 0 | 25 | 2  | 100000000000011s |
| 170 | 0 | 4  | 5  | 0 | 26 | 2  | 100000000000101s |
| 171 | 0 | 0  | 17 | 0 | 46 | 1  | 100000000001001s |
| 172 | 0 | 0  | 23 | 0 | 0  | 12 | 100000000010001s |
| 173 | 0 | 0  | 24 | 0 | 4  | 9  | 100000000100001s |
| 174 | 0 | 0  | 29 | 0 | 16 | 2  | 100000001000001s |
| 175 | 0 | 1  | 25 | 0 | 18 | 2  | 100000010000001s |
| 176 | 0 | 3  | 11 | 0 | 35 | 1  | 100000100000001s |

FIG.60

| Index | LAST | RUN | LEVEL | VLC_CODE |
|---|---|---|---|---|
| 2  | 1 | 0  | 1 | 0110s |
| 6  | 1 | 1  | 1 | 01100s |
| 12 | 1 | 2  | 1 | 011100s |
| 13 | 1 | 3  | 1 | 011010s |
| 14 | 1 | 4  | 1 | 010110s |
| 15 | 1 | 5  | 1 | 0101100s |
| 20 | 1 | 6  | 1 | 0111100s |
| 21 | 1 | 7  | 1 | 0111010s |
| 22 | 1 | 8  | 1 | 0110110s |
| 23 | 1 | 9  | 1 | 0101110s |
| 24 | 1 | 10 | 1 | 0011110s |
| 30 | 1 | 11 | 1 | 01111100s |
| 31 | 1 | 12 | 1 | 01111010s |
| 32 | 1 | 13 | 1 | 01110110s |
| 33 | 1 | 0  | 2 | 01101110s |
| 34 | 1 | 14 | 1 | 01011110s |
| 35 | 1 | 15 | 1 | 00111110s |
| 42 | 1 | 16 | 1 | 011111100s |
| 43 | 1 | 1  | 2 | 011111010s |
| 44 | 1 | 17 | 1 | 011110110s |
| 45 | 1 | 18 | 1 | 011101110s |
| 46 | 1 | 19 | 1 | 011011110s |
| 56 | 1 | 20 | 1 | 0111111100s |
| 57 | 1 | 21 | 1 | 0111111010s |
| 58 | 1 | 22 | 1 | 0111110110s |
| 59 | 1 | 23 | 1 | 0111101110s |
| 60 | 1 | 24 | 1 | 0111011110s |
| 61 | 1 | 25 | 1 | 0110111110s |
| 62 | 1 | 26 | 1 | 0101111110s |
| 63 | 1 | 27 | 1 | 0011111110s |
| 72 | 1 | 28 | 1 | 01111111100s |
| 73 | 1 | 29 | 1 | 01111111010s |
| 74 | 1 | 30 | 1 | 01111110110s |
| 75 | 1 | 31 | 1 | 01111101110s |
| 76 | 1 | 0  | 3 | 01111011110s |
| 77 | 1 | 1  | 3 | 01110111110s |
| 90 | 1 | 2  | 2 | 011111111100s |
| 91 | 1 | 32 | 1 | 011111111010s |
| 92 | 1 | 33 | 1 | 011111110110s |
| 93 | 1 | 34 | 1 | 011111101110s |

FIG.61

| Index | LAST | RUN | LEVEL | VLC_CODE |
|---|---|---|---|---|
| 94 | 1 | 35 | 1 | 0111111011110s |
| 95 | 1 | 36 | 1 | 0111110111110s |
| 96 | 1 | 37 | 1 | 0111101111110s |
| 97 | 1 | 38 | 1 | 0110111111110s |
| 98 | 1 | 39 | 1 | 0101111111110s |
| 110 | 1 | 40 | 1 | 0111111111100s |
| 111 | 1 | 41 | 1 | 0111111111010s |
| 112 | 1 | 42 | 1 | 0111111110110s |
| 113 | 1 | 43 | 1 | 0111111101110s |
| 114 | 1 | 44 | 1 | 0111111011110s |
| 115 | 1 | 45 | 1 | 0111110111110s |
| 116 | 1 | 46 | 1 | 0111101111110s |
| 132 | 1 | 10 | 2 | 01111111111100s |
| 133 | 1 | 11 | 2 | 01111111111010s |
| 134 | 1 | 12 | 2 | 01111111110110s |
| 135 | 1 | 13 | 2 | 01111111101110s |
| 136 | 1 | 13 | 4 | 01111111011110s |
| 137 | 1 | 1 | 4 | 01111110111110s |
| 138 | 1 | 3 | 2 | 01111101111110s |
| 139 | 1 | 4 | 2 | 01111011111110s |
| 140 | 1 | 5 | 2 | 01110111111110s |
| 141 | 1 | 6 | 2 | 01101111111110s |
| 142 | 1 | 7 | 2 | 01011111111110s |
| 156 | 1 | 8 | 2 | 011111111111100s |
| 157 | 1 | 9 | 2 | 011111111111010s |
| 158 | 1 | 2 | 3 | 011111111110110s |
| 159 | 1 | 3 | 3 | 011111111101110s |
| 160 | 1 | 0 | 4 | 011111111011110s |
| 161 | 1 | 0 | 5 | 011111110111110s |
| 162 | 1 | 47 | 1 | 011111101111110s |
| 163 | 1 | 48 | 1 | 011111011111110s |
| 164 | 1 | 49 | 1 | 011110111111110s |
| 165 | 1 | 50 | 1 | 011101111111110s |
| 166 | 1 | 51 | 1 | 011011111111110s |
| 182 | 1 | 52 | 1 | 0111111111111100s |
| 183 | 1 | 53 | 1 | 0111111111111010s |
| 184 | 1 | 54 | 1 | 0111111111110110s |
| 185 | 1 | 1 | 5 | 0111111111101110s |
| 186 | 1 | 4 | 3 | 0111111111011110s |

FIG.62

| Index | | VLC_CODE |
|---|---|---|
| 41 | ESCAPE | 11000001t |

FIG.63

| DECODE VALUE | INTRA | | | INTER | | |
|---|---|---|---|---|---|---|
| | LAST | RUN | LEVEL | LAST | RUN | LEVEL |
| 0 | 0 | 0 | 1 | 0 | 0 | 1 |
| 1 | 0 | 0 | 2 | 0 | 1 | 1 |
| 3 | 0 | 1 | 1 | 0 | 2 | 1 |
| 4 | 0 | 0 | 3 | 0 | 3 | 1 |
| 5 | 0 | 2 | 1 | 0 | 0 | 2 |
| 7 | 0 | 0 | 4 | 0 | 4 | 1 |
| 8 | 0 | 3 | 1 | 0 | 5 | 1 |
| 9 | 0 | 1 | 2 | 0 | 6 | 1 |
| 10 | 0 | 4 | 1 | 0 | 7 | 1 |
| 11 | 0 | 0 | 5 | 0 | 8 | 1 |
| 16 | 0 | 5 | 1 | 0 | 9 | 1 |
| 17 | 0 | 6 | 1 | 0 | 10 | 1 |
| 18 | 0 | 1 | 3 | 0 | 11 | 1 |
| 19 | 0 | 7 | 1 | 0 | 0 | 3 |
| 25 | 0 | 0 | 6 | 0 | 1 | 2 |
| 26 | 0 | 2 | 2 | 0 | 12 | 1 |
| 27 | 0 | 3 | 2 | 0 | 13 | 1 |
| 28 | 0 | 8 | 1 | 0 | 14 | 1 |
| 29 | 0 | 0 | 7 | 0 | 2 | 2 |
| 36 | 0 | 1 | 4 | 0 | 15 | 1 |
| 37 | 0 | 9 | 1 | 0 | 3 | 2 |
| 38 | 0 | 4 | 2 | 0 | 17 | 1 |
| 39 | 0 | 10 | 1 | 0 | 0 | 4 |
| 40 | 0 | 0 | 8 | 0 | 16 | 1 |
| 47 | 0 | 1 | 5 | 0 | 4 | 2 |
| 48 | 0 | 5 | 2 | 0 | 5 | 2 |
| 49 | 0 | 0 | 9 | 0 | 18 | 1 |
| 50 | 0 | 7 | 2 | 0 | 25 | 1 |
| 51 | 0 | 2 | 3 | 0 | 19 | 1 |
| 52 | 0 | 11 | 1 | 0 | 1 | 3 |
| 53 | 0 | 12 | 1 | 0 | 0 | 5 |
| 54 | 0 | 1 | 6 | 0 | 20 | 1 |
| 55 | 0 | 0 | 11 | 0 | 6 | 2 |
| 64 | 0 | 13 | 1 | 0 | 23 | 1 |
| 65 | 0 | 3 | 3 | 0 | 7 | 2 |
| 66 | 0 | 8 | 2 | 0 | 21 | 1 |
| 67 | 0 | 0 | 10 | 0 | 24 | 1 |
| 68 | 0 | 6 | 2 | 0 | 22 | 1 |
| 69 | 0 | 5 | 3 | 0 | 27 | 1 |
| 70 | 0 | 9 | 2 | 0 | 8 | 2 |
| 71 | 0 | 10 | 2 | 0 | 9 | 2 |
| 78 | 0 | 2 | 4 | 0 | 1 | 4 |
| 79 | 0 | 3 | 4 | 0 | 26 | 1 |
| 80 | 0 | 0 | 12 | 0 | 3 | 3 |
| 81 | 0 | 1 | 7 | 0 | 29 | 1 |
| 82 | 0 | 3 | 5 | 0 | 2 | 3 |
| 83 | 0 | 6 | 3 | 0 | 31 | 1 |
| 84 | 0 | 11 | 2 | 0 | 0 | 6 |
| 85 | 0 | 4 | 3 | 0 | 5 | 3 |
| 86 | 0 | 7 | 3 | 0 | 10 | 2 |
| 87 | 0 | 0 | 15 | 0 | 40 | 1 |
| 88 | 0 | 1 | 8 | 0 | 2 | 4 |
| 89 | 0 | 0 | 14 | 0 | 14 | 2 |

FIG.67

| DECODE VALUE | INTRA | | | INTER | | |
|---|---|---|---|---|---|---|
| | LAST | RUN | LEVEL | LAST | RUN | LEVEL |
| 99  | 0 | 8  | 3  | 0 | 28 | 1  |
| 100 | 0 | 15 | 1  | 0 | 11 | 2  |
| 101 | 0 | 1  | 10 | 0 | 12 | 2  |
| 102 | 0 | 2  | 5  | 0 | 0  | 7  |
| 103 | 0 | 3  | 6  | 0 | 30 | 1  |
| 104 | 0 | 5  | 4  | 0 | 33 | 1  |
| 105 | 0 | 0  | 13 | 0 | 6  | 3  |
| 106 | 0 | 11 | 3  | 0 | 13 | 2  |
| 107 | 0 | 14 | 1  | 0 | 1  | 5  |
| 108 | 0 | 4  | 4  | 0 | 4  | 4  |
| 109 | 0 | 7  | 4  | 0 | 7  | 3  |
| 117 | 0 | 1  | 9  | 0 | 32 | 1  |
| 118 | 0 | 6  | 4  | 0 | 37 | 1  |
| 119 | 0 | 1  | 11 | 0 | 15 | 2  |
| 120 | 0 | 20 | 1  | 0 | 38 | 1  |
| 121 | 0 | 3  | 10 | 0 | 4  | 3  |
| 122 | 0 | 3  | 9  | 0 | 8  | 3  |
| 123 | 0 | 5  | 5  | 0 | 44 | 1  |
| 124 | 0 | 14 | 2  | 0 | 9  | 3  |
| 125 | 0 | 0  | 16 | 0 | 34 | 1  |
| 126 | 0 | 4  | 6  | 0 | 36 | 1  |
| 127 | 0 | 10 | 3  | 0 | 39 | 1  |
| 128 | 0 | 12 | 2  | 0 | 42 | 1  |
| 129 | 0 | 3  | 7  | 0 | 52 | 1  |
| 130 | 0 | 7  | 5  | 0 | 0  | 8  |
| 131 | 0 | 8  | 4  | 0 | 3  | 4  |
| 143 | 0 | 11 | 4  | 0 | 17 | 2  |
| 144 | 0 | 13 | 2  | 0 | 45 | 1  |
| 145 | 0 | 16 | 1  | 0 | 1  | 6  |
| 146 | 0 | 18 | 1  | 0 | 5  | 4  |
| 147 | 0 | 1  | 13 | 0 | 20 | 2  |
| 148 | 0 | 3  | 8  | 0 | 41 | 1  |
| 149 | 0 | 5  | 6  | 0 | 43 | 1  |
| 150 | 0 | 0  | 18 | 0 | 2  | 5  |
| 151 | 0 | 0  | 20 | 0 | 4  | 5  |
| 152 | 0 | 9  | 3  | 0 | 10 | 3  |
| 153 | 0 | 17 | 1  | 0 | 47 | 1  |
| 154 | 0 | 23 | 1  | 0 | 3  | 5  |
| 155 | 0 | 0  | 25 | 0 | 5  | 7  |
| 167 | 0 | 1  | 12 | 0 | 7  | 4  |
| 168 | 0 | 2  | 7  | 0 | 12 | 3  |
| 169 | 0 | 10 | 4  | 0 | 25 | 2  |
| 170 | 0 | 4  | 5  | 0 | 26 | 2  |
| 171 | 0 | 0  | 17 | 0 | 46 | 1  |
| 172 | 0 | 0  | 23 | 0 | 0  | 12 |
| 173 | 0 | 0  | 24 | 0 | 4  | 9  |
| 174 | 0 | 0  | 29 | 0 | 16 | 2  |
| 175 | 0 | 1  | 25 | 0 | 18 | 2  |
| 176 | 0 | 3  | 11 | 0 | 35 | 1  |

FIG.68

| DECODE VALUE | LAST | RUN | LEVEL |
|---|---|---|---|
| 2 | 1 | 0 | 1 |
| 6 | 1 | 1 | 1 |
| 12 | 1 | 2 | 1 |
| 13 | 1 | 3 | 1 |
| 14 | 1 | 4 | 1 |
| 15 | 1 | 5 | 1 |
| 20 | 1 | 6 | 1 |
| 21 | 1 | 7 | 1 |
| 22 | 1 | 8 | 1 |
| 23 | 1 | 9 | 1 |
| 24 | 1 | 10 | 1 |
| 30 | 1 | 11 | 1 |
| 31 | 1 | 12 | 1 |
| 32 | 1 | 13 | 1 |
| 33 | 1 | 0 | 2 |
| 34 | 1 | 14 | 1 |
| 35 | 1 | 15 | 1 |
| 42 | 1 | 16 | 1 |
| 43 | 1 | 1 | 2 |
| 44 | 1 | 17 | 1 |
| 45 | 1 | 18 | 1 |
| 46 | 1 | 19 | 1 |
| 56 | 1 | 20 | 1 |
| 57 | 1 | 21 | 1 |
| 58 | 1 | 22 | 1 |
| 59 | 1 | 23 | 1 |
| 60 | 1 | 24 | 1 |
| 61 | 1 | 25 | 1 |
| 62 | 1 | 26 | 1 |
| 63 | 1 | 27 | 1 |
| 72 | 1 | 28 | 1 |
| 73 | 1 | 29 | 1 |
| 74 | 1 | 30 | 1 |
| 75 | 1 | 31 | 1 |
| 76 | 1 | 0 | 3 |
| 77 | 1 | 1 | 3 |
| 90 | 1 | 2 | 2 |
| 91 | 1 | 32 | 1 |
| 92 | 1 | 33 | 1 |
| 93 | 1 | 34 | 1 |

FIG.69A

| DECODE VALUE | LAST | RUN | LEVEL |
|---|---|---|---|
| 94 | 1 | 35 | 1 |
| 95 | 1 | 36 | 1 |
| 96 | 1 | 37 | 1 |
| 97 | 1 | 38 | 1 |
| 98 | 1 | 39 | 1 |
| 110 | 1 | 40 | 1 |
| 111 | 1 | 41 | 1 |
| 112 | 1 | 42 | 1 |
| 113 | 1 | 43 | 1 |
| 114 | 1 | 44 | 1 |
| 115 | 1 | 45 | 1 |
| 116 | 1 | 46 | 1 |
| 132 | 1 | 10 | 2 |
| 133 | 1 | 11 | 2 |
| 134 | 1 | 12 | 2 |
| 135 | 1 | 13 | 2 |
| 136 | 1 | 13 | 4 |
| 137 | 1 | 1 | 4 |
| 138 | 1 | 3 | 2 |
| 139 | 1 | 4 | 2 |
| 140 | 1 | 5 | 2 |
| 141 | 1 | 6 | 2 |
| 142 | 1 | 7 | 2 |
| 156 | 1 | 8 | 2 |
| 157 | 1 | 9 | 2 |
| 158 | 1 | 2 | 3 |
| 159 | 1 | 3 | 3 |
| 160 | 1 | 0 | 4 |
| 161 | 1 | 0 | 5 |
| 162 | 1 | 47 | 1 |
| 163 | 1 | 48 | 1 |
| 164 | 1 | 49 | 1 |
| 165 | 1 | 50 | 1 |
| 166 | 1 | 51 | 1 |
| 182 | 1 | 52 | 1 |
| 183 | 1 | 53 | 1 |
| 184 | 1 | 54 | 1 |
| 185 | 1 | 1 | 5 |
| 186 | 1 | 4 | 3 |

FIG.69B

| DECODE VALUE | |
|---|---|
| 41 | ESCAPE |

FIG.70

| 54 | 28 | 70 | 29 | 69 | 30 | 68 | 31 | 67 | 32 | 53 |
|----|----|----|----|----|----|----|----|----|----|----|
| 44 | 71 | 15 | 83 | 16 | 82 | 17 | 81 | 18 | 66 | 45 |
| 55 | 27 | 84 | 6  | 92 | 7  | 91 | 8  | 80 | 33 | 52 |
| 45 | 72 | 14 | 93 | 1  | 97 | 2  | 90 | 19 | 65 | 46 |
| 56 | 26 | 85 | 5  | 98 | 0  | 96 | 9  | 79 | 34 | 51 |
| 42 | 73 | 13 | 94 | 4  | 95 | 3  | 89 | 20 | 64 | 47 |
| 57 | 25 | 86 | 12 | 87 | 11 | 88 | 10 | 78 | 35 | 50 |
| 41 | 74 | 24 | 75 | 23 | 76 | 22 | 77 | 21 | 63 | 48 |
| 58 | 40 | 59 | 39 | 60 | 38 | 61 | 37 | 62 | 36 | 49 |

MOVING PICTURE CODING AND/OR DECODING SYSTEMS, AND VARIABLE-LENGTH CODING AND/OR DECODING SYSTEM

BACKGROUND OF THE INVENTION

The present invention relates generally to a moving picture coding and/or decoding system provided in an apparatus/system for transmitting, storing and reproducing a moving picture, such as a video telephone, a video conference, a portable information terminal, a digital video disk system and a digital television. Specifically, the invention relates to a system for compressing and coding image data into a smaller amount of data. More specifically, the invention relates to a moving picture coding and/or decoding system which has high error-resistance even if the coded image data are transmitted/stored by means of a medium which is prone to generate errors, such as a radio channel, and which can transmit/store a moving picture of good quality.

The present invention also relates generally to a variable-length coding and/or decoding system.

In recent years, as technique for compressing and coding image data into a smaller amount of data in order to efficiently transmit and store the image data, various methods have been developed and proposed such as motion compensation, discrete cosine transform, subband coding, pyramid coding and combinations thereof. In particular, as an international standard method for compressing and coding a moving picture, "ISO-MPEG1, MPEG2, ITU-T·H. 261, H. 262" is standardized. All these are included in methods using motion-compensation adaptive prediction discrete cosine transform coding which is described in detail in "International Standard of Multimedia Coding" (edited and written by Hiroshi Yasuda, published by Maruzen, June 1991) (Literature 1) and so forth. "MPEG" means the Moving Picture Experts Group which is an organization that administers the standardization of a coding method for storing a color moving picture. The "MPEG" is also used as the standardization name of the coding method, the specification of which has been determined by the organization "MPEG".

As an example of conventional moving picture coding systems, the block diagram of FIG. 1(A) shows a coding system which uses the motion-compensation adaptive prediction discrete cosine transform. First, image data 331 inputted to a coding system are divided into regions defined by a region divider 301. Then, as shown in FIG. 2A, the codings of block is carried out in order from the upper-left region to the lower-right region, and as shown in FIG. 2B, a continuous code string is configured in a frame synchronization signal. In an encoder, motion-compensation adaptive prediction is first carried out. In FIG. 1A, a motion-compensation adaptive prediction signal generator 304 detects a motion vector between an input image and an image which has been stored in a frame memory 305 and which has been coded and locally decoded, and generates a motion-compensation adaptive prediction signal. Then, from the intraframe codings (a prediction signal=0) wherein the motion-compensation prediction and the input signal are sent in the coding as they are, a prediction mode suitable for coding is selected, and the corresponding prediction signal 333 is outputted.

In a subtractor 306, the selected prediction signal 333 is subtracted from the input signal to output a predictive residual signal 334. With respect to each of blocks of a predetermined size, the discrete-cosine transform (DCT) of the predictive residual signal 334 is carried out by means of a discrete cosine transformer 307, and the quantization thereof is carried out by means of a quantizer 308. The output of the quantizer 308 is divided into two portions, one of which is multiplexed with the motion vector by means of a multiplexer 309 to the outputted, and the other of which is reverse quantized by means of a reverse quantizer 312 and the reverse discrete-cosine transform (reverse DCT) thereof is carried out by means of a reverse discrete cosine transformer 313. The output of the reverse discrete cosine transformer 313 is added to the adaptive prediction signal 333 by means of an adder 314 to be recorded in the frame memory 305.

In such a conventional moving picture coding system, there are the following problems.

First, there are problems in that if an error occurs at a portion of a variable-length code, a step-out of the variable-length code is generated, and even if the subsequent data is correctly received, it is decoded into an erroneous value. As a result, the error at that portion causes subsequent decoding to produce significant deterioration of picture quality. For that reason, in a conventional method, if an error is detected, the data are disregarded until the frame synchronizing signal (PSC) of the next frame is received. However, when this is carried out, the picture quality is greatly deteriorated since the amount of data is greatly decreased in comparison with the available amount of data.

As a method for solving such problems, Nakamura and Nakai have proposed a moving picture high efficiency coding method which considers error-resistance, in the Picture Coding Symposium 1994 (PCSJ94) (see Literature 2: "Moving Picture High-Efficient Coding Method Considering Error Resistance", written by Matsui and Nakai, the Picture Coding Symposium 1994, 1-1). Although the moving picture coding uses a variable-length code, there is a disadvantage in that in the variable-length code, the step-out occurs if an error occurs therein. However, the variable-length code is also characterized in that even if the step-out occurs due to errors, it is decoded as it is, so that the pause between codes is automatically coincident with the correct pause so as to restore its synchronism (self-synchronous healing characteristic). Usually, even if the synchronism is restored, it is possible to identify a region corresponding to the data, so that the data after synchronous healing can not be used. The aforementioned method is characterized in that the coding-series describing method is changed from the conventional arrangement of regions, to the arrangement of a plurality of units of regions in the rear predictive residual code string after a variable-length code is divided into the units of regions in accordance with the contents of data as shown in FIG. 1B so that the self-synchronous healing of the variable-length code can be used. In this method, even if an error occurs, the decoding is carried out as it is until the frame synchronizing signal of the next frame is received, so that it is possible to use the header data which have been decoded in the prefix portion, together with the decoded value of the predictive residual signal in order from the suffix, so as to increase the amount of available data.

However, there are the following problems in this method. In the case having a channel of a high error rate wherein a plurality of errors exist in data of one frame, available data decreases. When decodable regions decrease, the regions of a high probability of decoding are concentrated on a specific place (the upper portion of a screen) regardless of the characteristic of the image. This means that only unimportant regions such as background are relieved and it is inefficient since there are important regions in the center of the screen when the usual use is considered. In addition, when the regions that were not able to be decoded are predicted on the basis of regions that were able to be decoded, the whole screen must be predicted on the basis of locally concentrated regions, so that it is difficult to predict the regions that were not able to be decoded. Moreover, when an error occurs in the first half of the header data, even if all the rear predictive residual data can be decoded, only the region wherein the first half of the header data was able to be decoded can be decoded. That is, since the rear predictive residual data are based on the first half of the header data, the data having been able to be decoded is unnecessary.

FIG. 1C is a block diagram showing the schematic construction of a conventional moving picture decoding system. This system is designed to obtain decoding image data signals by operating reverse to that of FIG. 1A.

FIG. 3A is a view showing an example of conventional scanning orders of DCT coefficients. The scan has been carried out in zigzags as a course of this figure.

FIGS. 4A and 4B show an example of conventional coding methods for inserting synchronizing signals into frames. When the coding of regions as shown in FIG. 4A is carried out, a synchronizing signal is inserted every n block line (n≧1) unit as shown in FIG. 4B, so as to increase the potential synchronous healing.

As mentioned above, in conventional moving picture coding and/or decoding systems, there is a disadvantage in that if an error occurs in a variable-length code, the quality of the decoded image is greatly lowered due to step-out of the variable-length signal. There is also a disadvantage in that if only a part of the image data can be decoded due to error, the probability of decoding each of regions is inefficiently concentrated on a specific portion.

By the way, a variable-length code is a series of codes wherein on the basis of the frequency of appearance of symbols, a code of short length is assigned to a symbol appearing frequently and a code of long length is assigned to a symbol appearing infrequently so as to shorten the average code-length. Therefore, when the variable-length code is used, the amount of data can be greatly compressed in comparison with the data before being coded. As a method for configuring such a variable-length code, the Huffman's algorithm which is the most suitable for a memoryless source is known.

In the variable-length code, there is a general problem in that when an error is mixed in coding data due to channel error or for other reasons, the data after the mixing of error are transmitted, so that the data can not be correctly decoded by means of a decoding system. For that reason, in general, when an error occurs, synchronizing codes are inserted at regular intervals to prevent the propagation of error. To the synchronizing codes, a bit pattern which does not appear by combination of variable-length codes is assigned. According to this method, even if an error has occurred in coding data so that the decoding has not been able to be carried out, it is possible to prevent the propagation of error to correctly decode the data by seeking the next synchronizing code. However, if such synchronizing codes are used, it is impossible to decode the coding data between the place wherein an error occurs so as not to be able to be correctly decoded, and the place wherein the next synchronizing code is sought, as shown in FIG. 33A.

Therefore, a method is known for changing the configuration of a variable-length code from a usual configuration as shown in FIGS. 34A–34C into another configuration as shown in FIGS. 35A–35C, so as to be able to be decoded in either of the usual forward direction and the backward direction. In addition, such a code can be used for reverse reproduction in a storage medium such as a disk memory which stores coding data, since the coding data can be also read in the backward direction. Such a variable-length code which can be decoded in either of the forward and backward directions will be hereinafter referred to as a "reversible code". An example of reversible codes is disclosed in Japanese Patent Laid-Open No. 5-300027, entitled "Reversible and Variable-Length Coding Method". This reversible code is a variable-length code which can be decoded in the backward direction, not only in the forward direction, by adding bits to the suffix of code words of the Huffman's code which is a variable-length code decodable in the forward direction as shown in FIGS. 34A–34C, on condition that the respective code words do not coincide with the suffix of another code word of a longer length as shown in FIGS. 35A–35C.

However, in this reversible code, since bits are added to the suffix of code words of a variable-length code which can be decoded only in the forward direction, the number of useless bits is increased so as to increase the average code-length. As a result, in comparison with a variable-length code which can be decoded only in the forward direction, the coding efficiency is greatly decreased.

There is another problem in that conventional reversible codes are not practical since the memory capacity necessary for a variable-length coding and/or decoding system is increased when the number of source symbols is great. As an example of the case that the number of source symbols is great, there is the coding of DCT coefficients which have been often used for the image data coding of a moving picture or a still picture. In the image data coding, the DCT (discrete cosine transform) of 8×8 are usually carried out, and then, the linear quantization of 8 bits is carried out with respect to orthogonal transform coefficient (called DCT coefficients) thus obtained. Then, with respect to the quantized DCT coefficients, the zigzagged scanning starting from a low area is carried out, and the variable-length coding is carried out as a set of the coefficients of zero-run and not-zero.

For example, in the ITU-T DRAFT Recommendation H. 263 (1995), the quantization index value is of −127 to +127 (since the index value 0 is run, the index number is 253), the maximum of the zero-run number is 63, and the coding for distinguishing as to whether the last DCT coefficient of the block is a non-zero coefficient. For that reason, the number of source symbols is very great, i.e. 253×64×2=32384. Therefore, in the H. 263, although the DCT coefficient having a great probability of appearance is coded by the variable-length code, the DCT coefficient having a small probability of appearance is coded by a fixed-length code of 15-bits which includes a code of 1 bit as a code representative of the distinction as to whether it is the last non-zero coefficient of the block, a code of 6 bits for zero-run, and a code of 8-bits for quantization index, and then, a code called an escape code is added to the prefix of the fixed-length code.

If code-word tables have all the code words, the coding and/or decoding can be also carried out. However, according to the aforementioned code configuration, since the fixed-length code of 15 bits can be coded and/or decoded independent of the variable-length code, only a DCT coefficients having a high probability of appearance and a code-word table of escape codes may be prepared. Therefore, it is possible to remove the code-word table of the variable-length codes to decrease the memory capacity.

However, as mentioned above, in conventional reversible codes, it is necessary to add bits to the suffix of the code words of a variable-length code which can be decoded only on the forward direction, so that the escape code can not be added. Therefore, it is necessary to prepare code words corresponding to all the source symbols even if the number of the source symbols is great, so that the memory capacity is huge.

As mentioned above, the conventional reversible codes, i.e. variable-length codes which can be decoded in either of the forward and backward directions, are configured by adding bits to the suffix of code words of a variable-length code which can be decoded only on the forward direction. Therefore, there is a disadvantage in that the number of useless bit patterns is increased so as to increase the average code-length. In addition, there is also a disadvantage in that a variable-length coding and/or decoding system using such a reversible code is not practical, since it is necessary to prepare a code-word table of code words corresponding to all the source symbols in any way, and since a great memory capacity is required if the number of source symbols is great like the image data coding.

SUMMARY OF THE INVENTION

It is therefore an object of the present invention to provide a moving picture coding and/or decoding system which can prevent the quality of a decoded image from greatly deteriorating even if an error occurs in any portions of a code, and which can efficiently decode the code even if only a part of the code can be decoded due to the error.

In order to accomplish the aforementioned and other objects, according to a first aspect of the present invention, a moving picture coding system comprises: coding means for coding input image data; dividing means for dividing a code string outputted from the coding means, into a plurality of code string; and code-row rearranging means for outputting one of the plurality of code strings in order of input, and for outputting the other code string in order reverse to the order of input after dividing the other code string into predetermined units. In this system, the code strings is expressed by two code string, one of which is arranged in the forward direction from the prefix to the suffix, and the other of which is arranged in the backward direction from the suffix to the prefix, unlike the conventional coding wherein the code string is expressed by one code string, so that the error generated in one of data does not influence the other data. Therefore, it is possible to prevent the picture quality from greatly deteriorating by decoding the data in which errors have not been found, and it is also possible to predict the data which have not been decoded due to errors, by means of the data which have been decoded.

According to a second aspect of the present invention, a moving picture coding system comprises: region dividing means for dividing an image data signal inputted as frames into a plurality of regions; region rearranging means for rearranging regions with respect to each of the regions divided by the region dividing means; and coding means for coding the respective regions divided by the region dividing means. In this system, when the code string is expressed by two code strings, unlike the conventional coding wherein the code string is expressed by one code string, their coding orders are different from the others so as to be complementary to each other. Therefore, even if only a part of the data could be decoded since errors occurred in one or both rows, it is possible to increase the probability of decoding of the whole screen or important regions by combining both data.

According to a third aspect of the present invention, a moving picture decoding system comprises: input means for inputting a first code string arranged in order from the prefix to the suffix, and a second code string arranged in order from the suffix to the prefix in the backward direction; and decoding means for decoding the first code string in order from the prefix to the suffix and for decoding the second code string in order from suffix to the prefix in the backward direction. In this system, the first code string arranged in the forward direction from the prefix to the suffix and the second row arranged in the backward direction from the suffix to the prefix are decoded. Therefore, even if an error occurs in one of the rows, the decoding can be carried out without influencing the other row.

According to a fourth aspect of the present invention, a moving picture decoding system comprises: input means for inputting code strings which have been divided into a plurality of regions with respect to each of frames; decoding means for decoding the code string of each of the regions supplied from the input means; and rearranging means for rearranging the data of each of the regions supplied from the decoding means, in correct order. In the code stream of this system, the regions are arranged in order of importance of the rearranged image. Therefore, even if an error occurs in a part of the data, the region which has been decoded is an important portion, so that it is possible to reduce lack of the important portions of the image in comparison with the conventional system.

According to a fifth aspect of the present invention, the moving picture decoding system as set forth in the third aspect includes detecting means for detecting an error with respect to the first and second code string and the coded data/signal, respectively, wherein the decoding is carried out using only data wherein no error has been detected by the error detecting means. In this system, the detection of error is carried out when the divided code strings are decoded. Therefore, it is possible to form a reproduced image by means of only the correctly decoded data. It is also possible to predict and complement the data which was not able to be decoded, by means of the correctly decoded data.

According to a sixth aspect of the present invention, the moving picture decoding system as set forth in the fourth aspect includes error detecting means for detecting an error with respect to the code string and the decoded data/signal; and predicting means for predicting a region which was not able to be decoded, on the basis of the decoded region when an error is detected by means of the error detecting means. In this system, the regions having a higher probability of decoding in both of the code strings divided into two parts, can complement the regions having a lower probability of decoding in both of the code string divided into two parts. Therefore, it is possible to predict and complement the data of the data lacking region.

According to a seventh aspect of the present invention, the moving picture coding system as set forth in the second aspect includes changing means for changing the order of the rearrangement of regions by the region rearranging means; and coding means for coding the data representative of the order of rearrangement. In this system, the coding order of the regions is changed in accordance with the image. Therefore, even if the data is not able to be fully decoded due to errors, it is possible to increase the probability of decoding with respect to at least the important portion.

According to an eighth aspect of the present invention, the moving picture decoding system as set forth in the fourth aspect includes means for rearranging and decoding regions in accordance with the region rearranging data included in the code string. In this system, the code string for which the coding order has been changed in accordance with the image is decoded. Therefore, even if the data is not able to be fully decoded due to errors, it is possible to increase the probability of decoding with respect to the important portion of the coding data.

It is another object of the present invention to provide a practical variable-length coding and/or decoding system which can be decoded in either of the forward and backward directions.

Specifically, it is an object of the present invention to provide a variable-length coding and/or decoding system which can be decoded in either of the forward and backward directions and wherein the number of useless bit patterns is small and the coding efficiency is high.

It is a further object of the present invention to provide a variable-length coding and/or decoding system which can be decoded in either of the forward and backward directions and which is unnecessary for a great memory capacity even if the number of source symbols is great.

In order to accomplish the aforementioned and other objects, according to a ninth aspect of the present invention, a variable-length coding system assigns code words to a plurality of source symbols, the code words having a code length in accordance with the probability of the source symbols, and outputs as coding data, the code words corresponding to the inputted source symbols, comprises: a code-word table for storing a plurality of code words so as to correspond to the source symbols, the code words being configured so as to be able to determine the pause between codes by the weights of the code words; and coding means for selecting a code word corresponding to the inputted source symbol from the code-word table and for outputting the selected code word as coding data.

The term "weight of a code word" corresponds to a hamming distance from the minimum or maximum value of the code word. When the code word is a binary code, the minimum value of the code word is "0" in all cases and the maximum value of the code word is "1" in all cases, so that the weight of the code word corresponds to the number of "1" or "0". The position wherein the weight of the code word is a predetermined value indicates the pause between codes in the variable-length code.

With respect to the plurality of code words stored in the code-word table, a fixed-length code, i.e. a constant length of code, does not need to be added to at least one of the prefix and suffix thereof.

In the variable-length coding system according to the ninth aspect of the present invention, a variable-length code is configured by code words such that the pause between codes, i.e. the code length, is determined by the weight of the code word which is a value independent of the order of the code word. Therefore, this variable-length code is a reversible code which can be decoded in either of the forward and backward directions, since the pause between codes can be sought in either of the forward and backward directions.

In addition, unlike a code wherein bits are added to the suffix of a variable-length code decodable in only the forward direction such as a reversible code disclosed in the aforementioned Japanese Patent Laid-Open, a reversible code is originally configured without the addition of excessive bits, so that it is possible to obtain a variable-length code wherein the number of useless bit patterns is small and wherein the coding efficiency is great.

Moreover, a variable-length code can be obtained in accordance with the probability of appearance of source symbols by selecting a plurality of code configuring methods and a code of the minimum average code-length from parameters, on the basis of the probability of source symbols.

According to a tenth aspect of the present invention, a variable-length decoding system which can decode in either of the forward and backward directions and which decodes a variable-length code to which synchronizing codes are inserted at regular intervals, comprises: a forward decoding means for decoding a variable-length code in the forward direction and for detecting an error of a code word of the variable-length code; a backward decoding means for decoding the variable-length code in the backward direction and for detecting an error of a code word of the variable-length code; and decoded-value deciding means for deciding a decoded value on the basis of the decoded results by the forward decoding means and the backward decoding means, wherein the decoded value at the position of the error is detected in accordance with the results of detection of the error by the forward decoding means and the backward decoding means.

Specifically, in the decoded-value deciding means, (a) when errors have been detected by both of the forward decoding means and the backward decoding means and when the detected positions of the errors have not passed each other, only the decoded result wherein no error has not been detected is used as the decoded value, (b) when errors have been detected by both of the forward decoding means and the backward decoding means and when the detected positions of the errors have been passed each other, the decoded result wherein no error has not been detected by both of the forward decoding means and the backward decoding means is used as the decoded value, (c) when an error has been detected by one of the forward decoding means and the backward decoding means, the decoded value with respect to the code word at the position wherein the error has been detected is abandoned, and the decoded result in the backward direction is used as the decoded value with respect to the subsequent code word, and (d) when errors have been detected with respect to the same code word by means of the forward decoding means and the backward decoding means, the decoded value with respect to the code word at the position wherein the an error has been detected is abandoned, and the decoded result in the backward direction is used as the decoded value with respect to the subsequent code word.

In this variable-length decoding system, when the decoded value is decided on the basis of the decoded results by the forward decoding means and the backward decoding means which use a function for detecting errors in code words of a variable-length code, it is possible to effectively decode the reversible code outputted from the aforementioned variable-length coding system, against the errors such as channel errors, by deciding the decoded value at the position wherein the errors have been detected in accordance with the detected results of errors by the forward decoding means and the backward decoding means.

According to an eleventh aspect of the present invention, a variable-length coding system which assigns to a plurality of source symbols, code words having a code-length corresponding to the probability of the source symbol, and which outputs a code word corresponding to the inputted source symbol as coding data, comprises: a code-word table for storing a plurality of code words which can be decoded in either of the forward and backward directions, so as to correspond to different source symbols; and coding means for selecting a code word corresponding to the inputted source symbol from the code-word table when the code word corresponding to the inputted source symbol has been stored in the code-word table and for outputting the selected code word as coding data, and for outputting a code word wherein specific codes (escape codes) which can be decoded in either of the forward and backward directions are added to the prefix and suffix of a fixed-length code, as coding data when the code word corresponding to the inputted source symbol has not been stored in the code-word table.

According to a twelfth aspect of the present invention, a variable-length decoding system which can be adapted to the variable-length coding system according to the eleventh aspect of the present invention and which decodes coding data of variable-length codes decodable in either of the forward and backward directions, comprises: forward decoding means for decoding a variable-length code in the forward direction; backward decoding means for decoding a variable-length code in the backward direction; and fixed-length code decoding means for decoding a fixed-length code, wherein when specific codes (escape codes) representative of the prefix and suffix of the fixed length code have been decoded when the variable-length code is decoded by the forward decoding means and the backward decoding means, the subsequent coding data is decoded by the fixed-length code decoding means.

In the variable-length coding system and the variable-length decoding system, according to the eleventh and twelfth aspects of the present invention, for example, it is possible to code a source symbol of a low probability of appearance as a fixed-length code to which an escape code is added, and it is possible to code and/or decode the fixed-length code portion independent of a reversible code, so that it is possible to restrain the maximum code-length and decreases the memory capacity if the number of source symbols which can be inputted increases.

According to a thirteenth aspect of the present invention, there is provided a variable-length decoding system which decodes coding data of a variable-length code decodable in either of the forward and backward directions. In this system, the code-length of a variable-length code is derived on the basis of the number of a predetermined "1" or "0" of the code word, and the value determined by a Pascal's triangle is assigned to the value of a joint. Then, the rank order values of different code words of the same code-length is derived by means of a directed graph wherein the arrows from each joints to the next joint correspond to "1" and "0" of the code words, and a decoded value is calculated by means of the rank order value and the directed graph.

In this variable-length decoding system, it is possible to determine the pause between the codes by the number of the weights of the code words, i.e. the code length, similar to the variable-length coding system according to the ninth aspect of the present invention. In addition, this system uses variable-length code words configured by code words decodable in either of the forward and backward directions, the value determined by a Pascal's triangle is assigned to the value of a joint, and the decoded value is calculated by the directed graph (decoding graph) wherein the arrows from each joints to the next joint corresponds to "1" and "0" of the code words. Therefore, it is possible to decode the variable-length code by a small memory capacity even if the number of source symbol is great.

According to a fourteenth aspect of the present invention, a variable-length coding system which assigns to an orthogonal transform coefficient which can be produced by the orthogonal transform every block by means of a moving picture encoder, a code word having a code length corresponding to the probability of the orthgonal transform coefficient, and which outputs the code word corresponding to the orthogonal transform coefficient produced by the moving picture encoder as coding data, comprises: a first code-word table, provided for each of a plurality of coding modes of the moving picture encoder, for storing a plurality of code words decodable in either of the forward and backward directions so that the code words respectively correspond to the orthogonal transform coefficients of the block other than the last of the block; a second code-word table, provided for a plurality of coding modes of the moving picture encoder in common, for storing a plurality of code words decodable in either of the forward and backward directions so that the code words respectively correspond to the orthogonal transform coefficients of the last block; and coding means for selecting a code word corresponding to the orthogonal transform coefficient produced by the moving picture encoder, from the first and second code-word tables, and for outputting the selected code word as coding data.

According to a fifteenth aspect of the present invention, a variable-length decoding system which can be adapted to the variable-length coding system according to the fourteenth aspect of the present invention and wherein a moving picture decoder decodes coding data decoded into a variable-length code which can decode an orthogonal transform coefficient produced by the orthogonal transform every block by means of a moving picture encoder, in either of the forward and backward directions, comprises: forward decoding means for decoding a variable-length code in the forward direction; and backward decoding means for decoding a variable-length code in the backward direction, wherein when the forward decoding means decodes the variable-length code, the last of the block is determined on the basis of the appearance of a code word representative of the orthogonal transform coefficient of the last of the block, and when the backward decoding means decodes the variable-length code, the head of the block is determined by the code word representative of the last orthogonal coefficient of the last block.

Since the coding method in a moving picture encoder/decoder has syntax, it is required for the encoder/decoder to be able to decode a variable-length code in either direction, and to decode it syntactically in either direction. However, the variable-length coding system and the variable-length decoding system, according to the fourteenth and fifteenth aspects of the present invention, can satisfy the aforementioned requirements. That is, the syntax in the moving picture encoder/decoder is premised that the coding data is formed in a hierarchy so that, for example, the upper hierarchy includes mode data representative of coding modes, motion vectors and so forth, and the lower hierarchy includes orthogonal transfers coefficients such as DCT coefficients. In addition, according to the syntax in the moving picture encoder/decoder, assuming that the coding mode of each of the blocks (macroblock) has already been found in the lower hierarchy by the decoding of the upper hierarchy, the decodings in either direction can be carried out if the pause between blocks is sought.

In the variable-length coding and/or decoding system according to the fourteenth and fifteenth aspects of the present invention, the first code-word table corresponding to the orthogonal transform coefficient other than the last of the blocks is configured with respect to each of the plurality of coding modes. However, the second code-word table corresponding to the orthogonal transform coefficient of the last of the blocks is used for the respective coding modes in common, so that it is possible to cope with the change of the code-word tables by the coding mode, and to find the pause between blocks by the appearance of the code word representative of the last orthogonal transform coefficient of the last block, so that the decoding can be decoded syntactically in either directions.

In different coding modes, for example, in intramode and intermode, the produced orthogonal transform coefficients are different from their frequencies of appearance, so that it is possible to increase the coding efficiency by providing the second code-word table independently.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 2A–2C are views showing the coding order of the conventional moving picture coding system;

FIGS. 8A and 8B are views showing an example of the rank order for rearranging regions in a moving picture coding system according to the present invention;

FIGS. 10A and 10B are views showing an example of the order for rearranging regions in a moving picture coding system according to the present invention;

FIGS. 11A and 11B are views showing an example of the rank order for rearranging regions in a moving picture coding system according to the present invention;

FIG. 12A and 12B are views showing an example of the rank order for rearranging regions when the central region is designated according to the present invention;

FIG. 13 is a view showing a method for arranging code strings when the present invention is applied to codes which can be decoded in either direction;

FIGS. 17A and 17B are views showing an example for dividing the scan of DCT coefficients in the rank order that considers the relationship between the horizontal and vertical directions;

FIGS. 21A–21C are views showing a hierarchy coding method and an example of conventional hierarchy coding methods;

FIGS. 34A–34C are view explaining a conventional variable-length code.

FIGS. 35A–35C are views explaining a conventional reversible code;

FIG. 38 is a block diagram of a code-word table preparing section of FIG. 36;

FIGS. 39A and 39B are views showing a method for preparing a binary code system wherein weights configuring a variable-length code are constant;

FIG. 46 is a view showing a code shortening method in the code-word configuring section of FIG. 38;

FIG. 49 is a view showing the comparison between the characteristics of a variable-length code configured by the preferred embodiment of the present invention, and a conventional variable-length code;

FIGS. 52A and 52B are views showing a method for counting a binary code system wherein weights are constant;

FIGS. 53A and 53B are views showing the operations of a forward decoder and a backward decoder;

FIGS. 55A and 55B are views explaining a decoded-value table in this preferred embodiment;

FIG. 59 is a view showing a part of a code-word table of non-LAST coefficients of INTRA and INTER in the same preferred embodiment;

FIG. 60 is a view showing another part of the code-word table of non-LAST coefficients of INTRA and INTER in the same preferred embodiment;

FIG. 61 is a view showing a part of a code-word table of LAST coefficients of INTRA and INTER in the same preferred embodiment;

FIG. 62 is a view showing another part of the code-word table of LAST coefficients of INTRA and INTER in the same preferred embodiment;

FIG. 63 is a view showing a code-word table of escape codes in the same preferred embodiment;

FIG. 67 is a view showing a part of a decoded-value table of non-LAST coefficients of INTRA and INTER in the same preferred embodiment;

FIG. 68 is a view showing another part of the decoded-value table of non-LAST coefficient of INTRA and INTER in the same preferred embodiment;

FIGS. 69A and 69B are views showing a coded-value table of LAST coefficients of INTRA and INTER in the same preferred embodiment;

FIG. 70 is a view showing a decoded-value table of escape codes in the same preferred embodiment;

DESCRIPTION OF THE PREFERRED EMBODIMENT

Figure 1A:
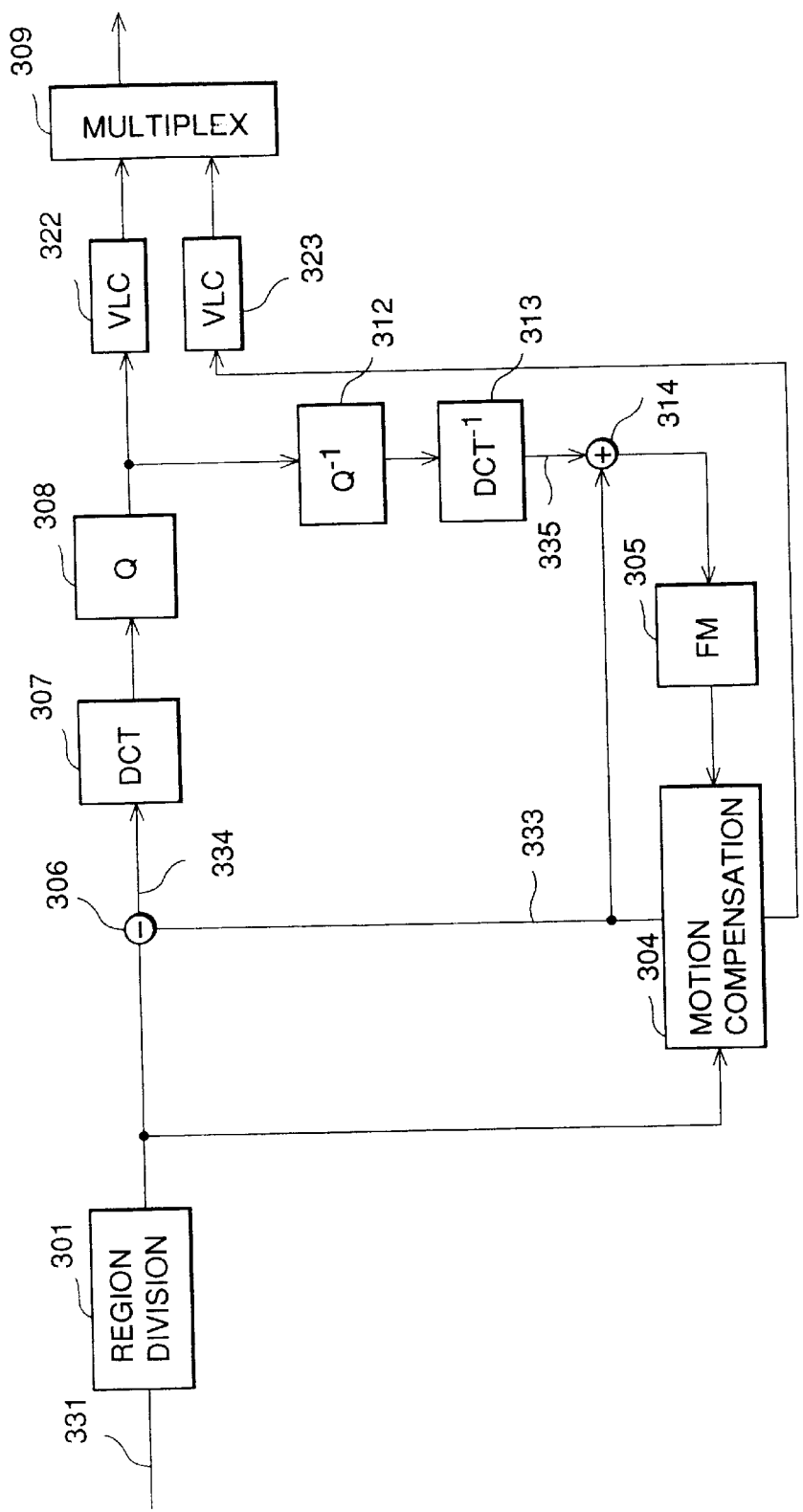
FIG. 1A is a block diagram of a conventional moving picture coding system.
Figure 1B:
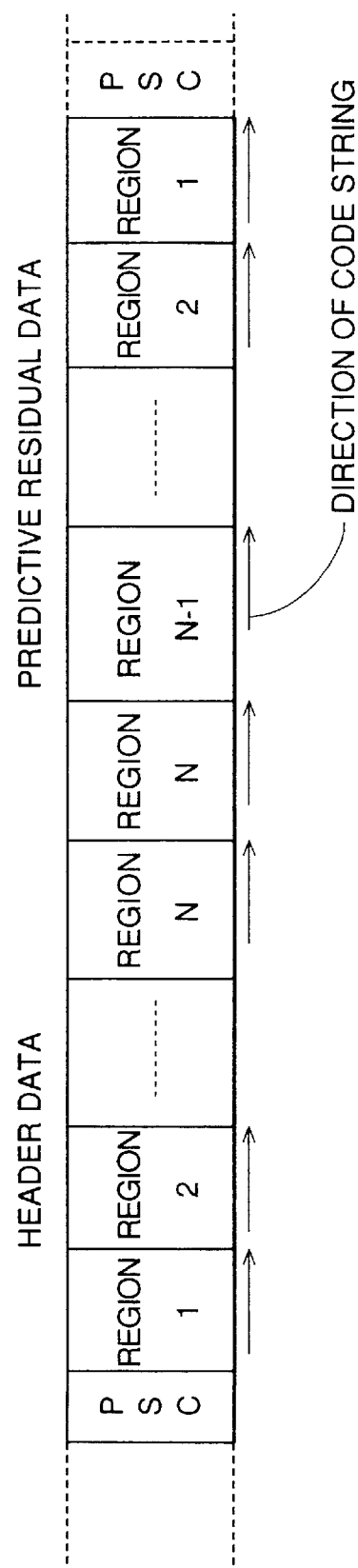
FIG. 1B is a view showing a code string coded by the conventional moving picture coding system.
Figure 1C:
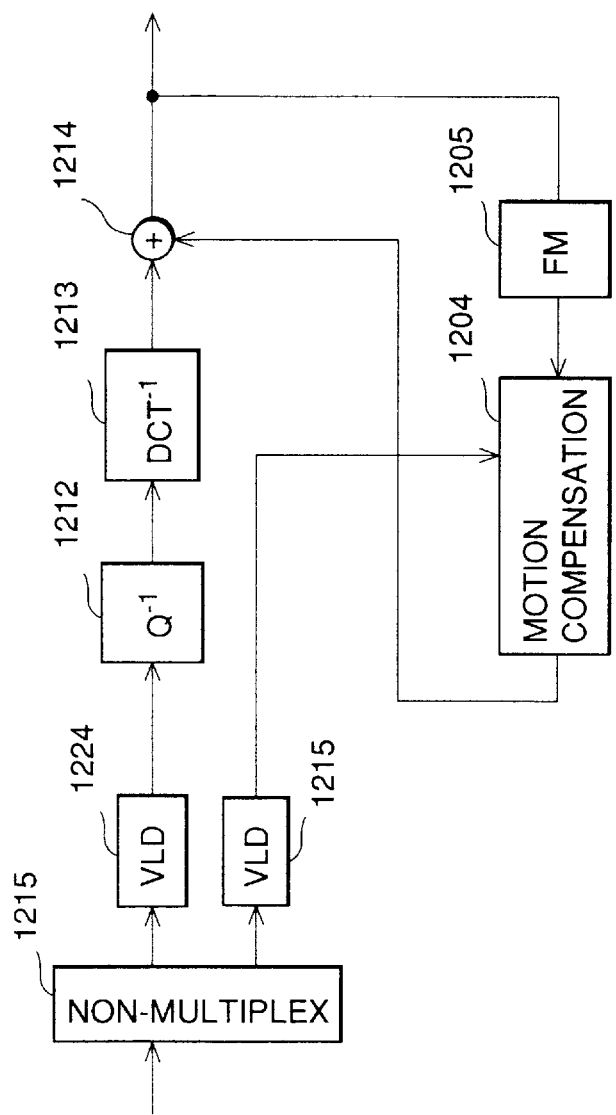
FIG. 1C is a block diagram of a conventional moving picture decoding system.

Referring now to the accompanying drawings, particularly to FIGS. 5 through 32, the preferred embodiments of a moving picture coding and/or decoding system, according to the present invention, will be described below.

First, the whole construction of the present invention will be described in FIG. 5 which shows the concept of a moving picture coding system. The input image data are compressed and coded by a coding means 10 so that two code strings of a predetermined arrangement are formed. The coding means 10 includes region dividing means 11 for dividing a screen into predetermined regions, region reordering means 12 for reordering the divided regions, for example, on the basis of a standard such as importance, and code-row forming means 13 for forming two code strings with respect to the reordered regions. The code strings formed by the coding means are divided by code-row dividing means 14. Then, one frame is reordered by means of code-row reordering means 15, and the two code strings in a frame are reordered toward the center of the frame in the forward and backward directions from two frame synchronization signals (PSC) between which the frame is sandwiched. This condition is shown in a data frame of FIG. 6.

Figure 7:
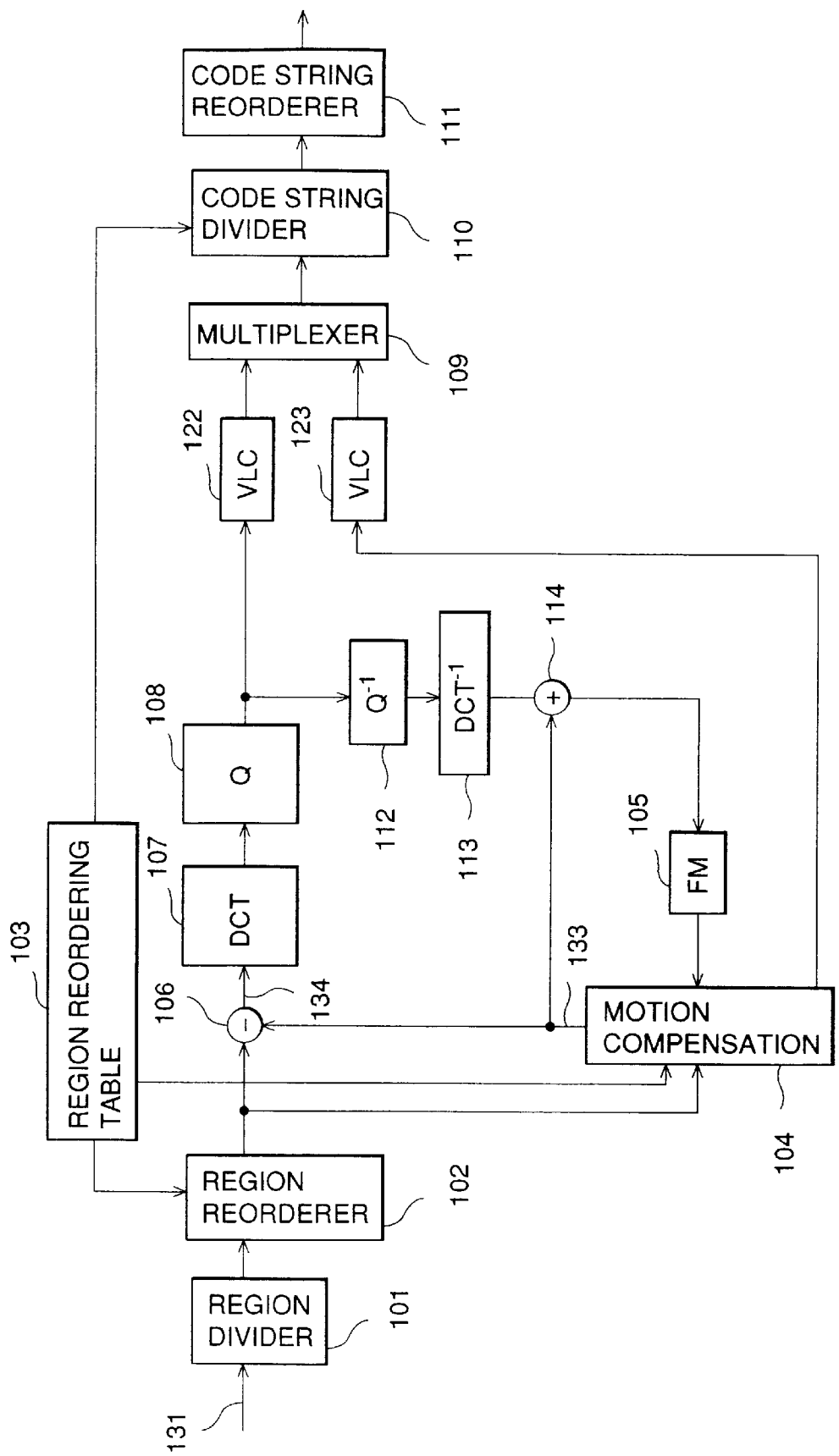
FIG. 7 is a block diagram of the first preferred embodiment of a moving picture coding system according to the present invention.

FIG. 7 is a block diagram of the first preferred embodiment of a moving picture coding system according to the present invention. In this preferred embodiment, the moving picture coding system uses the motion-compensated adaptive prediction discrete cosine transform coding system.

The motion-compensated adaptive prediction discrete cosine transform coding system is described in the aforementioned Literature 1 in detail. Therefore, only the outline thereof will be described, and the difference between the system of the present invention and the conventional system will be described in detail.

In a region divider 101, image data 131 are divided into predetermined regions, and thereafter, they are transmitted to a region reorderer 102. In the region reorderer 102, the regions are reordered on the basis of the data of a region reordering table 103 which defines the rank order of reorder, and the data of the reordered regions are transferred to a motion-compensated adaptive predictor 104 sequentially. Since the portions with respect to the recorder of regions are important in the present invention, they will be described in detail after the explanation of the outline of the block diagram.

In the motion-compensated adaptive predictor 104, the last frame data read out of the frame memory 105 in which the last frame having been coded/decoded is stored, is compared with the current frame data divided with respect to each of the regions. In addition, it is calculated as to which portion the region of the current frame has been moved from, i.e. as to what distance the region has been moved in the current frame, so that it is expressed as a motion vector (such a series of operations are called a motion compensation).

In a subtractor 106, the data of each of the regions of the last frame which has been motion-compensated are subtracted from the data of each of the regions of the current frame, and the differential data (i.e. the data of the current frame which has been sufficiently expressed only by considering the motion data with respect to the last frame) are coded by means of a discrete cosine transformer 107 and a quantizer 108. The coded data and the motion vector are multiplexed by means of a multiplexer 109, and the code string is divided into two parts by means of a code-row divider 110. These parts are rearranged by means of a code-row reorderer 111 to be transmitted to the sink through a channel. Since the code string divider 110 and the coder string reorderer 111 are also important in the present invention, they will be described in detail later, as the aforementioned region reorderer.

On the other hand, the coded data of each of the regions are decoded as a motion-compensated error by means of a reverse quantizer 112 and a reverse discrete cosine transformer 113. By means of an adder 114, the motion-compensated error is added to the last frame data after the motion compensation, and the current frame data are reproduced to be stored in the frame memory.

In the conventional motion-compensation coding system, after the region is divided by the region divider 101, the coding is carried out with respect to each of regions in order as shown in FIG. 2. On the other hand, according to the present invention, after the region is divided, now processing is carried out by means of the region reorderer 102 for coding. FIG. 8 shows an example of the order of reorder of the divided regions. The region reordering table 103 which stores the coding order of the regions is prepared, and the region reorderer 102 reorders the regions on the basis of the table 103. According to the present invention, the code string which has been reordered and coded by means of the region reorderer 102 is divided into two rows of codes by means of the code string divider 110. In the case of FIG. 8, it is divided into a first code string and a second code string which respectively correspond to FIGS. 8A and 8B.

Figure 9:
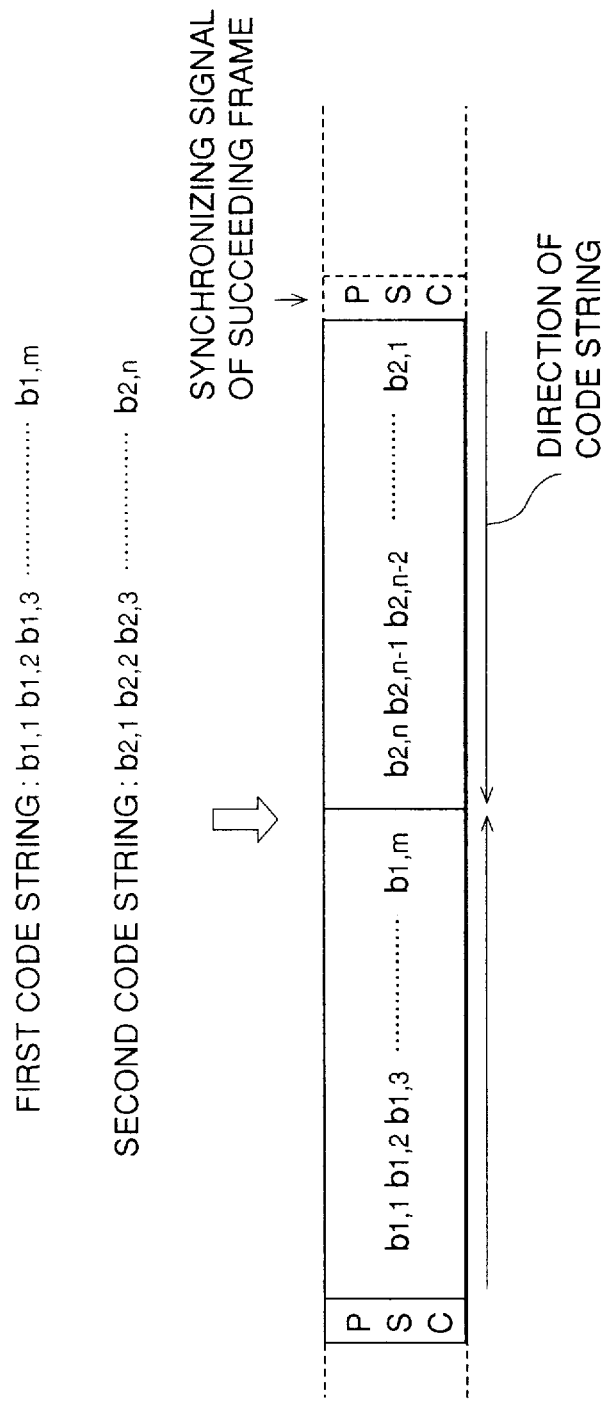
FIG. 9 is a view showing a code string coded by a moving picture coding system according to the present invention.

Than, in the code-row rearranger 111, the first code string continues form the synchronizing signal to be arranged in the forward direction from the prefix to the suffix, and the second code string continues from the first code string to be arranged in the reverse direction from the prefix to the suffix, so as to be transferred to the channel. FIG. 9 shows a method for reordering the code string to be transmitted to the channel. In this way, out of the two divided code strings, the first code string can be decoded by seeking the frame synchronizing signal of the current frame, and the second code string can be decoded by seeking the frame synchronizing signal of the next frame since the code string is arranged from the synchronizing signal in the backward direction. In conventional systems, when an error occurs in the middle of the decoding, all the data up to the frame synchronizing signal of the next frame must be discarded and the picture quality is greatly deteriorated. To the contrary, according to the present invention, if the data of one of the code strings can not be decoded due to an error and if the end portion of the first code string can not identified due to the step-out of the variable-length code, the data can be decoded regardless of the first code string since the second code string is dependent upon only the frame synchronizing signal of the next frame. In this way, according to the present invention, the error generated in one of the code strings does not influence the other code strings. Therefore, it is possible to solve the problem in that the head data are dependent on the end data in conventional systems.

Moreover, even if the data of one of the code strings has been missed, or even if the data of both of the code strings have been decoded only to the middle thereof, it is possible to prevent the regions which are able to be decoded, from concentrating on specific regions of the screen since the coding order is changed as shown in FIG. 8. In addition, since the regions have been decoded exist in the whole screen uniformly, it is possible to easily predict the region having not been able to be decoded, by means of the data having been decoded. Therefore, it is possible to decode the image data of the current frame as image data which have a certain measure of picture quality so that the picture quality is not greatly deteriorated although it is not perfect.

In the first preferred embodiment of the present invention, the first and second aspects of the present invention are combined. However, they are not required to be combined, and can be so practiced as to be independent of each other. Although the first preferred embodiment of the present invention uses the motion-compensated adaptive prediction discrete cosine transform coding system, the present invention should not be limited to this coding system and the present invention can be applied to the other image coding systems.

FIGS. 10A, 10B, 11A and 11B show examples of the region reordering tables. For example, in the case of the application to an input image wherein important data (motion, face and so forth) are arranged at the center of the screen, the data are reordered so that the region of the center of the screen is arranged at the prefix. By reordering in such a way, it is possible to increase the probability of the decoding of the most important region in comparison with the conventional systems if the step-out of the variable-length code occurs due to an error. The reason why the present invention has this advantageous effect is that when an error occurs, the probability of impossibility of decoding increases as the data goes to that of the end by the nature of the variable-length code. It is also possible to switch or prepare a rearranging table with respect to each of the input images, by seeking the important central portion on the basis of the value of motion vector and so forth for coding regions spirally from the coordinates of the central portion as shown in FIGS. 12A–12B. In this case, it is required to adjust between the coding side and the decoding side, for example, by inserting the data representative of the coordinates of the important control portion into the code string of each of the frames after the frame synchronizing signal. Moreover, it is possible to prepare a plurality of the same reordering tables on the coding and decoding sides and to switch the rearranging tables on the decoding side so that its number is the same as that of the reordering table on the coding side which has been switched on the basis of the image.

For example, when the variable-length code which can be decoded in either direction is used, it is possible to decode the code in either of the forward and backward directions as one code string without dividing the code string into two parts in the forward and backward directions. In this case, it is possible to increase the probability of decoding of an important portion by the reorder of the code string as shown in FIGS. 8A, 8B, 10A, 10B, 11A, 11B, 12A and 12B. As an example thereof, FIG. 13 shows a method for arranging the code string when a variable-length code which can be decoded in either directions is used. In this figure, the blocks of numerals correspond to macroblocks when the coding is carried out.

The second preferred embodiment of a coding system according to the present invention will be described below.

Figure 14:
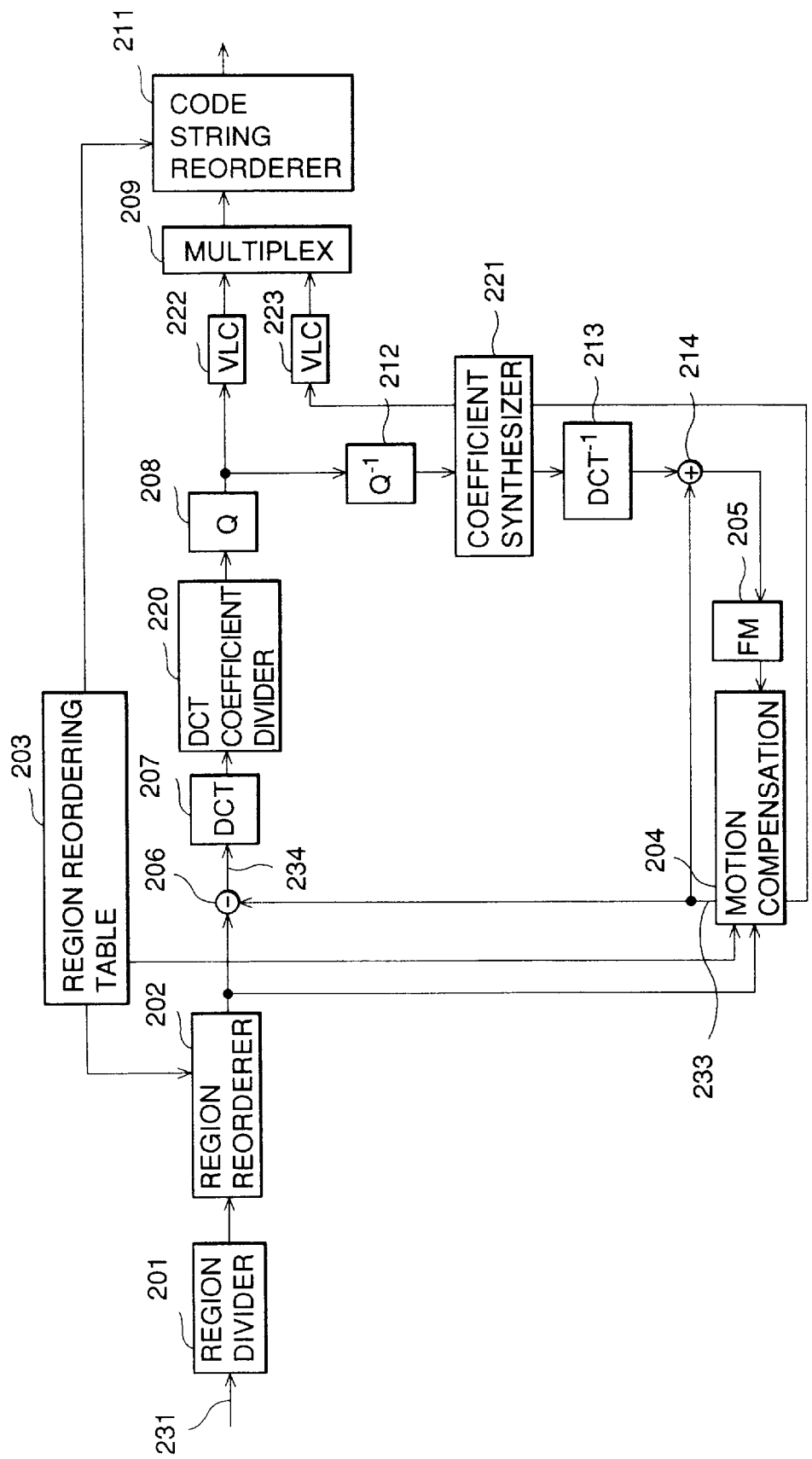
FIG. 14 is a block diagram of the second preferred embodiment of a moving picture coding system according to the present invention.
Figure 15:
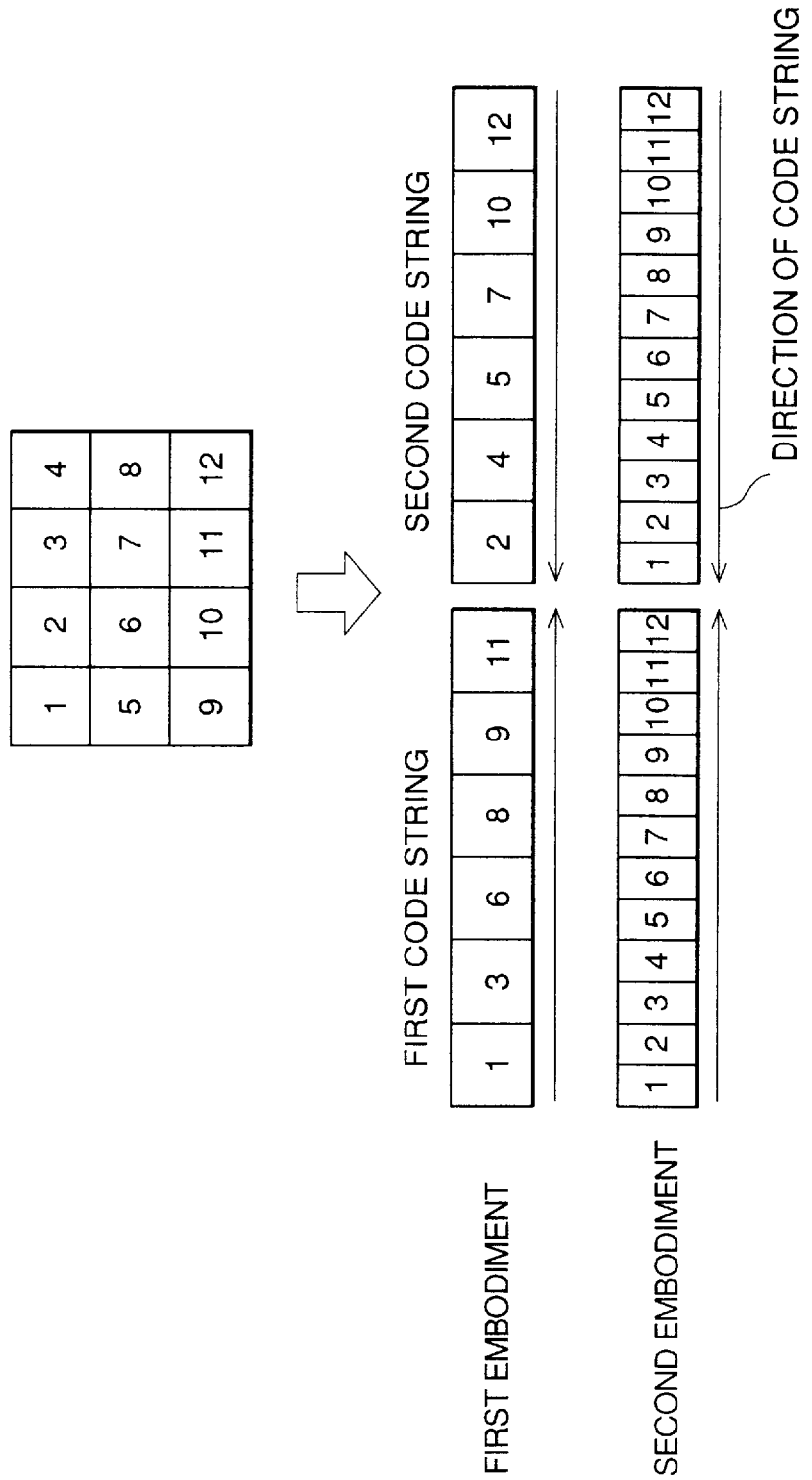
FIG. 15 is a view showing the difference between the first and second preferred embodiments.

FIG. 14 is a block diagram showing the second preferred embodiment of the present invention. In the first preferred embodiment of FIG. 7, the data of the whole screen are divided into those of two groups of regions, and are divided into the corresponding code string by means of the code string divider 110. On the other hand, in the second preferred embodiment, in place of each of the first and second code string including all the regions of the whole screen, the code string of each of the regions includes only one of two regions divided by means of a DCT coefficient divider 220.

In this way, even if the data of one of the code string are missed, when the data of the other code string is able to be decoded, it is possible to decode image data having a certain measure of quality although the quality for each of the regions is less than the usual quality, so that it is possible to obtain a uniform picture quality on the whole screen in comparison with the first preferred embodiment. Alternatively, it is possible to divide the other data than the DCT coefficient into two parts for coding.

Figures 3A, 3B:
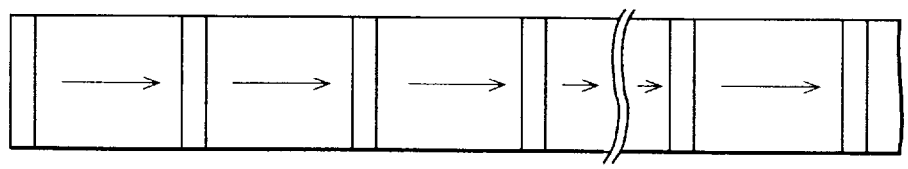
FIGS. 3A and 3B are views showing an example of the conventional rank order for scanning DCT coefficients.
Figure 16B:
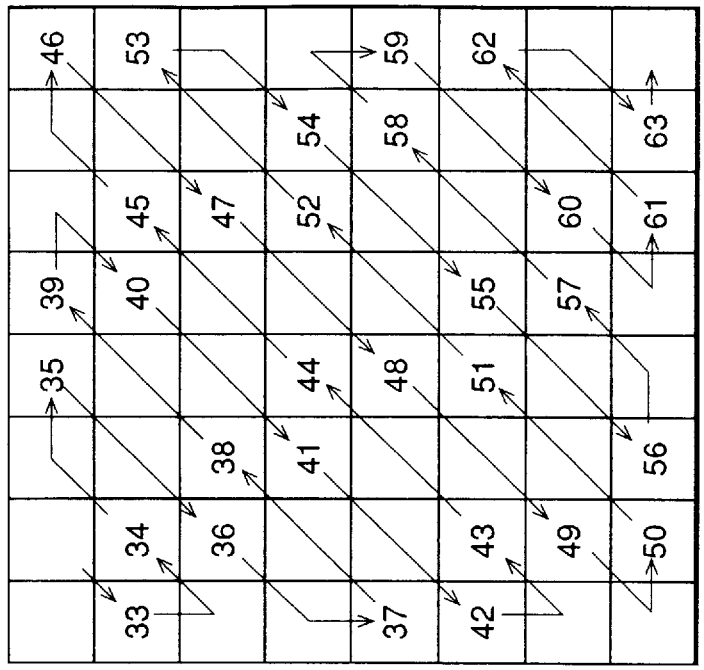
FIGS. 16A and 16B are views showing an example of the rank order for scanning DCT coefficients according to the present invention.
Figure 16A:
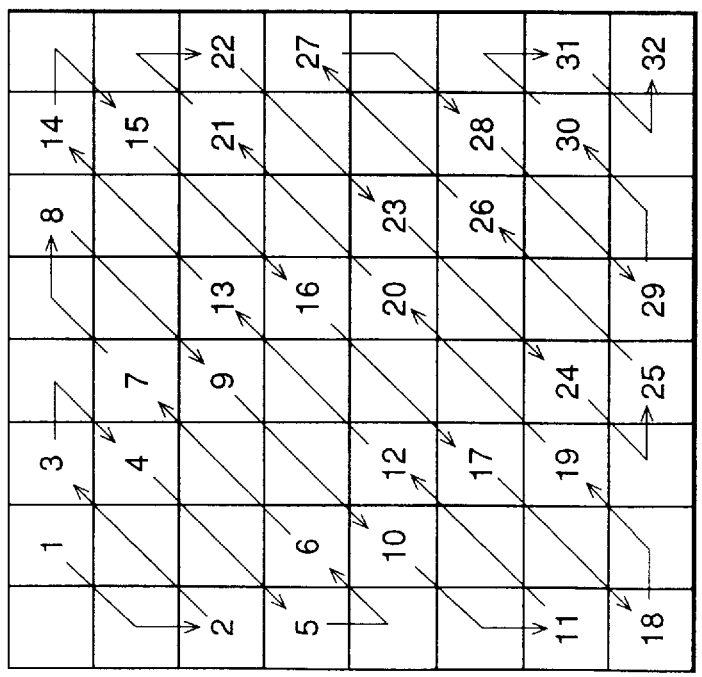
Figure 17A:
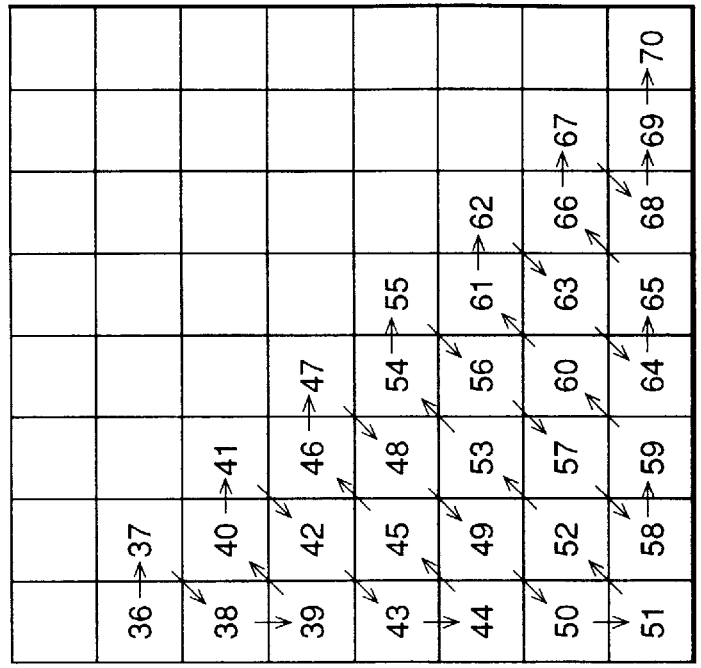
Figure 17A:
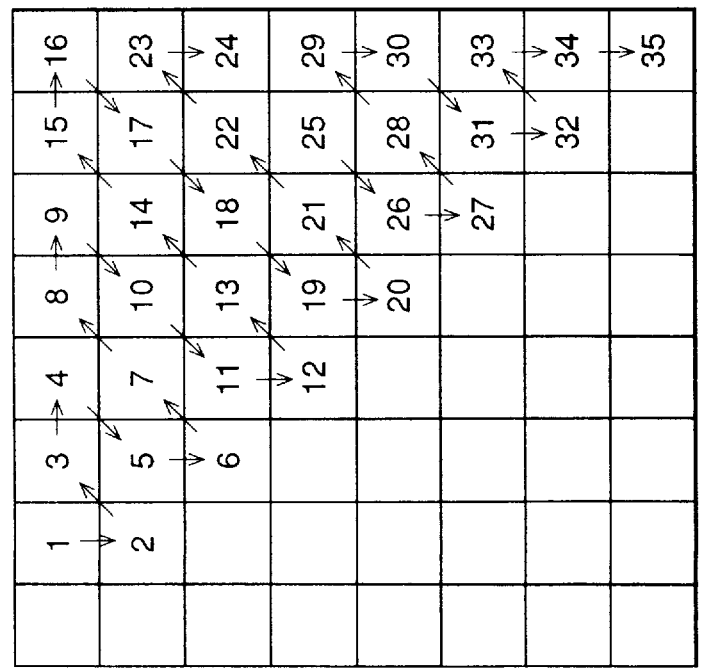

As the construction for dividing the data of each of the regions into two parts, there is the following example. In conventional systems, the coefficient obtained by the discrete cosine transform of an adaptive prediction signal is coded by a zigzagged scan as shown in FIG. 3A–3B. On the other hand, according to the present invention, the data of each of the regions are divided into coefficients of odd numbers and coefficients of even numbers as shown in FIGS. 16A–16B. Alternatively, they may be divided into portions having a close connection in the horizontal direction and portions having a close connection in the vertical direction. Although the row of the DCT coefficients is divided on the basis of the usual zigzagged scan in the aforementioned example (FIGS. 16A–16B), the DCT coefficients may be divided on the basis of a scan suitable for the image, according to the present invention.

Figure 5:
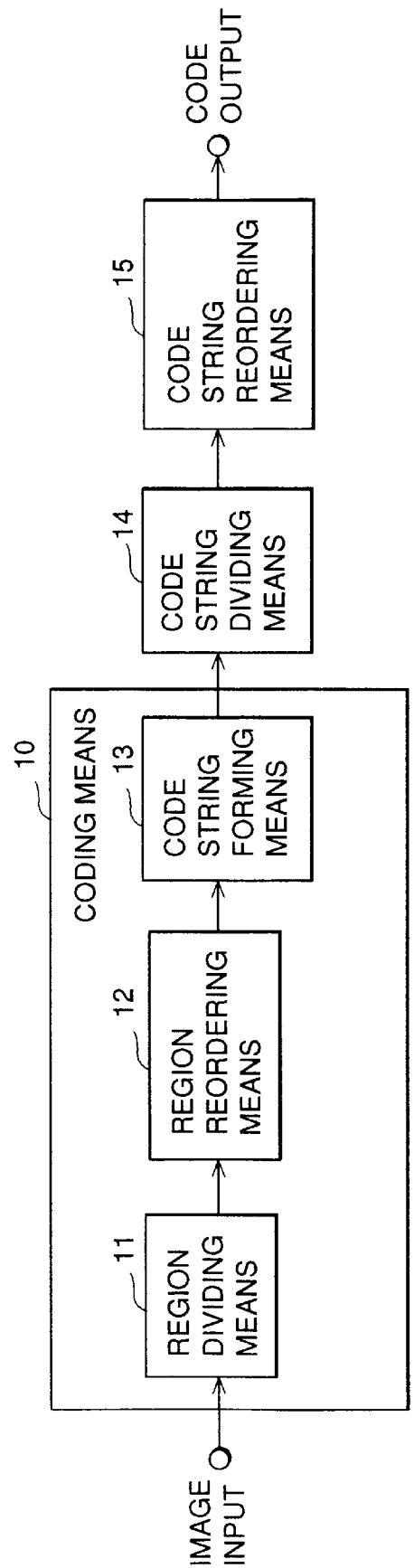
FIG. 5 is a block diagram showing the basic concept of a moving picture coding system according to the present invention.
Figure 6:
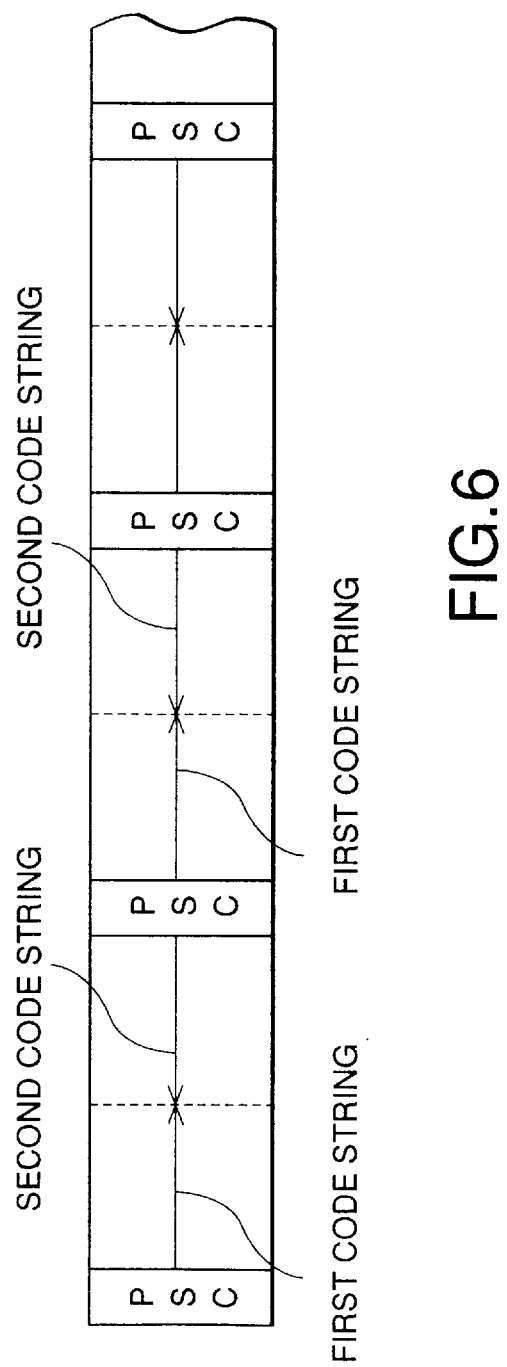
FIG. 6 is a view showing a code string formed by the coding system of FIG. 5.
Figure 18:
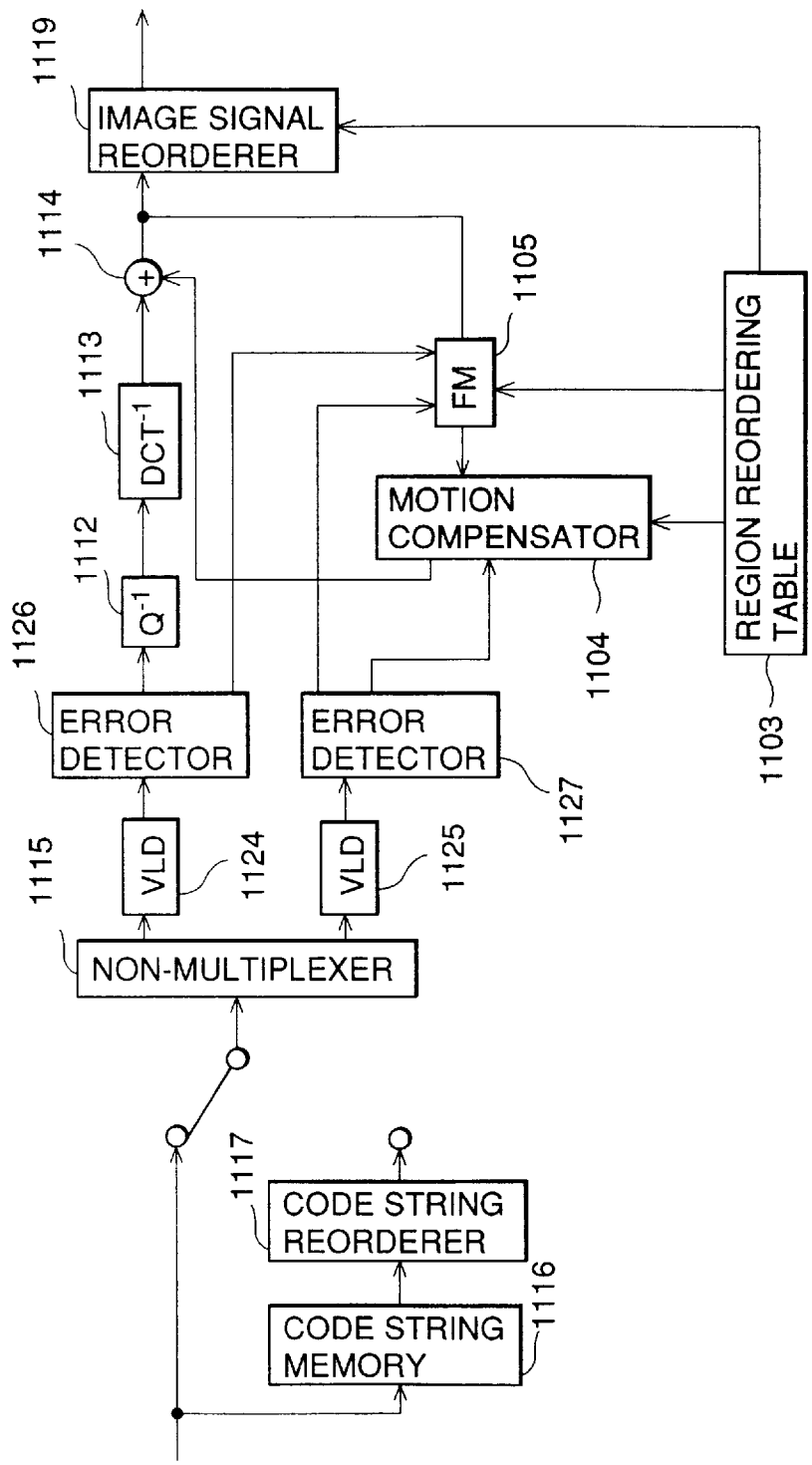
FIG. 18 is a block diagram of the preferred embodiment of moving picture decoding system according to the present invention.

FIG. 18 shows a moving picture decoding system corresponding to the moving picture coding system of FIG. 5. After the frame synchronizing signals of the code string transmitted from the coding system to be stored are detected, a series of processing is carried out. That is, the predictive error signal for each of the regions is decoded on the basis of the data of a coding order table 1103, the reverse quantization is carried out by means of a reverse quantizer 1112, and the reverse discrete cosine transform is carried out by means of a reverse discrete cosine transformer 1113. At this time, the read code strings are stored in a code strings memory 1116. When the decoding of the front part of the first code string is finished, or when it has been impossible to decode the front part due to some errors, the decoding processing is stopped, and the code strings continue to be stored in the code string memory 1116 until the frame synchronizing signal of the next frame is received. When the frame synchronizing signal of the next frame is sought, the contents of the code string memory 1116 are read out in reverse bit by bit from the last, and are decoded. After the decoding is carried out similar to that of the front part of the first code string, when the decoding is finished or when it has been impossible to decode the front part due to errors, the decoding processing is finished, and the decoded data of the front part of the first data and the rear part of the second data are combined as decoding data.

Then, the decoding data is added to a prediction signal by means of an adder 114 to obtain reproduced image data. The reproduced image data are outputted to the outside of the system are recorded in a frame memory 1105. As mentioned above, two code strings divided into two parts, one of which has been arranged in the forward direction and the other of which has been arranged in the backward direction, are decoded, so that even if it has been impossible to decode the data of one of the top code strings due to errors, it does not influence the other code strings and it is possible to decode the data of the other code strings. Moreover, since the coding order is changed by reordering the regions, when error detectors 1126 and 1127 detect errors, it is possible to easily predict and complement the regions that are unable to be decoded, on the basis of the regions having been able to be decoded, in comparison with the conventional systems.

Figure 19:
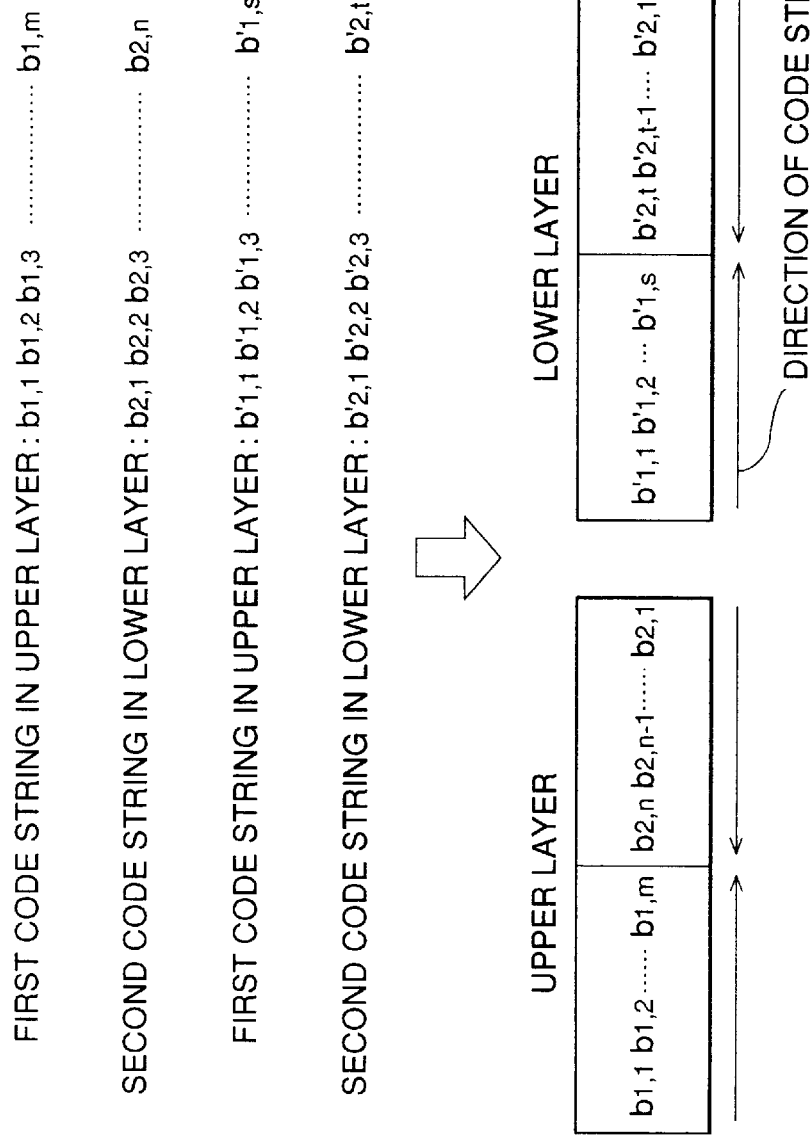
FIG. 19 is a view of the preferred embodiment corresponding to the hierarchy coding according to the present invention.

Next, a coding system wherein the transmitting is carried out by means of two channels having different error rates, will be described. When the transmitting is carried out by means of two channels having different error rates, a hierarchical coding means by which when an error occurs, the important data having substantial importance is transmitted through a good-quality channel having a low error rate and the data of lesser importance is transmitted through a channel of a high error rate, has been often used. Therefore, with respect to the data which are respectively transmitted to the channel of a low error rate (an upper layer) and the channel of a high error rate (a lower layer), the reordering of regions, the dividing of code strings and the reordering of the code strings are carried out by the same method as the first and second preferred embodiments, so that the same processing with respect to the hierarchical coding can be carried out. FIG. 19 shows an example of code strings when they are combined with the hierarchization. In this example, out of the code string, the regions of which have been reordered to be coded, important data such as mode data and motion vector are inputted to the code string of the upper layer, and predictive differential signal is inputted to the code string of the lower layer.

Figure 20:
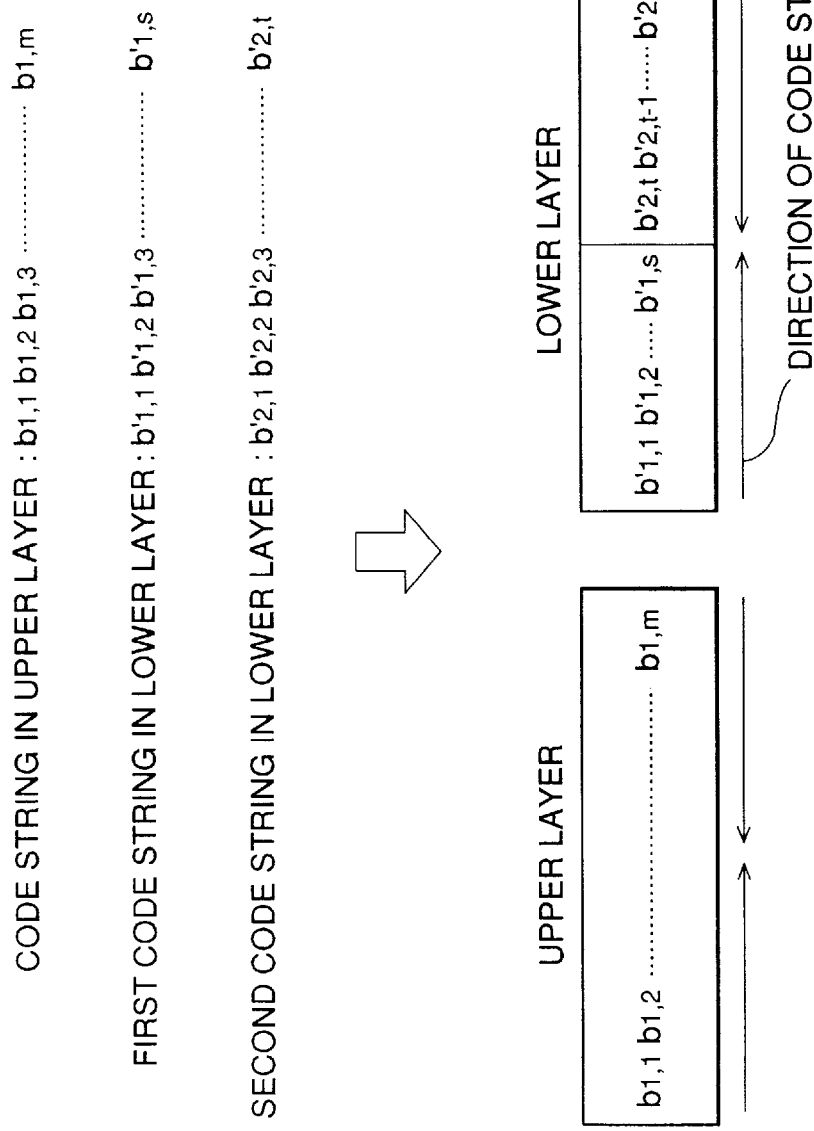
FIG. 20 is a view of the preferred embodiment corresponding to the hierarchy coding according to the present invention.

Then, the code strings of each of the hierarchies are divided into two parts, one of which is reordered in the forward direction from the prefix to the end, and the other of which is rearranged in the backward direction from the suffix to the head. When the code strings are divided as in the first preferred embodiment, it is possible to adjust between the upper and lower layers if the same dividing methods are carried out in the upper and lower layers. However, in a case where the regions of a frame are divided into two parts, if the code strings are concentrated on one of the two parts, it is considered that the error rate of the upper layer is low, so that the code string of the upper layer is not divided to express the upper layer by a code string as shown in FIG. 20, and the code string of only the code string of the lower layer is divided. In this case, the number of the regions contained in FIGS. 8A and 8B is changed so that the code amounts of the two code strings of the lower layer are equal to each other. That is, the number of the regions contained are not equalized to by dynamically changed on the basis of the mode data of the upper layer. In this way, it is possible to equalize the code amounts of the divided two parts of the code string of the lower layer to another.

Although the prediction error is separated from the other data in the aforementioned examples, the motion vectors may be divided into the upper and lower layers in accordance with the code amount of the motion vector. Alternatively, when the code amount of the motion vector is small and there is space in the upper layer, some of the DCT coefficients of the predictive signals may be divided into the upper and lower layers and so forth.

Figure 22:
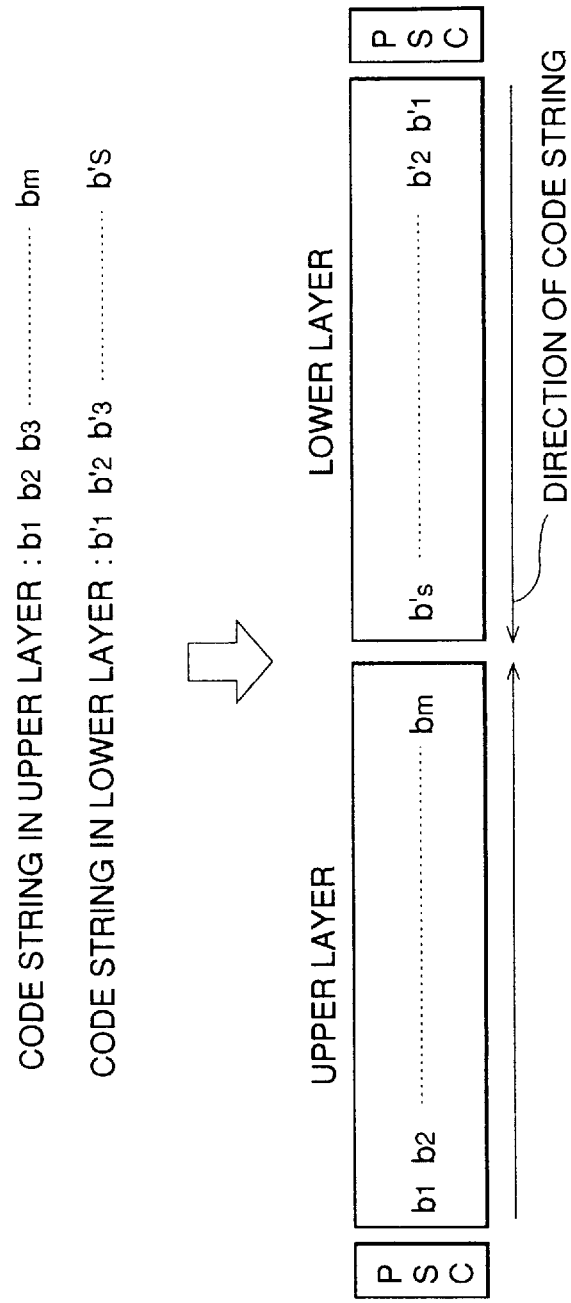
FIG. 22 is a view of the preferred embodiment corresponding to the hierarchy coding according to the present invention.

As shown in FIGS. 21A–21C in a system for arranging important code strings to the front portion with respect to one channel and for arranging code strings of lesser importance so as to continue the important code string, the important code strings in FIG. 21A are arranged in the forward direction, and the code strings of lesser importance are reordered in the backward direction so that the important code strings are arranged at the rear portion (FIG. 21C). As a result, it is possible to correctly decode a greater amount of data even if errors occur, in comparison with the conventional system as shown in FIG. 21B. In this case, the data of the lower layer corresponding to the data arranged at the head of the code string of the upper layer (code string in the forward direction) are arranged at the head of the code string of the lower layer (code string in the backward direction). Since the probability for correctly decoding the data of the head is greater in the variable-length code, if the system in this preferred embodiment is applied as shown in FIG. 22, as the data is arranged at a front portion in the upper layer and as the data is arranged at a rear portion in the lower layer, the probability for being decoded is great.

Figure 23A:
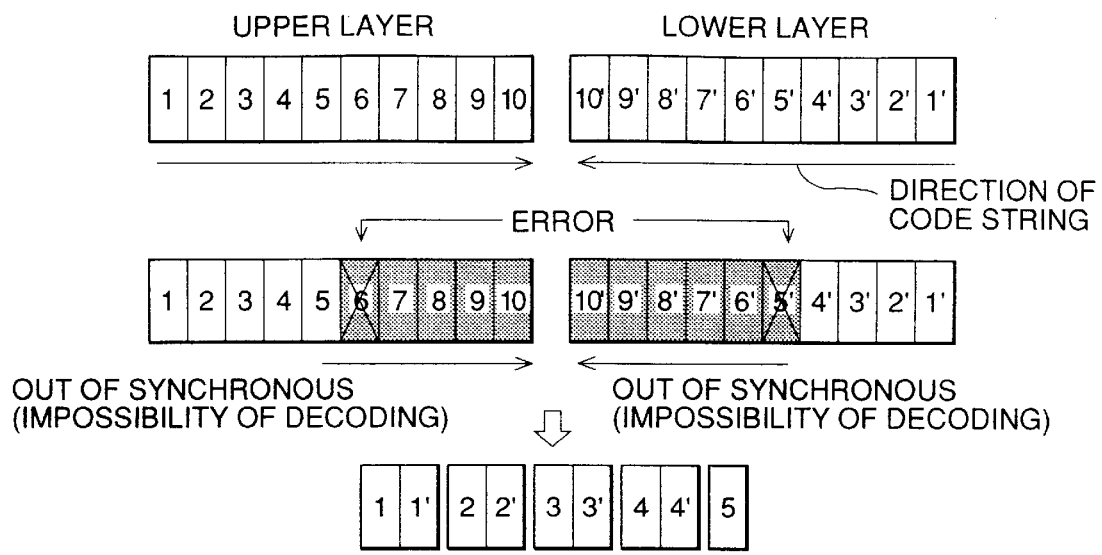
FIGS. 23A and 23B are views showing the occurrence of errors in the preferred embodiment corresponding to the hierarchy coding according to the present invention.
Figure 23B:
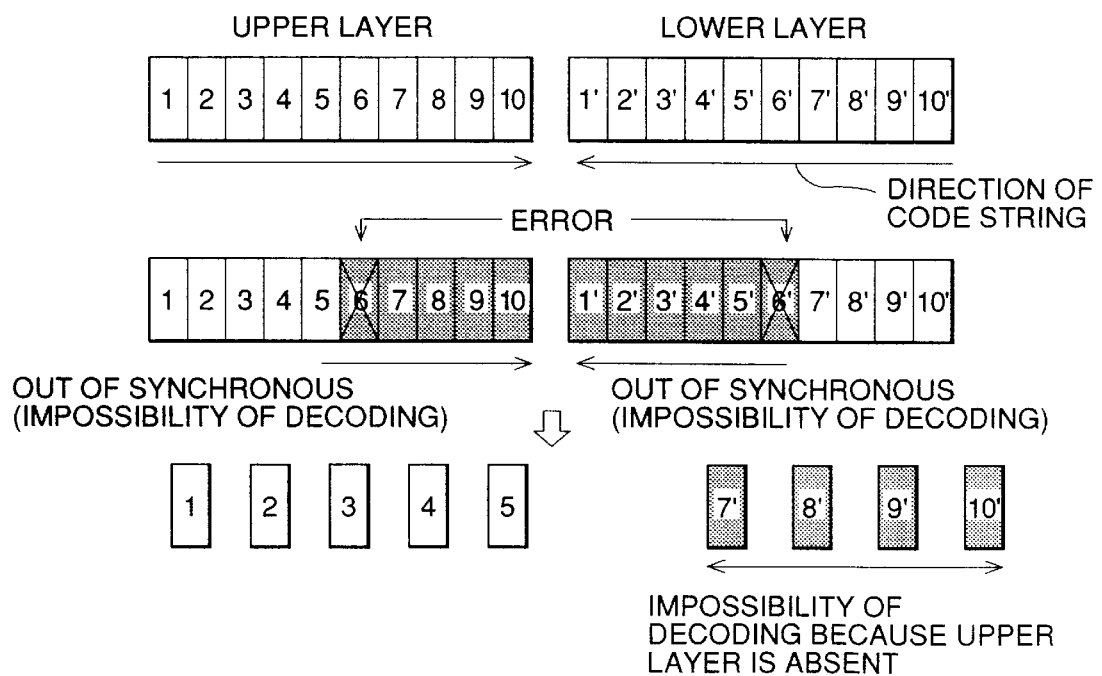

Therefore, out of the systems for coding unit by unit such as block by block, in a hierarchical coding system for dividing the data of each of units into upper and lower layers and for coding the divided data, the efficiency is high as the data of the lower layer corresponding to the data of the upper layer is arranged at the rear portion (near the synchronizing signal of the rear portion). This is shown in FIGS. 23A–23B in detail. In this case, if they are arranged as shown in FIG. 23B, not FIG. 23A, there is no upper data corresponding to the lower data having been correctly decoded. Therefore, if the decoding has been able to be carried out at the level of the code words, the image data signal can not be reproduced therefrom.

In a case where a moving picture coding and/or decoding system according to the present invention is applied to the hierarchical coding system, the code string arranged in the forward direction and the code string arranged in the backward direction may be respectively formed in a hierarchy without applying the system of the present invention to each of the formed in a hierarchical code string as the aforementioned preferred embodiment.

Figure 24:
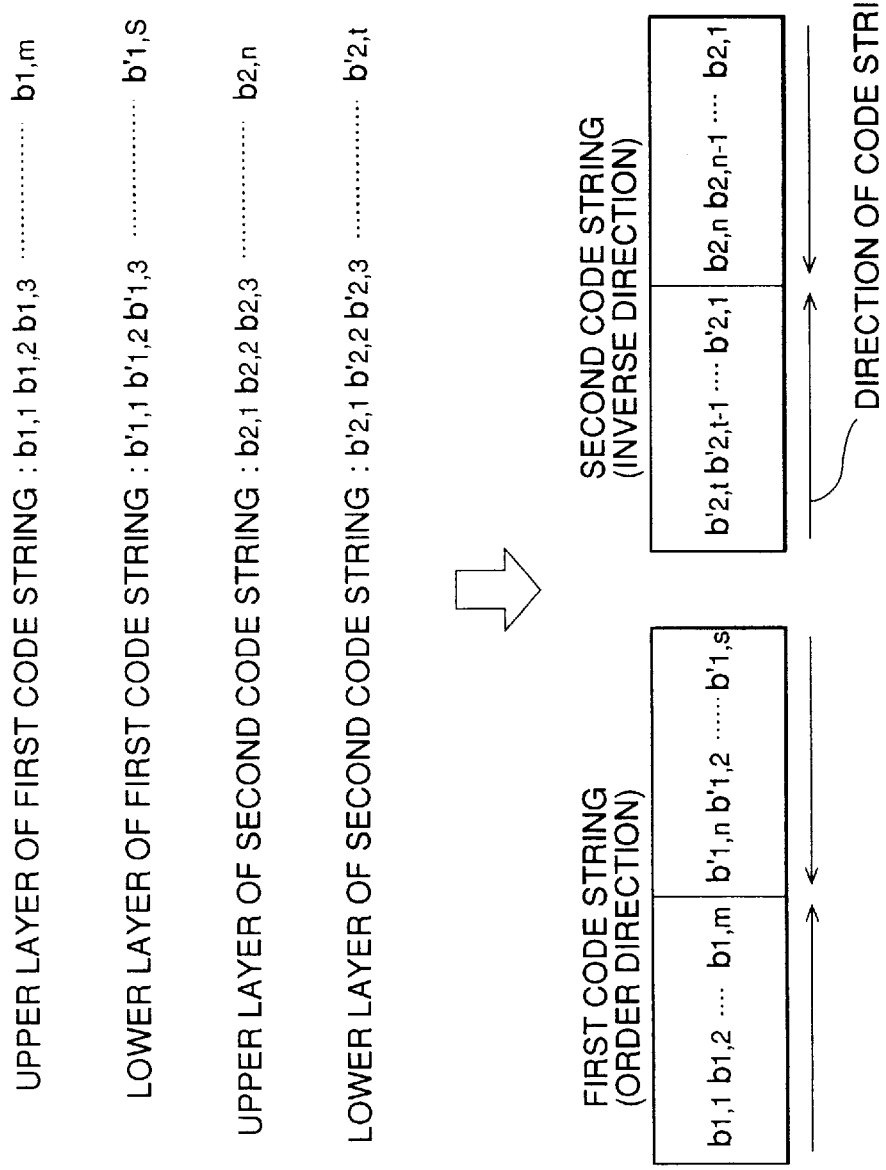
FIG. 24 is a view showing the preferred embodiment of the application of the hierarchy coding according to the present invention.

FIG. 24 shows the construction of a code string for explaining the preferred embodiment for the hierarchization each of code string. As shown in FIG. 24, in this preferred embodiment, each of the code strings divided into two parts is formed in a hierarchy. For example, first, the image data of one frame are interlaced-scanned to be divided into two fields, one of which is configured as a code string in the forward direction, and the other of which is configured as a code string in the backward direction. Then, in the respective code string, the hierarchization is carried out so that the data always necessary for coding are arranged as the upper data and the residual data and so forth are arranged as the lower data.

In the code string thus formed in a hierarchy, if one of the code strings can not be decoded due to errors, the other code string can be completely decoded. Therefore, it is possible to easily and efficiently carry out the hierarchical coding in comparison with the separated hierarchizations of the upper and lower data. It is also possible to efficiently make in hierarchy the codes in a system which can not be utilized unless the upper data have been completely decoded even if the lower data have been decoded. As a system which can not be utilized unless the upper data have been completely decoded even if the lower data have been decoded, there is considered a system wherein for example, in FIG. 19, no synchronizing signal is inserted between the upper and lower data, or no pointer data representative of the tail of the upper data is added and so forth. Therefore, in the preferred embodiment of FIG. 15, although it is possible to eliminate the disadvantage in that no data is utilized unless the lower data have been decoded even if the upper data have been decoded, by inserting a synchronizing signal between the upper and lower data or by adding a pointer data and so forth, it is possible to very easily eliminate the aforementioned disadvantage by hierarchical coding as in this preferred embodiment.

Figure 25:
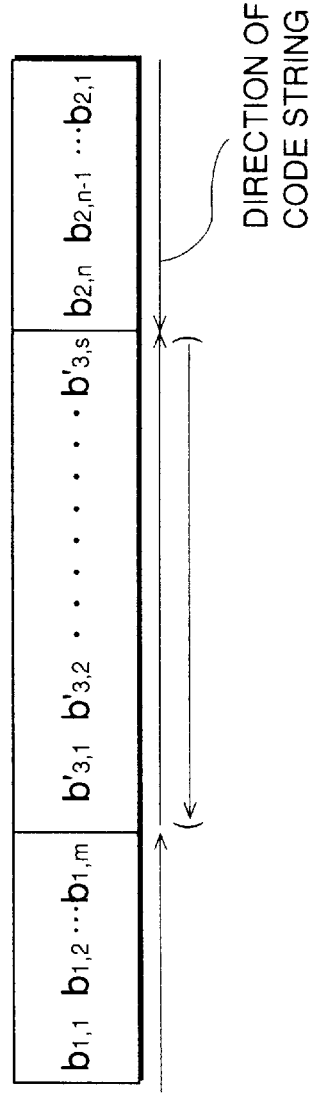
FIG. 25 is a view showing three code strings according to the present invention.

Referring to FIG. 25, another preferred embodiment of a moving picture coding system, according to the present invention, wherein moving picture data are divided into three code strings to be coded, will be described below.

In this preferred embodiment, moving picture data are coded in view of the aforementioned concept of the hierarchical coding. For example, important data are divided into two parts so as to form first and second code strings and the data not contained in the code strings of the important data from a third code string. After the first to third code strings are formed in accordance with the importance of the data, the code strings are specifically formed as shown in the bottom of FIG. 25. By arranging codes in such a way, it is possible to protect important data.

For example, when the hierarchical coding as shown in FIG. 25 is applied to the coding of image data, the mode data and motion vector are assigned to the important data portion, and these data are divided into two code strings in view of the position on the screen in which these data are arranged. In this division, even if one of the two code strings for important data is missed due to errors, in order for the other code string to be able to compensate the errors, the macroblocks are so selected as to form a checkered pattern so that, for example, the black blocks of the checkered pattern correspond to the first code string and the white blocks thereof correspond to the second code string. As a result, it is possible to easily carry out processing such as flashing and concealment.

As mentioned above, the important data may be divided into the first and second code strings to be arranged, and the residual may be assigned to the third code string. Alternatively, in order to improve the error resistance of the third code string itself, a fixed-length code or a variable-length code which can be decoded in either direction may be arranged in the third code string.

The aforementioned construction may be combined with the doubling of code strings. By using the second code string which is the same as or similar to the first code string and by arranging the code string as shown in the bottom of FIG. 25, the first code string is usually decoded only in the forward direction, and it is possible to obtain complete image data having no errors by decoding the second code string in the backward direction when errors occur in the first code string.

Moreover, with respect to the arranging order of each of the code strings and the positional relationship on the screen, for example, the data of the first code string are assigned to the corresponding picture elements from the upper-left portion to the lower-right portion of the screen, and the data of the second code string are assigned to the corresponding picture elements from the lower-right portion to the upper-left portion, so that it is possible to reduplicatively utilize the first code string decoded from the upper-left portion to the lower-right portion, and the second code string decoded from the lower-right portion to the upper-left portion, if an error occurs in any one of the code words. In this way, for example, even if an error occurs at any one of positions of any one of the code strings, the first and second code strings may be decoded in the forward and backward directions, respectively, so as to compensate each other, so that it is possible to improve the probability of data to be decoded. In this way, even if both of the paired code strings can not be completely decoded in the order for configuring the code string, they can be compensated by another, so that it is possible to increase the rate of data which can be correctly decoded when an error occurs in any one of the code words.

In addition, since it is not required to add a synchronizing signal and so forth to the prefix of the duplicated data, the efficiency is higher than when it is simply duplicated. This construction should not be limited to the arrangement as shown in FIG. 25, and it can be applied to any one of the other preferred embodiments of the present invention by using one of the code strings as a usual code string and the other code string as an auxiliary code string.

As an example of practical applications, the code words may be arranged every smaller data unit in the forward and backward directions, not every code string in the forward and backward directions. In all the aforementioned preferred embodiments, the code strings are divided into two data units on the basis of a certain standard, and the code words are arranged in one of the data units in the forward direction and in the other data unit in the backward direction. However, the code string arranged in the backward direction at the time of coding is required to be reordered and outputted after being temporarily stored in a buffer. Therefore, there are disadvantages in that the reorder can not be carried out unless the coding is finished, so that the processing operation is delayed.

Figure 26:
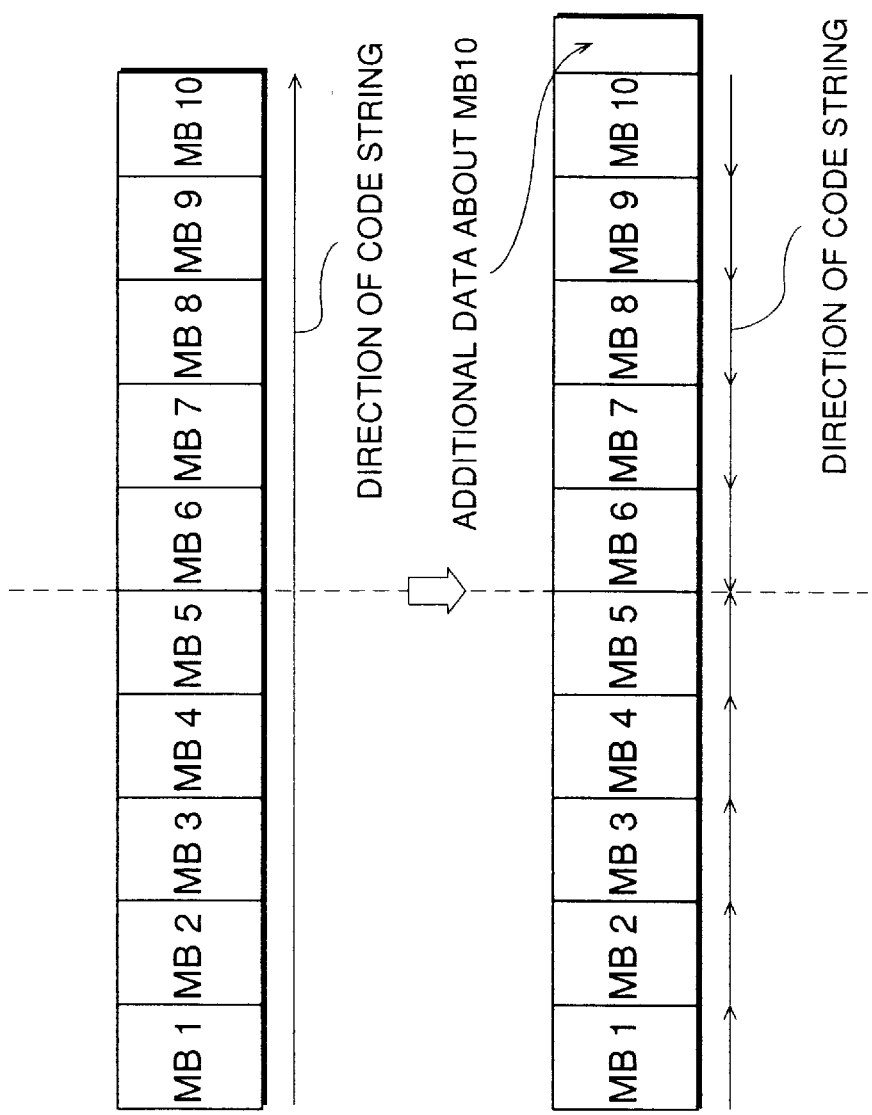
FIG. 26 is a view showing code strings whereby the delay of processing operation can be decreased according to the present invention.

In order to decrease the delay of the processing operation, a relatively large unit such as a code string is not used as a data unit for coding, and for example, the coding may be carried out in the backward direction using a small unit such as a macroblock unit. This preferred embodiment is shown in FIG. 26. In FIG. 26, when the data of microblocks MB1 through MB10 are divided into halves, the macroblocks MB6 through MB10 arranged in the backward direction are not reordered as a group, and the data of each of the macroblocks are arranged to be coded.

In this preferred embodiment, the decoding must be carried out in order starting from the MB10 by means of a decoder. However, in a usual decoder, the data must be decoded in order starting from the macroblock MB1, since the data of the last macroblock are used in the data of the current macroblock so that the difference between the last macroblock and the current macroblock is coded and the current macroblock is decoded by means of the differential signal.

Therefore, in this preferred embodiment, additional data are added so as to be able to be decoded in order starting from the rear data, in order to eliminate the aforementioned disadvantage in that the decoding must be carried out in the forward direction. For example, with respect to the data for coding the difference between the current data and the last data such as the motion vector and the quantizing width, the actual values of the motion vector and the quantizing width of the macroblock MB10 are added as additional data so that the decoding can be carried out in order starting from the rear data. Therefore, the decoding can be started from the macroblock MB10. Thereafter, since the data with respect to the difference between the macroblocks MB9 and MB10 are included in the data of the macroblock MB10, such data are used to decode the macroblock MB9. Then, in the similar manner, the decoding is carried out in the backward direction, such as in order of MB8, MB7 and MB6, so that it is possible to completely decode a group of data. These additional data are not always required to be added to the positions as shown in FIG. 26, and may be added to any positions as long as the positions can be identified before the code words arranged in the backward direction are decoded.

While the preferred embodiments of the hierarchy coding have been described above, the methods as mentioned above should not be limited to the method for arranging the code string when coding the data of different importance such as the upper and lower layers, and the same method can be applied to two code strings of the same importance.

In addition, a coding system according to the present invention can not only be applied to only two layers such as the upper and lower layers, but the present invention can be also applied to a group data of having more than two layers, similar to the foregoing.

Furthermore, in the aforementioned preferred embodiments, the code strings are reordered frame by frame, and the synchronization is carried out by means of frame synchronizing signals. However, it is not required to be carried out by means of frame synchronizing signals, and all cases can be utilized if there is a synchronizing signal after the second code string before the first code string. For example, when there are a plurality of synchronizing signals in one frame (for example, when synchronizing signals are inserted every line of FIG. 2A, in the conventional system, intraframe synchronizing signals can be inserted into each of lines as shown in FIG. 2B, and the region reorder, the coding division and the code string reorder can be carried out in one line as a unit containing regions between the adjacent synchronizing signals as shown in FIG. 2C. That is, as the conventional system of FIG. 2B, the conventional reorder can be carried out as shown in FIG. 2C.

Figures 4A, 4B:
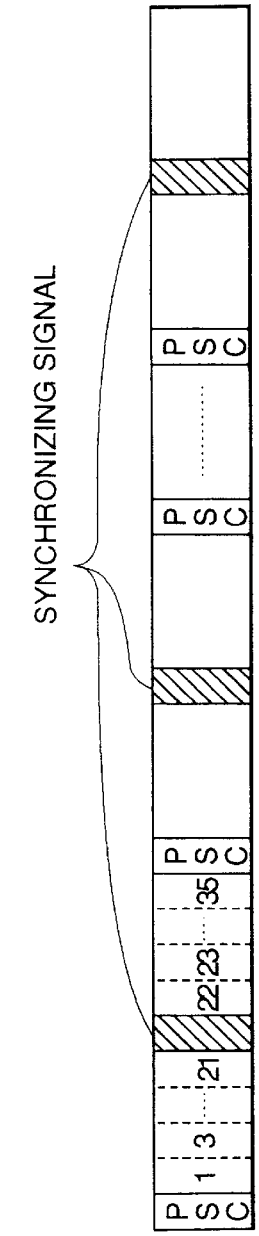
FIGS. 4A and 4B are views showing an example of conventional methods for inserting synchronizing signals.
Figures 27A, 27B, 27C:
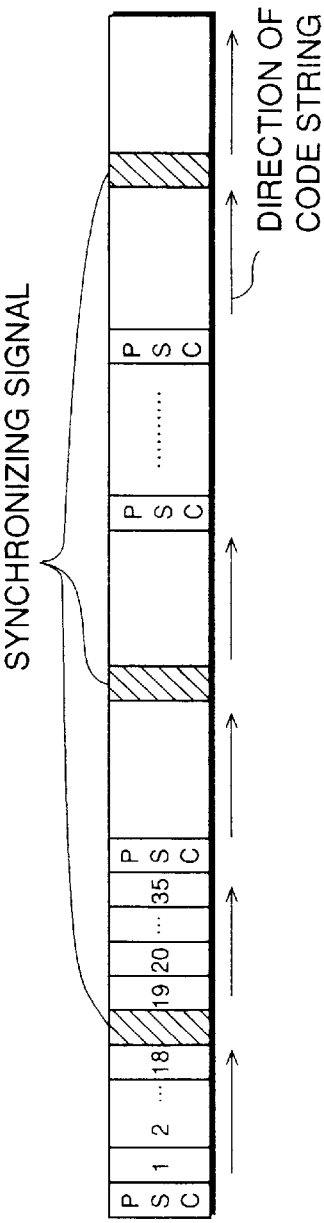
FIGS. 27A–27C are views showing that a method for arranging regions in order of importance is applied to a method for configuring a frame by a plurality of synch-blocks, according to the present invention.

FIGS. 27A–27C are views showing that a method for arranging from an important region is applied to a method wherein one frame comprises a plurality of synchblocks. In this method, synchronizing signals other than the frame synchronizing signal (PSC) are inserted into the frame so as to decrease the data which can not be used, even if an error occurs. Such a method has been conventionally used as shown in FIGS. 4A–4B. With respect to each of the synchblocks wherein the interior of the frame has been divided, the synchblock which has been coded in order of FIG. 27A may correspond to a first synchblock, and the synchblock which has been coded in order of FIG. 27B may correspond to a second synchblock, so that even if one of the synchblocks is missed due to errors, it is possible to increase the probability of correct decoding as the block is important.

In the aforementioned preferred embodiment, the decoding can be carried out in either direction by adding synchronizing signals to both of the head and end of the code string. According to the present invention, the synchronizing signals are not particularly required as long as the last portion of the code string can be identified before decoding the code string.

The preferred embodiment of a system which uses no synchronizing signals will be described below.

Figure 28:
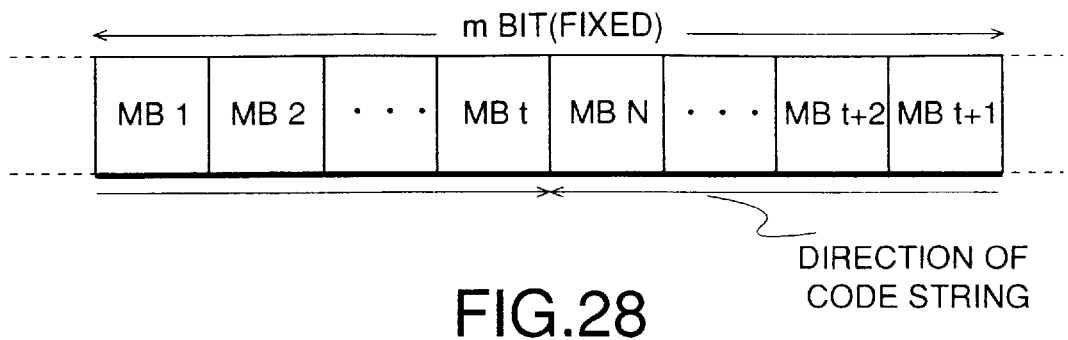
FIG. 28 is a view of the preferred embodiment of a code string applied to a fixed-length code, according to the present invention.
Figure 29:
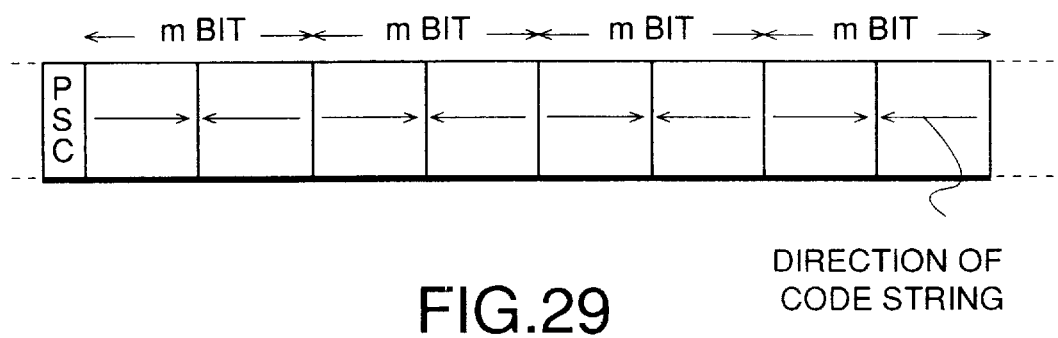
FIG. 29 is a view of another preferred embodiment of code string applied to a fixed-length code, according to the present invention.

In a coding system wherein the fixed-length coding of data of a predetermined unit such as one frame or several macroblocks are carried out to be outputted, the head of each of the code strings arranged in the forward direction and the code strings arranged in the backward direction can be identified regardless of synchronizing signals and so forth on the decoding side. FIG. 28 shows an example of application of a coding system according to the present invention, to the code string which has been fixed-length coded. In this example, the present invention is applied to code string which have been fixed-length coded so as to be m bits by combining N macroblocks (MB). In this preferred embodiment, as shown in FIG. 29, since the head of the code string arranged in the backward direction is always arranged every m bits, it is not required to insert any synchronizing signals into the code string, so that the decoding can be regularly and correctly carried out.

Unlike the aforementioned construction, in a system wherein the data do not have a fixed length of the aforementioned predetermined unit, the preferred embodiment which can identify the head position of code string arranged in the backward direction using no synchronizing signals will be described below.

Figure 30:
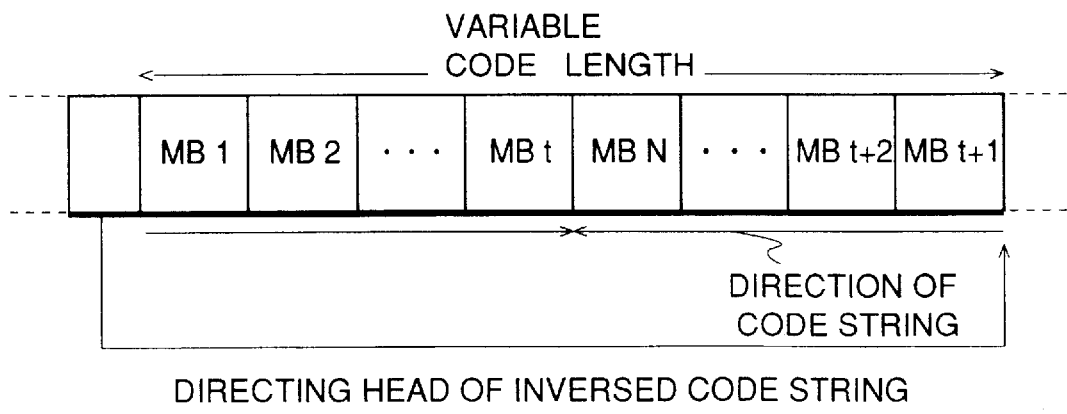
FIG. 30 is a view of the preferred embodiment of a code string using additional data, according to the present invention.

In this preferred embodiment of the system, the data for identifying the position of the prefix of the code string in the backward direction are added to an output code string. FIG. 30 shows the code string in this preferred embodiment. By arranging the pointer data representative of the prefix position at the position of the frame header or at the position corresponding thereto, the prefix of the code string arranged in the backward direction is identified using the pointer data on the decoder side, and the code strings are decoded. In this way, the tail of the code string can be identified by a predetermined unit in place of synchronizing signals, so that the present invention can be practiced in a variable-length coding system.

The preferred embodiment of a high-speed reproduction which can be applied to the aforementioned first and second preferred embodiments will be described below.

In the case of a high-speed forward reproduction, after the frame synchronizing signal representative of the head of the frame is received, only the first code string at the head described in the forward direction is decoded by the aforementioned decoding processing to proceed to the processing of the next frame. The data corresponding to the second code string reordered in the backward direction can be interpolated by means of the data decoded by the first code string and so forth.

In the case of a high-speed backward reproduction, similar to the high-speed forward reproduction, the frame synchronizing signal is sought in the backward direction, and only the second code string reordered in the backward direction is decoded after the frame synchronizing signal is received. In this case, since the image data of the last frame are required when motion-compensated adaptive prediction coding is used, it is required to select only the frame which does not use motion-compensation.

Figure 31:
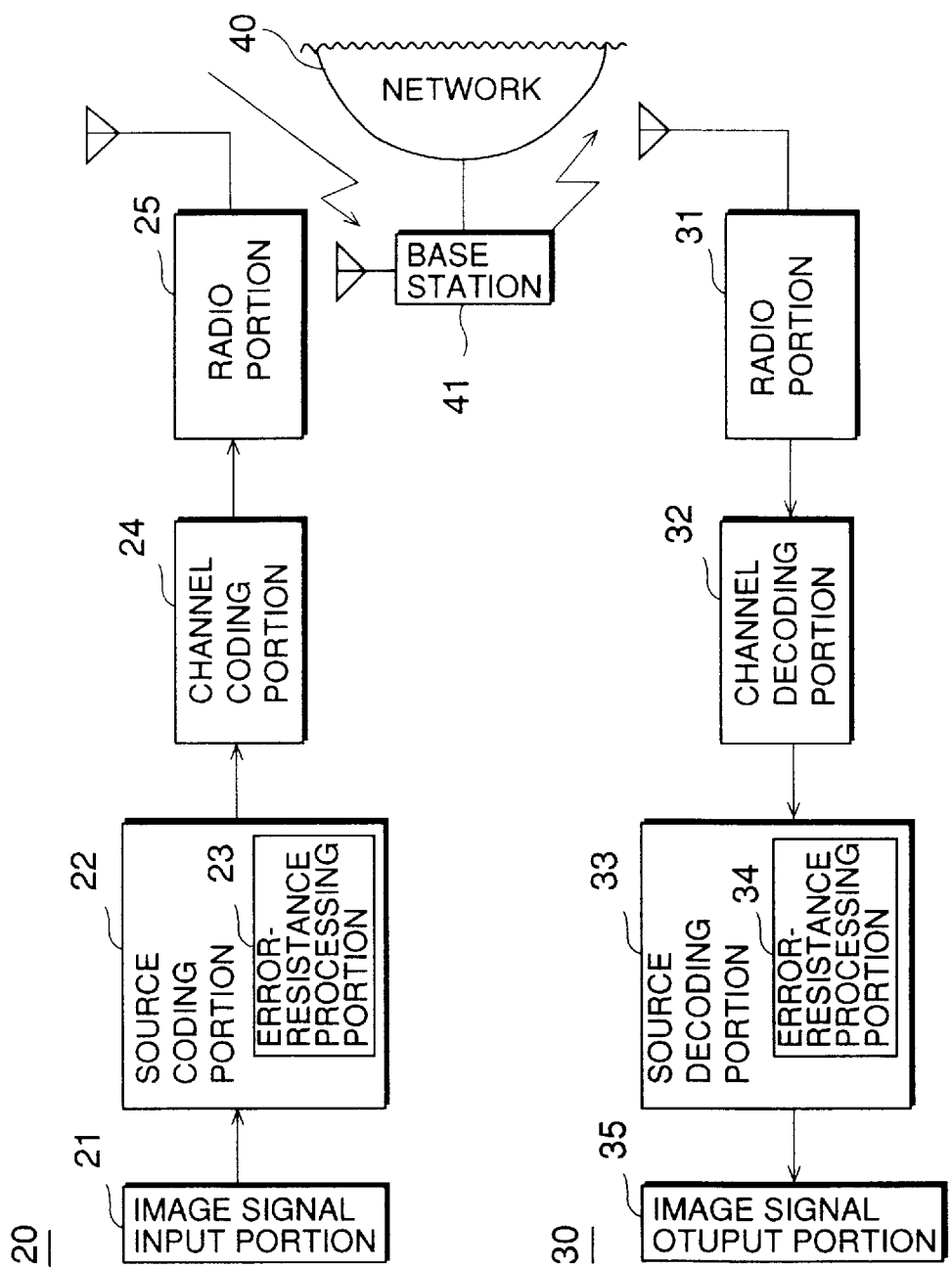
FIG. 31 is a view of the preferred embodiment of a moving picture coding and/or decoding system, according to the present invention, which is applied to a radio communication system.

FIG. 31 shows the third preferred embodiment of a moving picture coding and/or decoding system, according to the present invention, which is applied to a radio communication system. In FIG. 31, the radio communication system includes an image transmitting system 20 and an image reproducing system 30, and the image data are transmitted and received through a base station 41 having a network 40.

The image transmitting system 20 comprises an image data signal input portion 21, a source coding portion 22 having an error-resistance processing portion 23, a channel coding portion 24 and a radio portion 25. In the source coding portion 22, the discrete cosine transform (DCT), the quantization and so forth are carried out. In the channel coding portion 24, the detection and correction of errors of the coded data and so forth are carried out.

The image reproducing system 30 comprises a radio portion 31, a channel decoding portion 32, an information source decoding portion 33 having an error-resistance processing portion 34, and an image data signal output portion 35.

Figure 32:
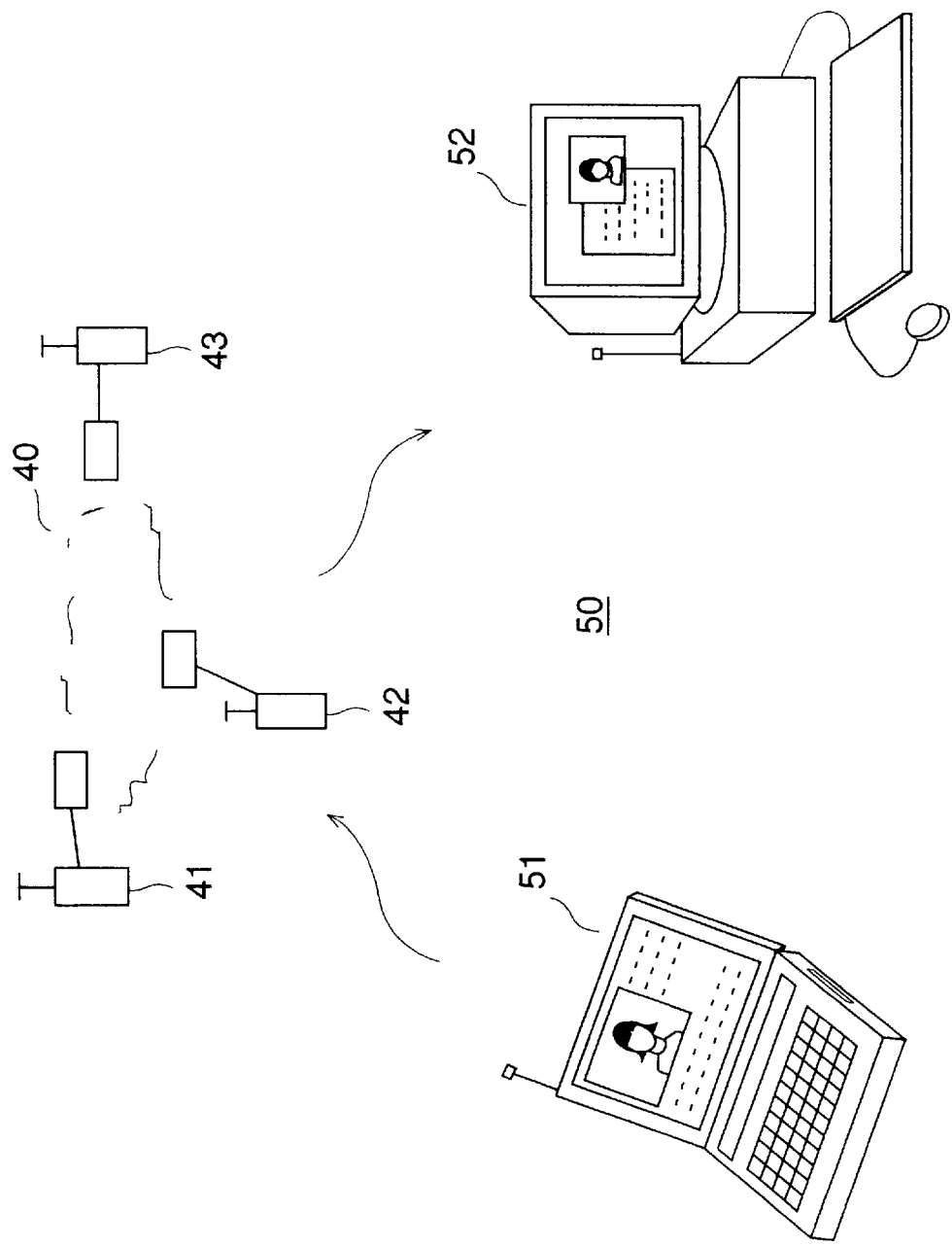
FIG. 32 is a view of the preferred embodiment of a moving picture coding and/or decoding system, according to the present invention, which is applied to a radio communication system.
Figure 33A:
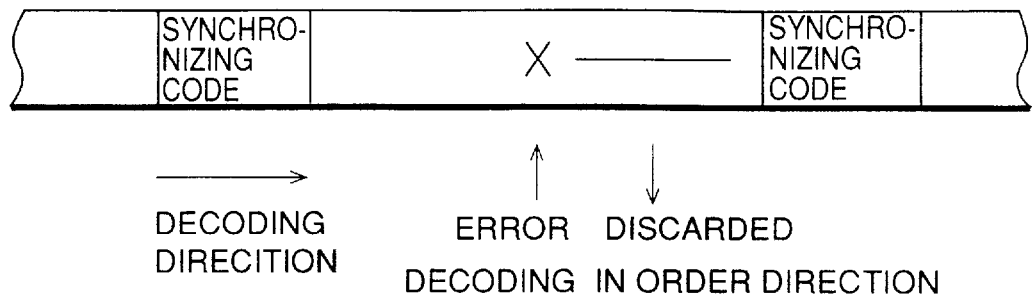
FIGS. 33A and 33B are views showing a general method for decoding a reversible code.
Figure 33B:
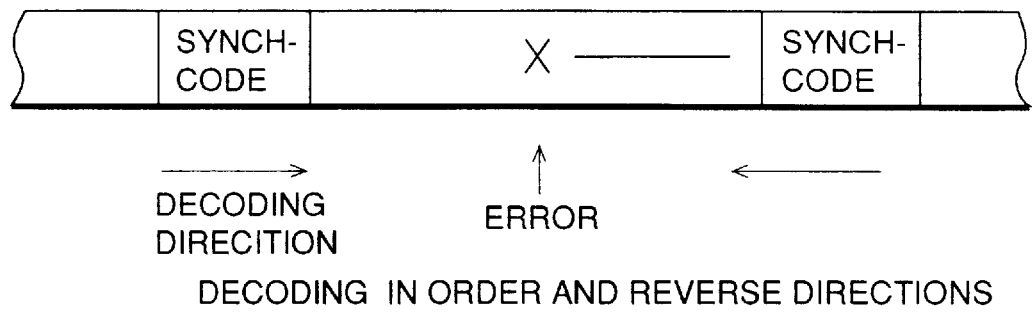

FIG. 32 shows an example of applications of a moving picture coding and/or decoding system according to the present invention. As shown in FIG. 32, the moving picture is transmitted and received by means of terminals 50 such as a laptop computer 51 and a desktop computer 52, through base stations 41, 42 and 43 of the radio communication network 40.

As mentioned above, according to the present invention, there is provided a moving picture coding and/or decoding system which can decrease the deterioration of quality of a decoded image due to errors of a code occurring in the transmitting and storing.

In addition, the coding data in the coding of a moving picture is divided into a plurality of groups of coding data. At least one of the groups of coding data is described in the forward direction, and the other groups of coding data are described in the backward direction, so that it is possible to improve the decoding efficiency of moving picture data and to prevent the quality of the decoded image from greatly deteriorating.

Moreover, when two independent code strings are outputted from an input image by coding a moving picture, the respective regions obtained by dividing the input image are coded in different orders. Therefore, even if the decoding has been impossible due to errors occurring in the middle of each of the data of both of the code strings, the portion which can be decoded is not concentrated on a part of a screen, so that it is possible to preferentially reproduce the whole screen or an important portion of the screen.

Referring to FIGS. 36 through 73, the preferred embodiments of a variable-length coding and/or decoding system, according to the present invention, will be described below.

Figure 36:
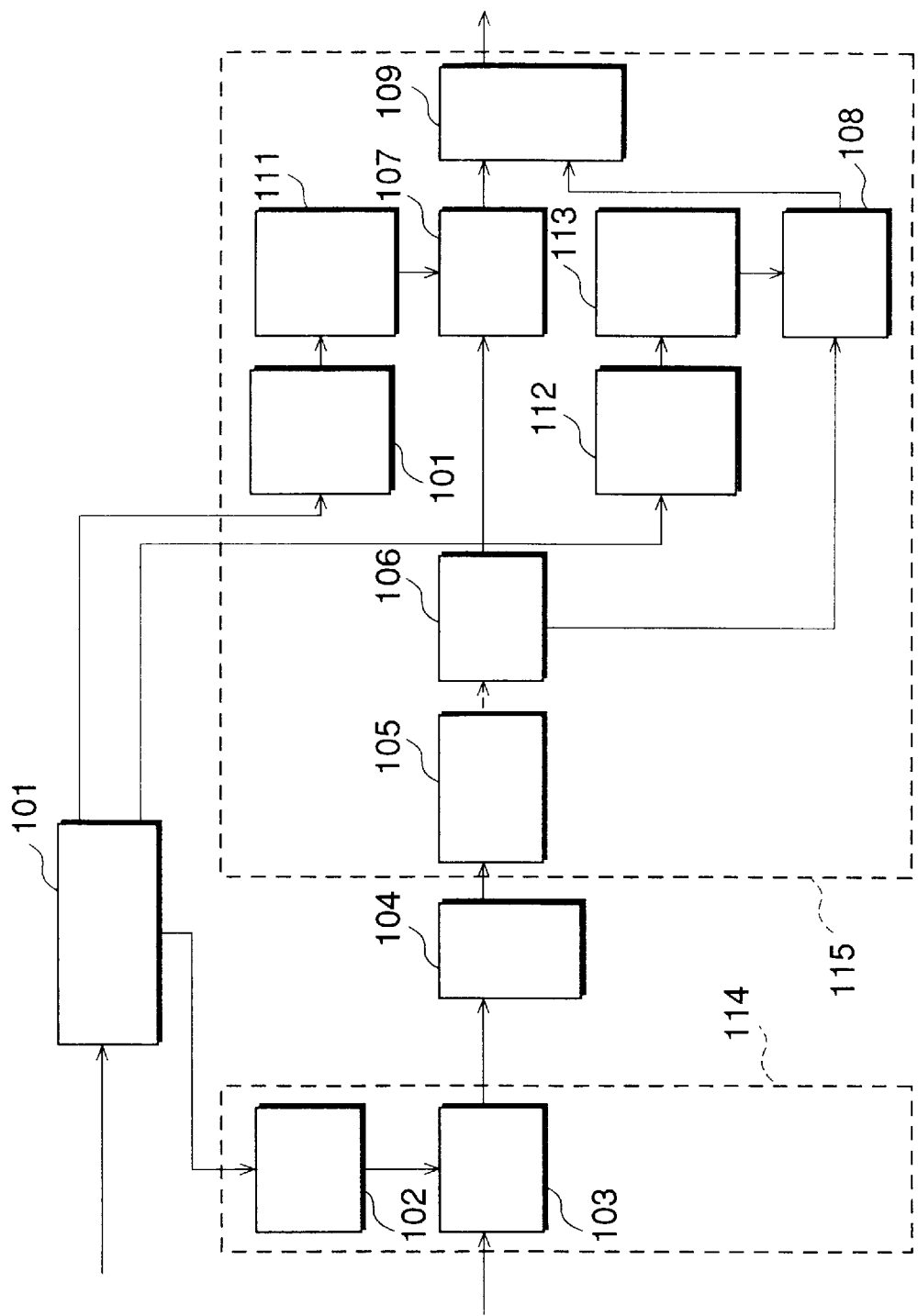
FIG. 36 is a block diagram of the first preferred embodiment of a variable-length coding and/or decoding system.

FIG. 36 is a block diagram of the first preferred embodiment of a variable-length coding and/or decoding system according to the present invention. The variable-length coding and/or decoding system in this preferred embodiment comprises a code-word table preparing section 101, a coding section 114, a transmitting or storing system 104 and a decoding section 115. First, the function of each of these sections will be briefly described below.

The code-word table preparing section 101 prepares code-word tables on the basis of the probabilities of source symbols, to transmit the prepared code-word tables to a coding table 102 in the coding section 114, and a forward code-word table 110 and a backward code-word table 122 in the decoding section 115. The coding section 114 encodes the source symbol into a variable-length code, to output the encoded variable-length code to the transmitting or storing system 104 as coding data. The decoding section 115 decodes the coding data inputted through the transmitting or storing 104, to reproduce the original source symbol.

The detailed construction and operation of each of the sections in this preferred embodiment, will be described below.

In the coding section 114, the inputted source symbol is inputted to an encoder 103. On the other hand, the code-word table 102 stores source symbols which have been prepared by the code-word table preparing section 101, and code words of variable-length codes corresponding to the source symbols. The encoder 103 selects a code word corresponding to the inputted source symbol from the code words stored in the code-word table 102, and outputs the selected code word as coding data. The coding data are transmitted to the decoder 115 through the transmitting or storing system 104. At this time, a synchronizing code is inserted into the coding data at regular intervals.

In the decoding section 115, a synchronizing code detecting section 105 detects a synchronizing code on the basis of the coding data inputted by the transmitting or storing system 104, and a buffer 106 stores the coding data between adjacent synchronizing codes. In a forward decoder 107, the coding data stored in the buffer 106 is decoded in sequence starting from the head of the coding data, on the basis of a forward decoding tree supplied from a forward decoding tree preparing section 111. In a backward decoder 108, the decoding data stored in the buffer 106 are decoded in sequence starting from the end of the coding data, on the basis of a backward decoding tree supplied from a backward decoding tree preparing section 113.

A decoded-value deciding section 109 decides a decoded value on the basis of a decoded result obtained by the forward decoder 107 (which will be hereinafter referred to as "a forward decoded-result") and a decoded result obtained by the backward decoder 108 (which will be hereinafter referred to as "a backward decoded-result"), and outputs a final decoded result. That is, since a bit pattern which does not appear in the decoding tree occurs if an error occurs in the decoding data, the existance of the error can be detected, so that the decoded-value deciding section 109 decides a decoded value on the basis of the forward decoded-result and the backward decoded-result as shown in FIGS. 37A–37D shows a method for deciding decoded values between the adjacent synchronizing codes.

Figure 37A:
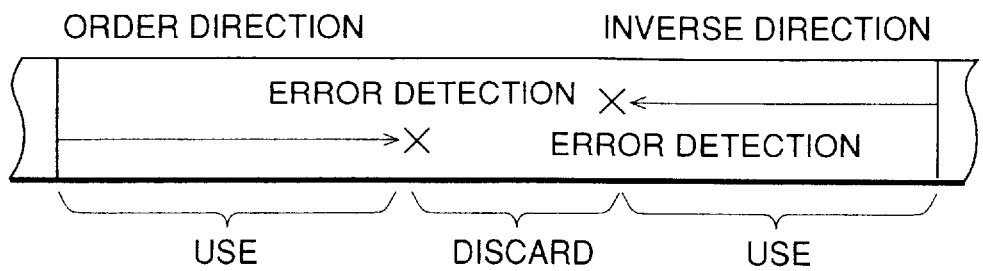
FIGS. 37A–37D are views explaining the operation of the decoded-value deciding section of FIG. 36.

First, as shown in FIG. 37A, when the position of a code word, at which an error is detected (the error detected position), in the decoded result in the forward direction does not meet the error detected position in the decoded result in the backward direction, only the decoded results wherein no error is detected are used as decoded values, and the decoded results at two error detected positions are not used as decoded values and are discarded.

Figure 37B:
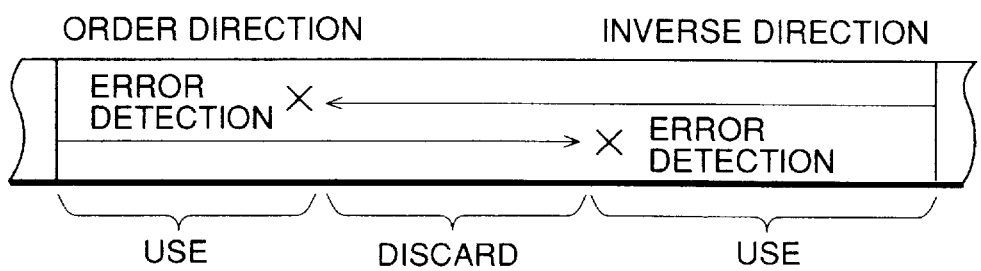

In addition, as shown in FIG. 37B, when the error detected positions in the decoded results in the forward and backward directions have passed each other, the decoded results wherein no error is detected are used as decoded values. In this case, the decoded results between the code words at the two error detected positions are not used as decoded values and are discarded.

Figure 37C:
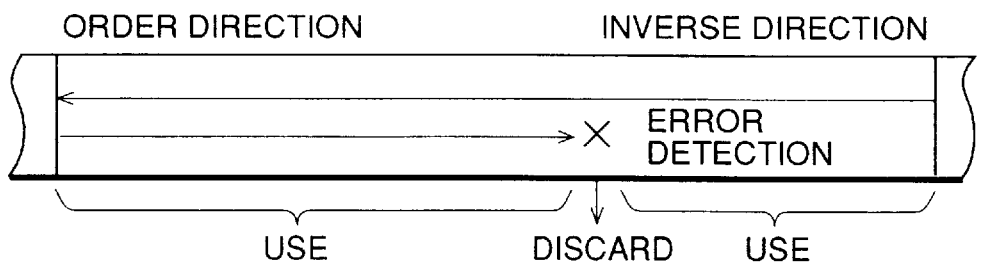

In addition, as shown in FIG. 37C, when an error has been detected in only one of the decoded results in the forward and backward directions (in this case, an error has been detected only in the decoded result in the forward direction), the decoded value with respect to the code word at the error detected position is discarded, and the decoded results in the backward direction are used as decoded values with respect to the subsequent code words.

Figure 37D:
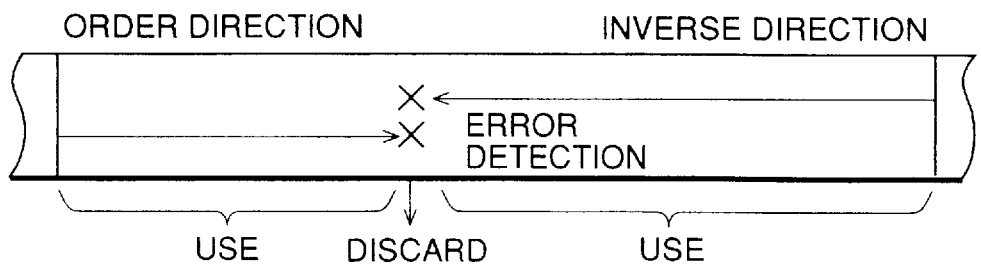

Moreover, as shown in FIG. 37D, when errors are detected with respect to the same code word in the decoded results in either of the forward and backward directions, the decoded value with respect to the code word at the error detected position is discarded, and the decoded results in the backward direction are used as decoded values with respect to the subsequent code words similar to FIG. 37C.

The code-word table preparing section 101 prepares a code-word table which can be decoded in either of the forward and backward directions on the basis of the probability of a source symbol. The code-word table prepared by the code-word table preparing section 101 is transmitted to the code-word table 102 in the coding section 114 and to a forward code-word table 110 and a backward code-word table 112 in the decoding section 115. In the forward decoding tree preparing section 111, a forward decoding tree is prepared on the basis of the forward code-word table 110. In addition, in the backward decoding tree preparing section 113, a backward decoding tree is prepared on the basis of the backward code-word table 112.

FIG. 38 is a block diagram of the code-word table preparing section 101. A code selecting section 21 inputs the data of the probability of the source symbol, and selects a code system having the minimum average code-length, from selectable code systems on the basis of the data of the probability of the source symbol, to transmit the selected result to a code-word configuring section 22. The code-word configuring section 22 configures code words of the code selected by the code-word selecting section 21. The code-word table prepared by the code-word configuring section 22 is transmitted to the code-word table 102 in the coding section 114 and to the forward code-word table 110 in the decoding section 115. To the backward code-word table 112 in the decoding section 115, the code-word table described in the reverse direction of the forward direction is transmitted.

In the code selecting section 21, the inputted source symbols are rearranged in order of probability so that S=|S1, S2, . . . , Sn|, and on the basis of the probabilities P of these source symbols S, a code c satisfying the following formula is selected from a set of configurable codes C.

$$\min_c \left\{ \sum_{i=1}^{n} p_i L_i \right\}$$

wherein Li is a code length which can be calculated by a weight of a code word given by the code-word configuring section 22. In this case, the weight of a code-word is the number of "1" or "0" in the code-word.

A method for configuring a code-word in the code-word configuring section 22 will be described below.

FIGS. 39A–39B show an example of a method for configuring a binary code system wherein the weights for variable-length codes are constant. As shown in FIG. 39A, a lattice-like directed graph from the starting point to the end point is formed. In this directed graph, in a case where the course is followed from the starting point to the end point, "1" corresponds to the binary code when the left course is selected, and "0" corresponds to the binary code when the right course is selected, so that a binary code system is formed as shown in FIG. 39B. In this example, the configured binary code system has a code-length of 5 bits and a weight (the number of "1") of 2. In general, the number of the binary code systems having a code-length of n bits and a weight of w is the same as the number of combinations formed by selecting w from n. In this case, there are 10 binary code systems due to the number of combinations formed by selecting 2 from 5.

Figure 40:
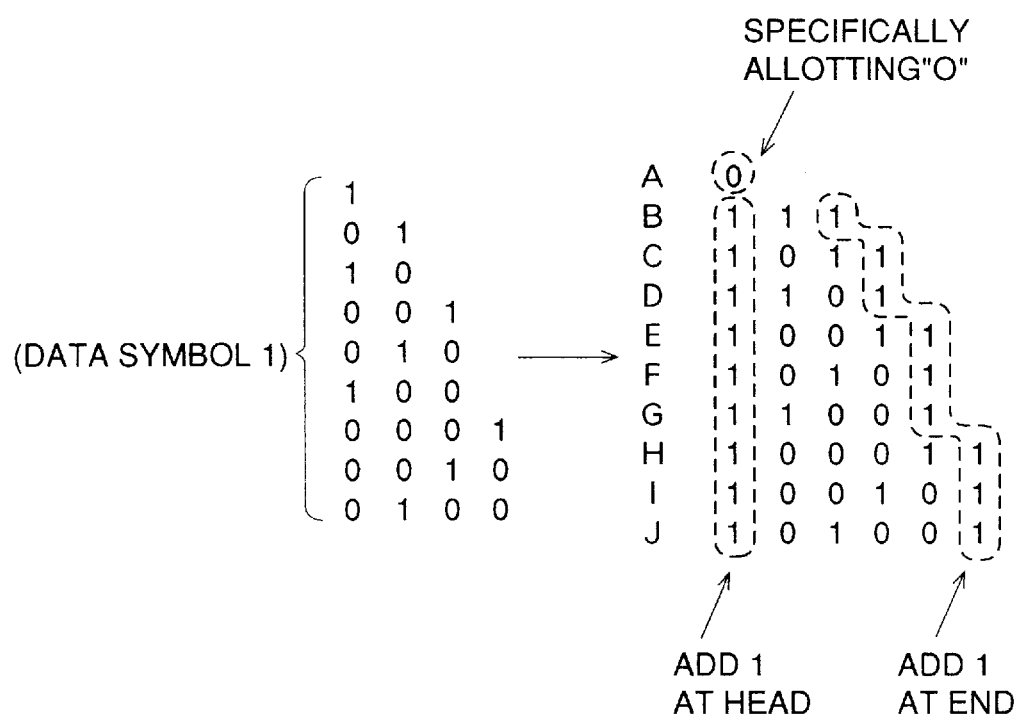
FIG. 40 is a view showing a first code-word configuring method in the code-word configuring section of FIG. 3B.

FIG. 40 shows a first method for configuring code words of a variable-length code which can be decoded in either of the forward and backward directions (which will be hereinafter referred to as a "reversible code") in the code-word configuring section 22. First, as shown on the left side of FIG. 40, a binary code system which is the source symbol −1 (in this case, 9) and wherein the weight (the number of "1") is constant (in this case, 1), is configured in order of a shorter code-length by the method of FIG. 39. Then, as shown in FIG. 40, "1" is added to the head and end of each of the binary code systems, and "0" is assigned to the shortest code, so that the code words of the reversible code are configured. This reversible code always starts from the code "0" with respect to the source symbol A and from the code "1" with respect to the other source symbols B through J, so as to be a code configuration wherein the code is finished when three "1" appear, i.e. the pause between codes (the code-length) can be detected.

Figure 41A:
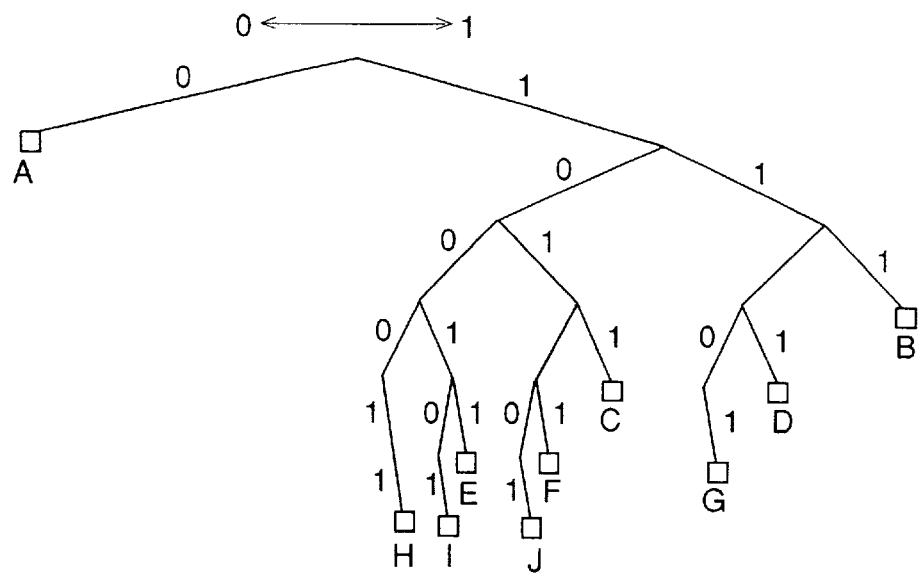
FIGS. 41A and 41B are views showing decoding trees in the forward and backward directions, which are prepared from code words configured by the first code-word configuring method.
Figure 41B:
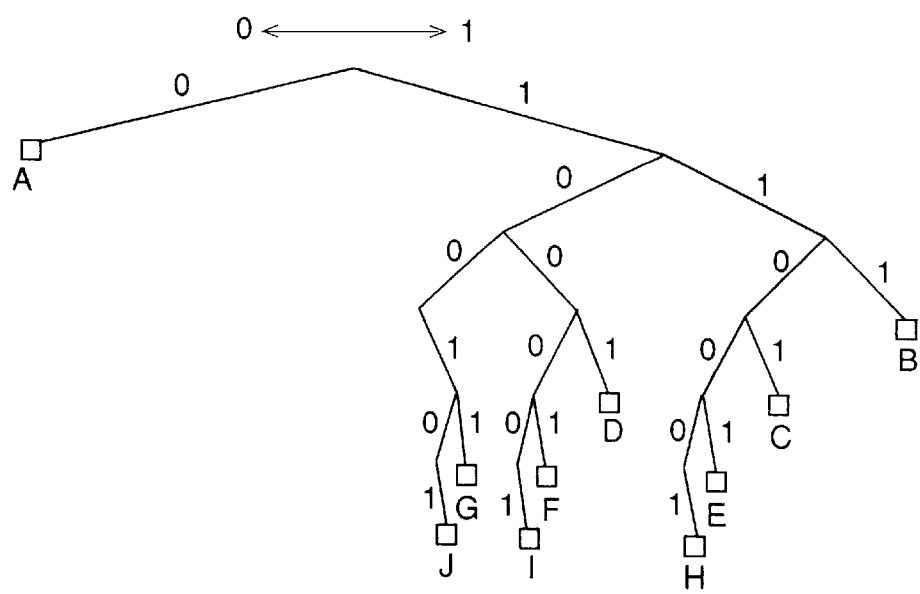

The necessary and sufficient conditions that the variable-length code is a reversible code, i.e. the code can be decoded in either of the forward and backward directions, are that all the code words are assigned to the branches of the decoding tree in the forward direction and to the leaves of the decoding tree in the backward direction. The leaves of the decoding tree means the end of the decoding tree, i.e. a place wherein there is nothing ahead thereof. For example, in the variable-length code of FIG. 40, the code words corresponding to all the source symbols A through J are assigned to the leaves of the decoding tree in the forward direction as shown in FIG. 41A as well as the leaves of the decoding tree in the backward direction as shown in FIG. 41B. Therefore, it can be decoded in either of the forward and backward directions.

The parameters in the method for configuring code words of a variable-length code of FIG. 40, can correspond to various probabilities of source symbols by selecting, as the weight, the number of "1" in the code words and a natural number w not less than 2. Of course, the same result can be obtained by reversing the bits to consider the number of "0" as the weight.

Figure 42:
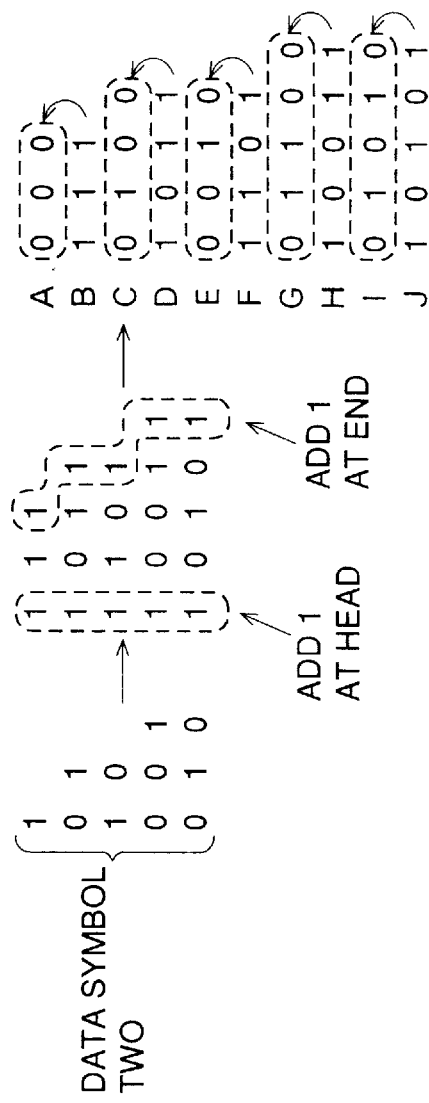
FIG. 42 is a view showing a second code-word configuring method in the code-word configuring section of FIG. 38.

FIG. 42 shows a second method for configuring code words of a reversible code in the code-word configuring section 22. First, as shown on the left side of FIG. 42, a binary code system which is of source symbol/2 and wherein the weight (the number of "1") is constant (in this case, 1), is configured in order of a shorter code-length by the method of FIG. 39. Then, as shown in the middle of FIG. 42, "1" is added to the head and end of each of the binary code systems, and as shown on the right side of FIG. 42, the code words obtained by reversing the bits of the code words are added to the binary code systems.

In this variable-length code, the code-length can be found by counting the number of symbols at the begining of each of the codes. In the example of FIG. 42, when four symbols at the begining of each of the codes appear, the code is finished, i.e. the pause between codes (code-length) can be detected.

Figure 43A:
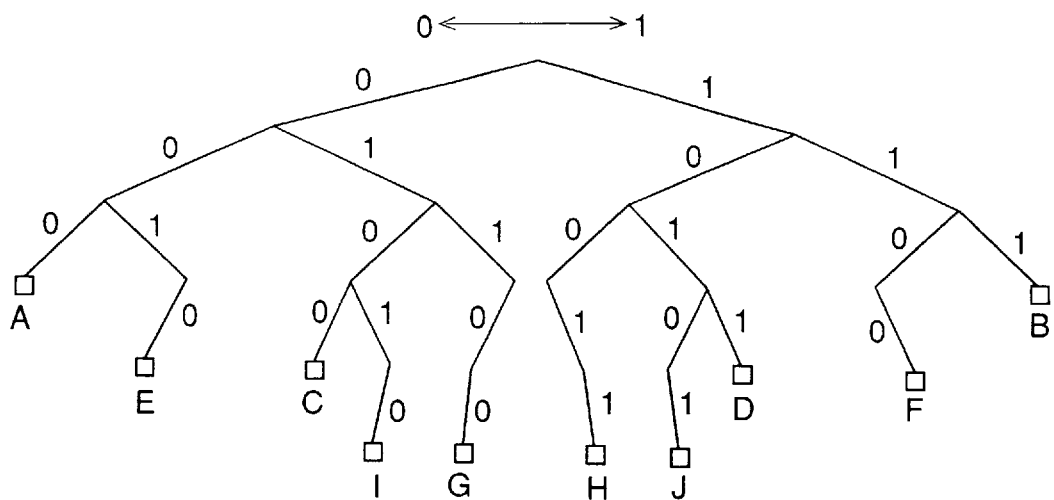
FIGS. 43A and 43B are views showing decoding trees in the forward and backward directions, which are prepared from code words configured by the second code-word configuring method.
Figure 43B:
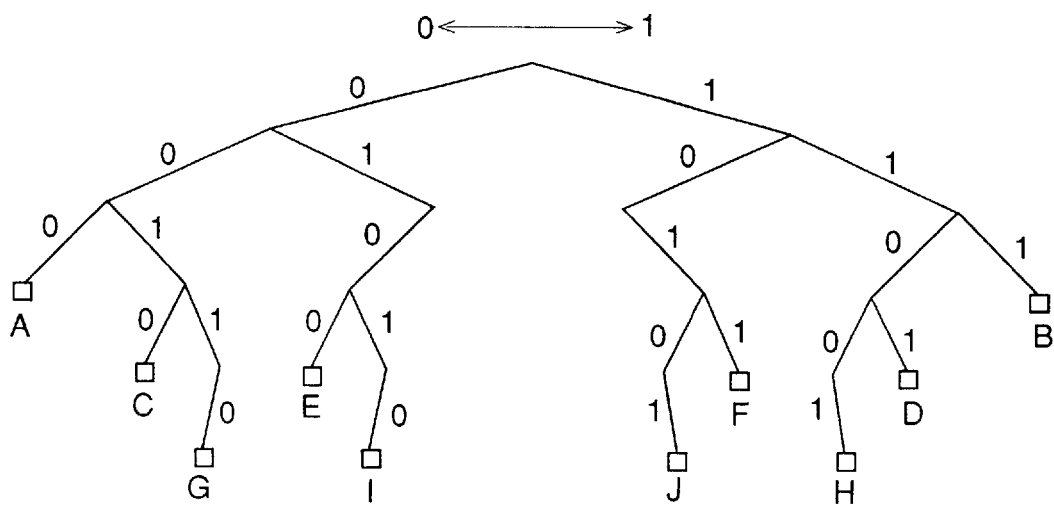

In the variable-length code of FIG. 42, the code words corresponding to all the source symbols A through J are assigned to the branches of the decoding tree in the forward direction as shown in FIG. 43A as well as the branches of the decoding tree in the backward direction as shown in FIG. 43B. Therefore, it can be decoded in either of the forward and backward directions.

Figures 44A, 44B:
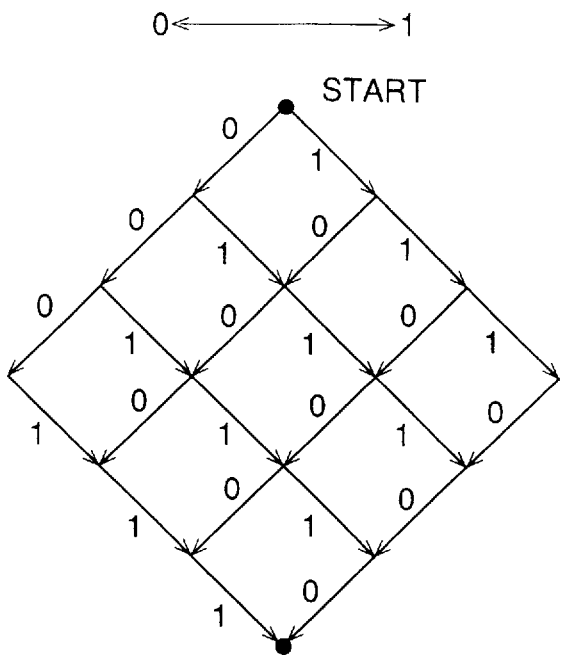
FIGS. 44A and 44B are views showing a third code-word configuring method in the code-word configuring section of FIG. 38.

FIG. 44 shows a third method for configuring code words of a reversible code in the code-word configuring section 22. In this reversible code, the code-length of code words can be found when the number of "0" is the same as that of "1". That is, a lattice-like directed graph as shown in FIG. 44A is considered. In this directed graph, when the left course starting from the starting point is selected, "0" corresponds to the binary code, and when the right course is selected, "1" corresponds thereto, so that code words are formed by the course which reaches the points on the diagonal line passing through the starting point.

Figure 45A:
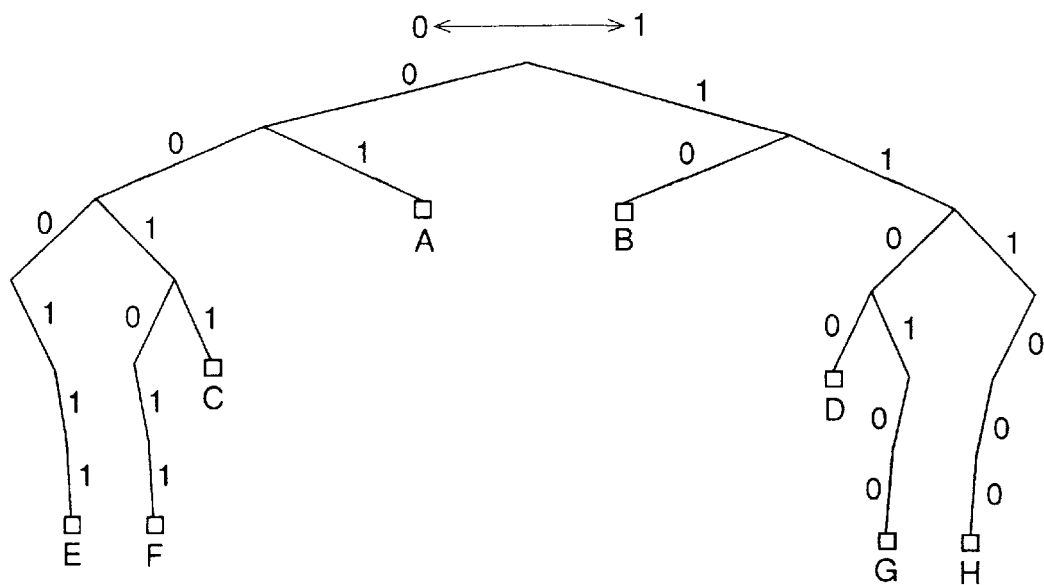
FIGS. 45A and 45B are views showing decoding trees in the forward and backward directions, which are prepared from code words configured by the third code-word configuring method.
Figure 45B:
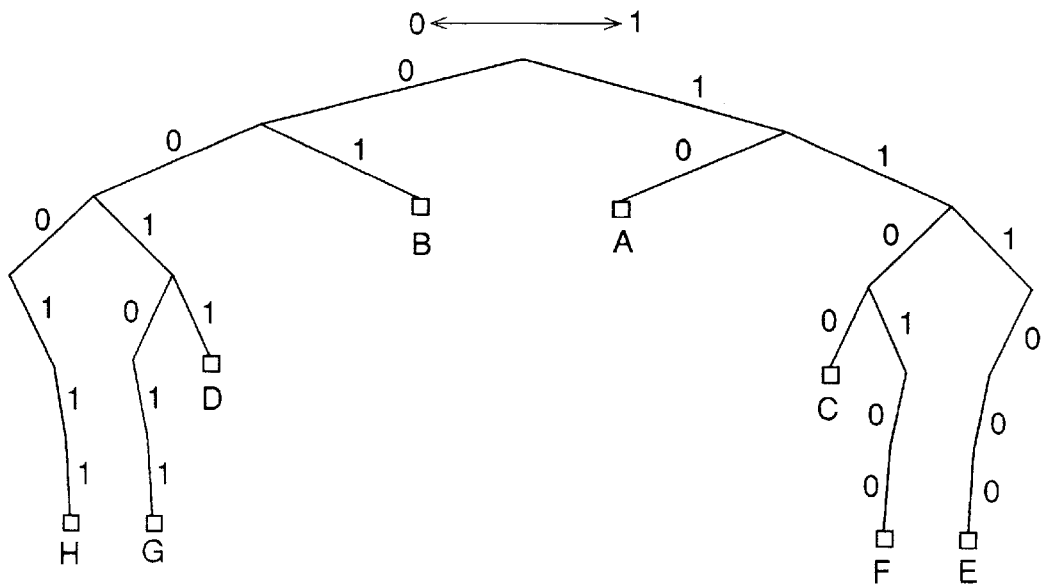

In this case, the code words corresponding to all the source symbols A through J are assigned to the branches of the decoding tree in the forward direction as shown in FIG. 45A as well as the branches of the decoding tree in the backward direction as shown in FIG. 45B, so that it can be seen that it can be decoded in either of the forward and backward directions.

A method for shortening a reversible code according to the present invention will be described below.

Since the number of source symbols, i.e. the number of codes of a variable-length code, is finite, it is possible to shorten a part of code of a variable-code. The term "shortening" means that the code-length of a part of code is shortened without increasing the code-length of other codes. FIG. 46 shows an example of a method for shortening a reversible code.

For example, in the reversible code as shown in FIG. 42, if 1 bit at the end of the code words corresponding to the source symbols G, H, I and J is removed, it is possible to decode the reversible code in either of the forward and backward directions. By utilizing this, the code-length of four code words corresponding to the source symbols G, H, I and J is shortened in FIG. 46.

Figure 47A:
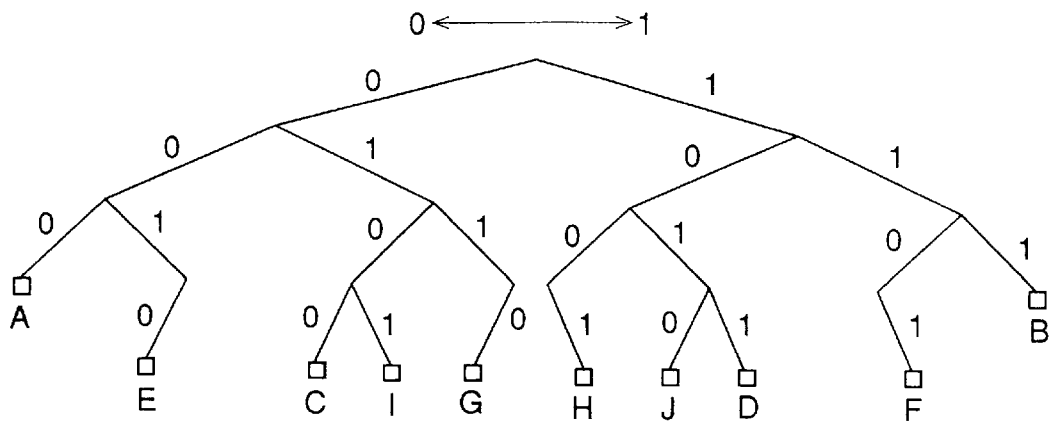
FIGS. 47A and 47B are views showing decoding trees in the forward and backward directions, which are prepared by code words shortened by the code shortening method.
Figure 47B:
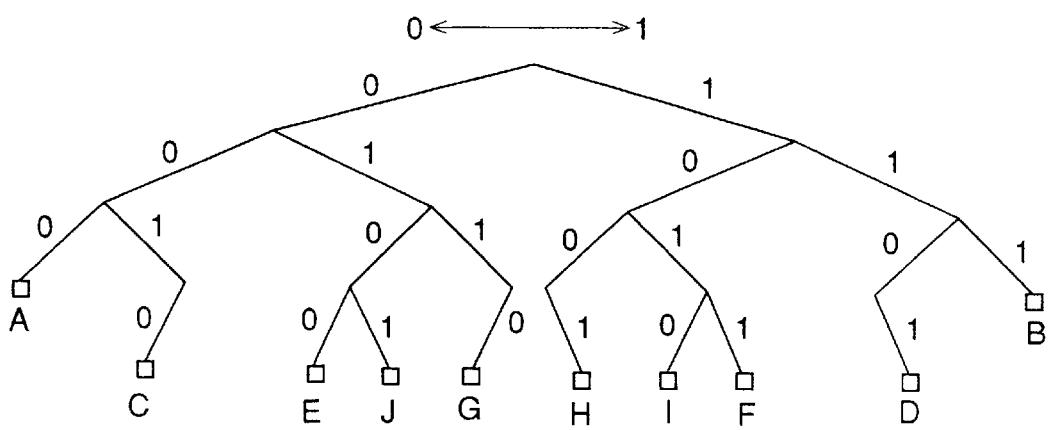

In the variable-length code as shown in FIG. 46, the code words corresponding to all the source symbols A through J are assigned to the leaves of the decoding tree in the forward direction as shown in FIG. 47A as well as the leaves of the decoding tree in the backward direction as shown in FIG. 47B. Therefore, it can be decoded in either of the forward and backward directions.

Figure 48:
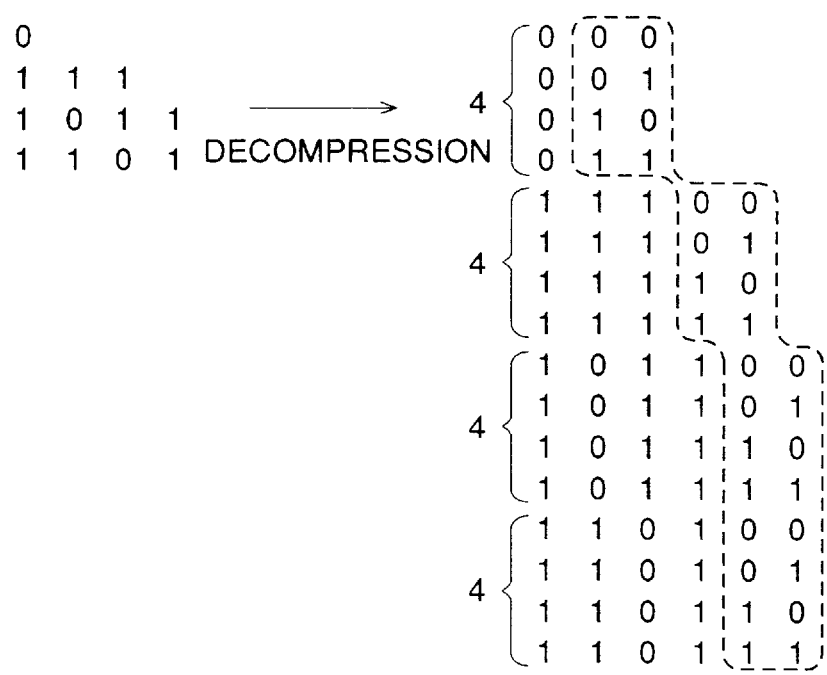
FIG. 48 is a view showing a code expanding method in the code-word configuring section of FIG. 38.

Referring to FIG. 48, a method for extending a reversible code according to the present invention will be described below.

The extension of a reversible code can be actualized by adding a fixed-length code to at least one of the head and end of each code to increase the number of code words of the same code-length. In an example of FIG. 48, a fixed-length code of 2 bits is added to the end of each of the reversible codes as shown on the left. In this case, although the code-length of each of the reversible codes is entirely increased by 2 bits, the number of code words of the same code-length is increased by four times. In general, when a fixed-length code of n bits is added, although the code-length is entirely increased by n bits, the number of the code words of the same code-length can be increased by 2n times.

Since the fixed-length code is clearly a reversible code, if a fixed-length code is added to the head or the end of the reversible code, it remains a reversible code.

FIG. 49 shows the comparison between a reversible code obtained by the variable-length coding of source symbols, which are alphabets in English, according to the present invention, and a reversible code disclosed in Japanese Patent Laid-Open No. 5-300027. The reversible code according to the present invention as shown in FIG. 49 is a code which extended by adding a fixed-length code of 2 bits to the end of a code when the weight of the code word is 0 in the method as shown in FIG. 40.

Although the reversible code according to the present invention is inferior to the Huffman's code which is the optimum code for a variable-length code which can be decoded only in the forward direction, its average code-length is shorter than the reversible code disclosed in the aforementioned Japanese Patent Laid-Open, and it has superior performance. The known reversible code is a code wherein bits are added to the end of the Huffman's code which is a variable-length code decodable only in the forward direction. On the other hand, according to the present invention, additional bits are not added, and a reversible code is originally configured, so that the number of added bit patterns is small.

The second preferred embodiment of a variable-length coding and/or decoding system, according to the present invention, will be described below.

Figure 50:
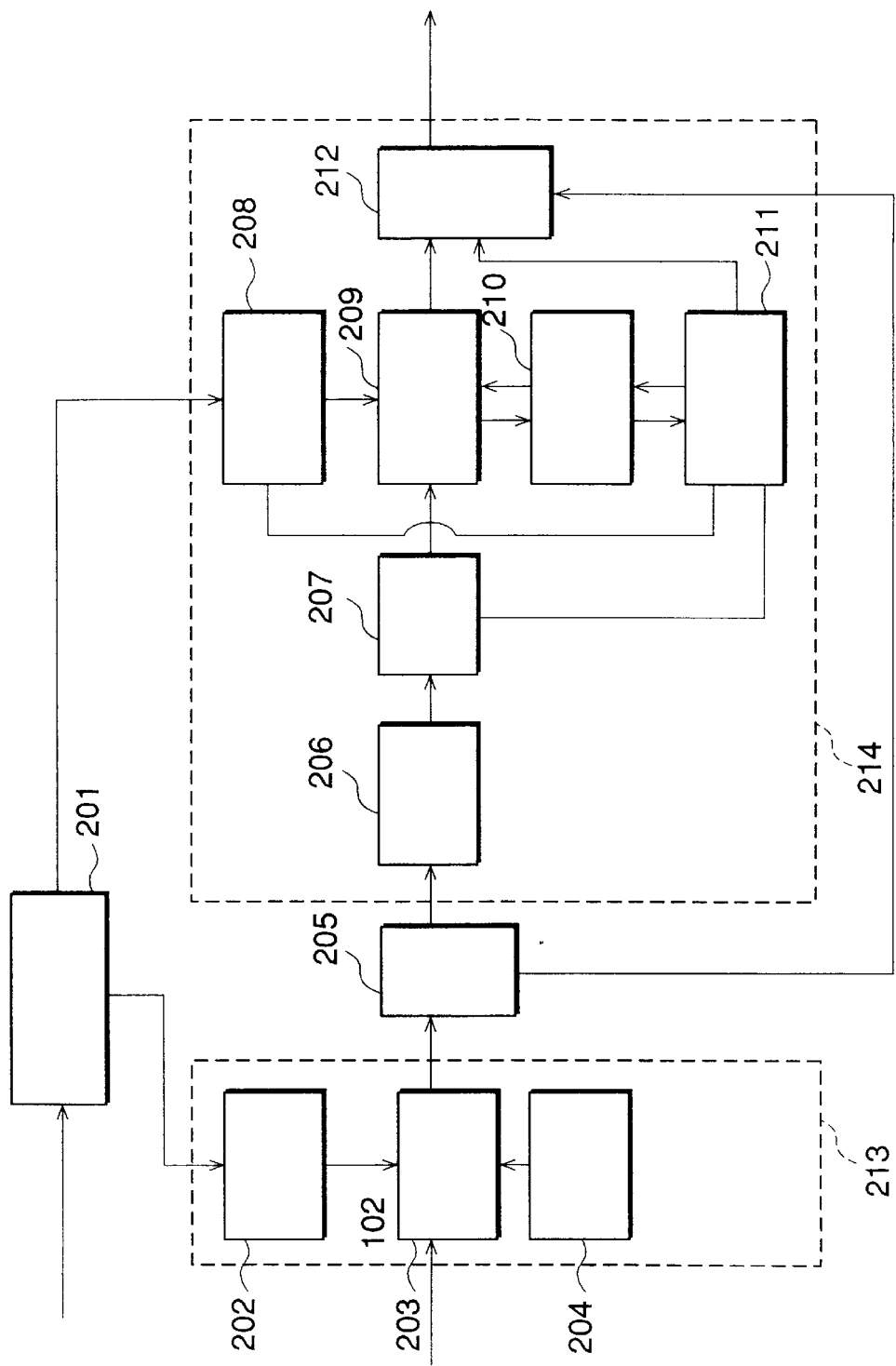
FIG. 50 is a block diagram of the second preferred embodiment of a variable-length coding and/or decoding system, according to the present invention.

FIG. 50 is a block diagram of the second preferred embodiment of a variable-length coding and/or decoding system according to the present invention. The variable-length coding and/or decoding system in this preferred embodiment generally comprises a code-word table preparing section 201, a coding section 213, a transmitting or storing system 205 and a decoding section 214.

The function of each of these sections will be briefly described. The code-word table preparing section 201 prepares a code-word table on the basis of the probability of a source symbol, to transmit it to a coding table 202 in the coding section 213, and to transmit the parameters of code-words of the prepared code-word table to a decoding-graph and decoded-value table preparing section 208 in the decoding section 214. The coding section 213 encodes the source symbol to a variable-length code, to output the variable-length code to the transmitting or storing system 205 as coding data. The decoding section 214 decodes the coding data inputted through the transmitting or storing 205, to reproduce the original source symbol.

The detailed construction and operation of each of the sections in this preferred embodiment, will be described below.

In the coding section 213, the inputted source symbol is inputted to an encoder 203. On the other hand, the code-word table 202 stores the source symbols which have been prepared by the code-word table preparing section 201, and the code words of variable-length codes which correspond to the source symbols. However, the code-word table 202 does not all the code-words corresponding to all the source symbols which can be inputted, and it stores only the code-words corresponding to a part of the source symbols which have a relatively high frequency of appearance. The encoder 203 selects a code-word corresponding to the inputted source symbol from the code-words stored in the code-word table 202, and outputs it as coding data.

When a source symbol wherein there is no code-word corresponding to the code-word table 202, i.e. a source symbol of a relatively low frequency of appearance, is inputted to the coding section 213, a fixed-length code corresponding to the source symbol is prepared by a fixed-length code coding section 204, and an escape code in the code-word table 202 is added to the prefix and suffix of the fixed-length code to configure code words which are outputted as coding data.

The coding data thus outputted from the encoder 203 in the coding section 213 are transmitted to the decoder 214 through the transmitting or storing system 205. At this time, a synchronizing code is inserted into the coding data at a predetermined period.

The decoding section 214 comprises a synchronizing code detecting section 206, a buffer 207, the decoding-graph and decoding-value table preparing section 208, a forward decoder 209, a fixed-length decoding section 210, a backward decoder 211 and a decoded-value deciding section 212. First, the synchronizing code detecting section 206 detects a synchronizing code on the basis of the coding data inputted by the transmitting and storing system 205, and the buffer 207 stores the coding data between the adjacent synchronizing codes. In the forward decoder 209, the coding data stored in the buffer 207 are decoded in sequence starting from the prefix of the coding data. In the backward decoder 211, the decoding data stored in the buffer 207 are decoded in sequence starting from the suffix of the coding data. The decoded-value deciding section 212 decides a decoded value on the basis of a decoded result obtained by the forward decoder 209 (which will be hereinafter referred to as "a forward decoded-value") and a decoded result obtained by the backward decoder 211 (which will be hereinafter referred to as "a backward decoded-value"), and output a final decoded result.

Figures 51A, 51B:
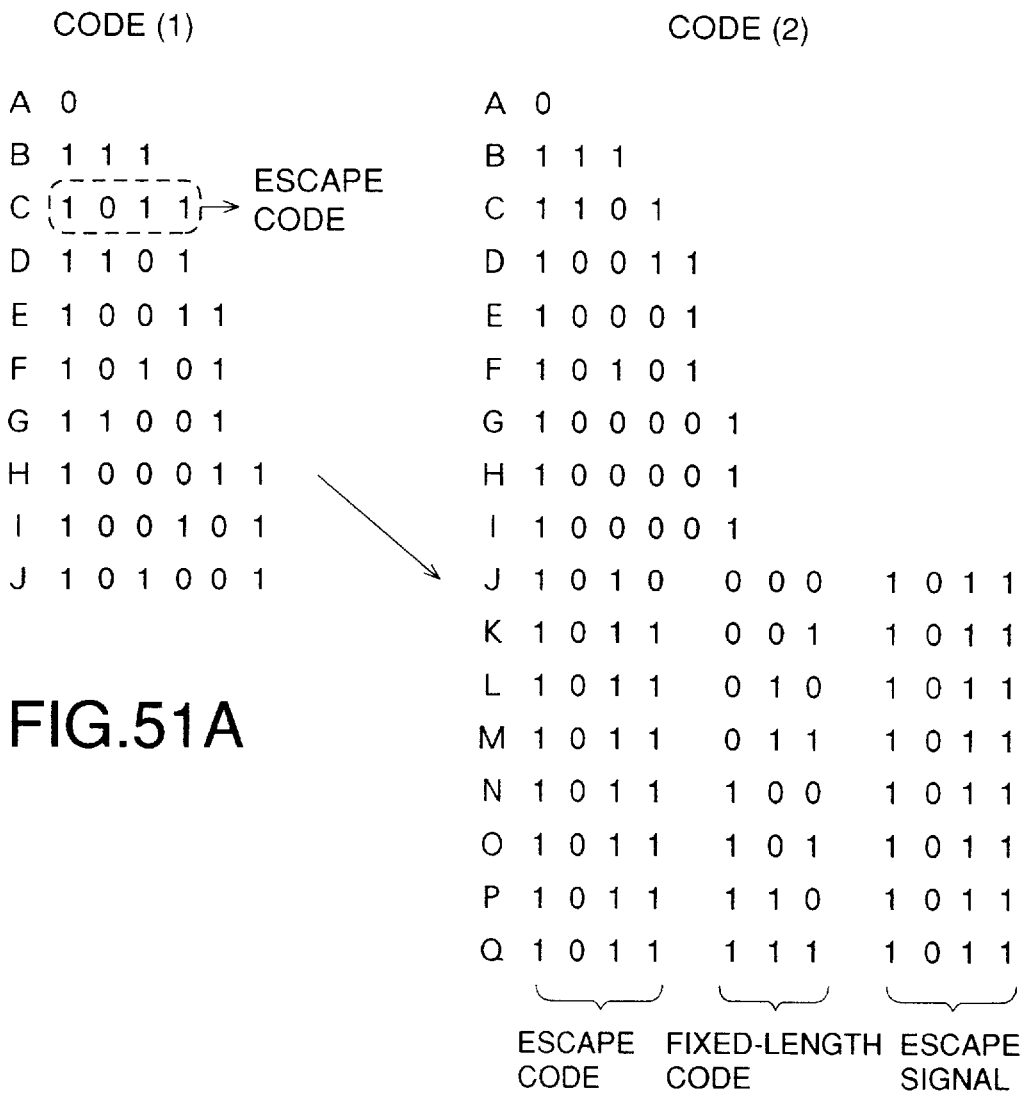
FIGS. 51A and 51B are views showing a code-word configuring method in the code-word configuring section of FIG. 50.

FIG. 51 shows a method for adding escape codes to the head and end of fixed-length codes to configure code words in the code-word table preparing section 201. As shown in FIG. 51A, the code word prepared by the code-word table preparing section 201 is basically a reversible code wherein a pause of code can be detected by the appearance of three "1", except for the source symbol "A". This reversible code will be hereinafter referred to as a "code (1)".

On the other hand, a code (2) as shown in FIG. 51B, is configured by adding to the code (1), a code word configured by adding to the head and end of a fixed-length code of 3 bits, the code word "1011" corresponding to the source symbol "C" of the code (1) as an escape code for representing the head and end of the fixed-length code. However, the portions of the reversible code of the code (2) corresponding to the code (1) does not use the code word "1011" used as the escape code in the code (2), and use only the code words corresponding to the source symbols A through I, the number of which is smaller than that of the code (1) by 1. As can be clearly seen from the comparison between FIGS. 51A and 51B, the number of the source symbols which can be coded is increased from "10" of the code (1) to "17" of the code (2).

In order to decode such a code (2), as can be seen from FIGS. 51A and 51B, the code (1) is always decoded one time when the code (2) is decoded in either of the forward and backward directions, and the fixed-length code can be decoded in either of the forward and backward directions. Therefore, if the code (1) can be decoded in either of the forward and backward directions, the code (2) can be decoded in either of the forward and backward directions.

In the case of conventional reversible codes, it is necessary to prepare all the code words corresponding to the source symbols which can be inputted, as code-word tables in the encoder 213 and the decoder 214. On the other hand, in the code (2), the fixed-length code portion thereof can be separately prepared as binary codes of 3 bits in the fixed-length code coding section 204 and the fixed-length code decoding section 210, so that the code-word table 202 stores only the code words of the code (1). Therefore, it is possible to greatly decrease the memory capacity of the variable-length coding and/or decoding system in comparison with the conventional reversible codes.

The decoding-graph and decoded-value table preparing section 208 prepares a decoding graph based on the Shalkwijk's algorithm, and a decoded-value table. The forward decoder 209 and the backward decoder 211 decode codes on the basis of the decoding graph and the decoded-value table.

FIG. 52 shows a method for counting a binary code system of a constant weight. As an example of algorithm for counting a binary code system of a constant weight, the algorithm disclosed in "An algorithm for source coding" (J. P. M. Shalkwijk; IEEE Trans. Inform Theory, vol. IT-18, No. 3, pp. 395–399, May 1972) is well known as Shalkwijk's algorithm. In the Shalkwijk algorithm, a lattice-like directed graph extending from the starting point to the end point is formed on the basis of "Pascal's triangle" as shown in FIG. 52A. The value expressed by a numeral of a joint is equal to the total value of values of joints at the starting points of the arrows entering the aforementioned joint, assuming that the value at the starting point is 1. That is, the values of the respective joints are determined by the Pascal's triangle.

In a case where the course is followed from the starting point to the end point in accordance with the inputted source symbols in the directed graph of FIG. 52A, a binary code system having a weight of 2 can be formed by causing "0" of the code word to correspond to the binary code when the left course (arrow) is selected, and "1" of the code word to correspond to the binary code when the right course (arrow) is selected. The total of the values obtained by subtracting the value at the joint of the starting point of an arrow from the value at the joint of the end point of the arrow when "0" is selected, is the rank order value with respect to code words of the same code-length in the binary code system. For example, if the inputted source symbol is "01001", the rank order value is the total of the differences between the values at joints with respect to three "0", i.e. (1−1)+(3−2)+(4−3)=2. The rank order value means a value for determining the orders of different code words of the same code-length. FIG. 52B shows the relationship between the source symbol and the rank order value in this case.

The example of application of the Shalkwijk's algorithm to coding is well know. In this case, the coding is carried out by transforming the value corresponding to the aforementioned rank order value, to a binary code. On the other hand, according to this preferred embodiment of the present invention, this algorithm is used for the decoding as follows.

That is, in the decoding-graph and decoded-value table preparing section 208, a directed graph is prepared as a decoding graph on the basis of the aforementioned Shalkwijk's algorithm. That is, this decoding graph is a directed graph wherein the values determined by the Pascal's triangle are the values at joints, and arrows are expressed by "1" and "0". An example thereof is shown in FIG. 53A. FIG. 53B shows an example of a method for calculating a decoded value in the forward decoder 208 and the backward decoder 211 which use this decoding graph.

The code (1) as shown in FIG. 51A is a reversible code wherein a pause can be sought by a point wherein three "1" have appeared. In a case where a decoded value of the reversible code for this code (1) is calculated, with respect to the forward direction, 0 is applied to the decoded value if the prefix of the reversible code is "0", and "1" at the head and "1" at the end are removed if the prefix is not "0", and then, the rank order value is calculated on the basis of the Shalkwijk's algorithm. Now, since the number of code words of a shorter code-length than a code word to be decoded, is +1 which is the total of values of joints along the line inclined to the right from the end point in FIG. 53A, the decoded value is obtained by adding the rank order value to the total value.

On the other hand, with respect to the backward direction, similar to the forward direction, 0 is applied to the decoded value if the head of the reversible code is "0", and "1" at the head and "1" at the end are removed if the head is not "0". Then, after the residual portions are reversed, the rank order value is calculated on the basis of the Shalkwijk's algorithm. The decoded value is obtained by adding this rank order value to the total of values of joints along the line inclined to the right from the end point.

Referring to FIGS. 53A and 53B, the method for calculating a decoded value will be described in detail. For example, if the code word which is to be decoded, of a reversible code is "10101", "1" at the head and "1" at the end are removed to be "010". If the rank order value with respect to this "010" is derived on the basis of the Shalkwijk's algorithm, it is (1−1)+(3−2)=1 with respect to two "0"s. In this case, since the total of values of joints along the line inclined to the right from the end point is 1+2=3, the decoded value can be calculated to be 5 by adding the value +1(=4) to the rank order value (=1).

Figure 54A:
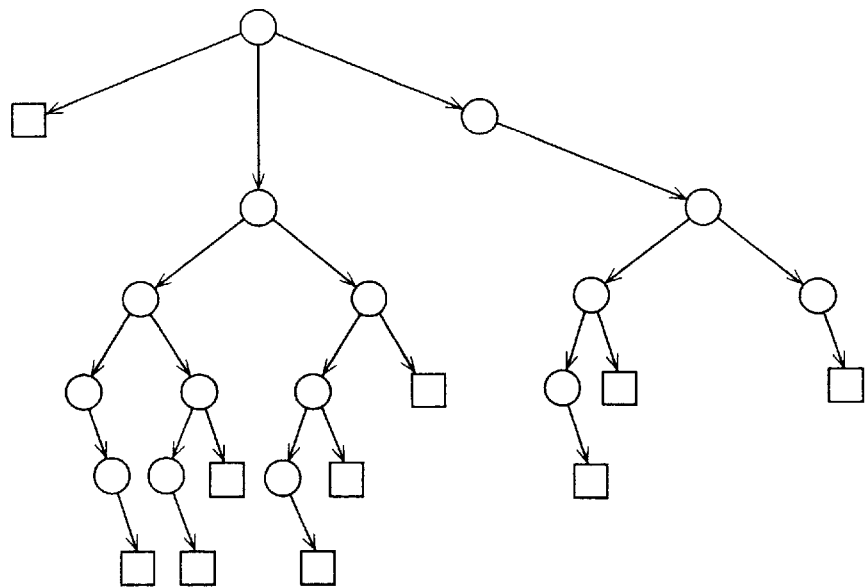
FIG. 54A and 54B are views showing the comparison between a conventional decoding tree and a decoding graph in this preferred embodiment.
Figure 54B:
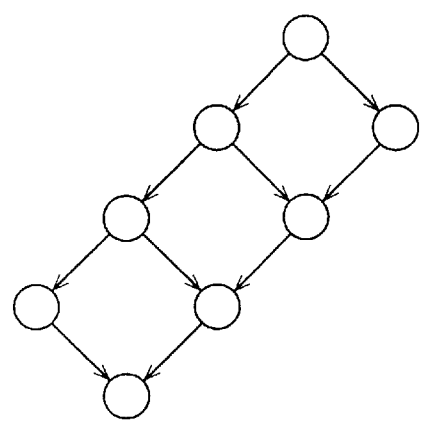

When the decoding is carried out by means of such a decoding graph, it is possible to greatly decrease the memory capacity. FIGS. 54A and 54B show the difference between the necessary memory capacities in the conventional coding method using a coding tree, and the coding method using a decoding graph according to this preferred embodiment. When the numbers of joints in both of the methods are compared, although the number of the arrows extending from each of the joints is two in either of the aforementioned methods, the number of the arrows entering each of the joints is different. That is, in the case of the decoding tree of FIG. 54A, the number of the arrows entering each of the joints is always 1. On the other hand, in the case of the decoding tree of FIG. 54A, two arrows enter each of the joints, so that the total number of the joints necessary for the same code word is decreased. In this example, although fifteen joints are necessary for the decoding tree of FIG. 54A, only eight joints are necessary for the decoding tree of FIG. 54B. Therefore, there is an advantage in that the memory capacity necessary for the decoding method using a decoding graph according to this preferred embodiment is less than that for the conventional decoding method using a decoding tree.

In order to decode the code (2), to which an escape code is added, as shown in FIG. 51B, there are prepared two decoded-value tables, i.e. the decoded-value table of codes (1) as shown in FIG. 55A and the decoded-value table of fixed-length codes as shown in FIG. 55B. When an escape code is decoded in the decoded-value table of codes (1), the decoded-value table of fixed-length codes is read. For example, in a case where the code word is "10110011011", if the "1011" at the prefix, i.e. the escape code, is decoded, the subsequent "001" of 3 bits is regarded as a fixed-length code and the decoding is carried out in the fixed-length code decoding section 210. In this case, since 1 is derived as the decoded value of "001", the source symbol "K" is derived as the decoded result on the basis of the decoded-value table of fixed-length codes of FIG. 55A.

The preferred embodiment of a variable-length coding and/or decoding system which is applied to a moving picture coding and/or decoding system, according to the present invention, will be described below.

Figure 56:
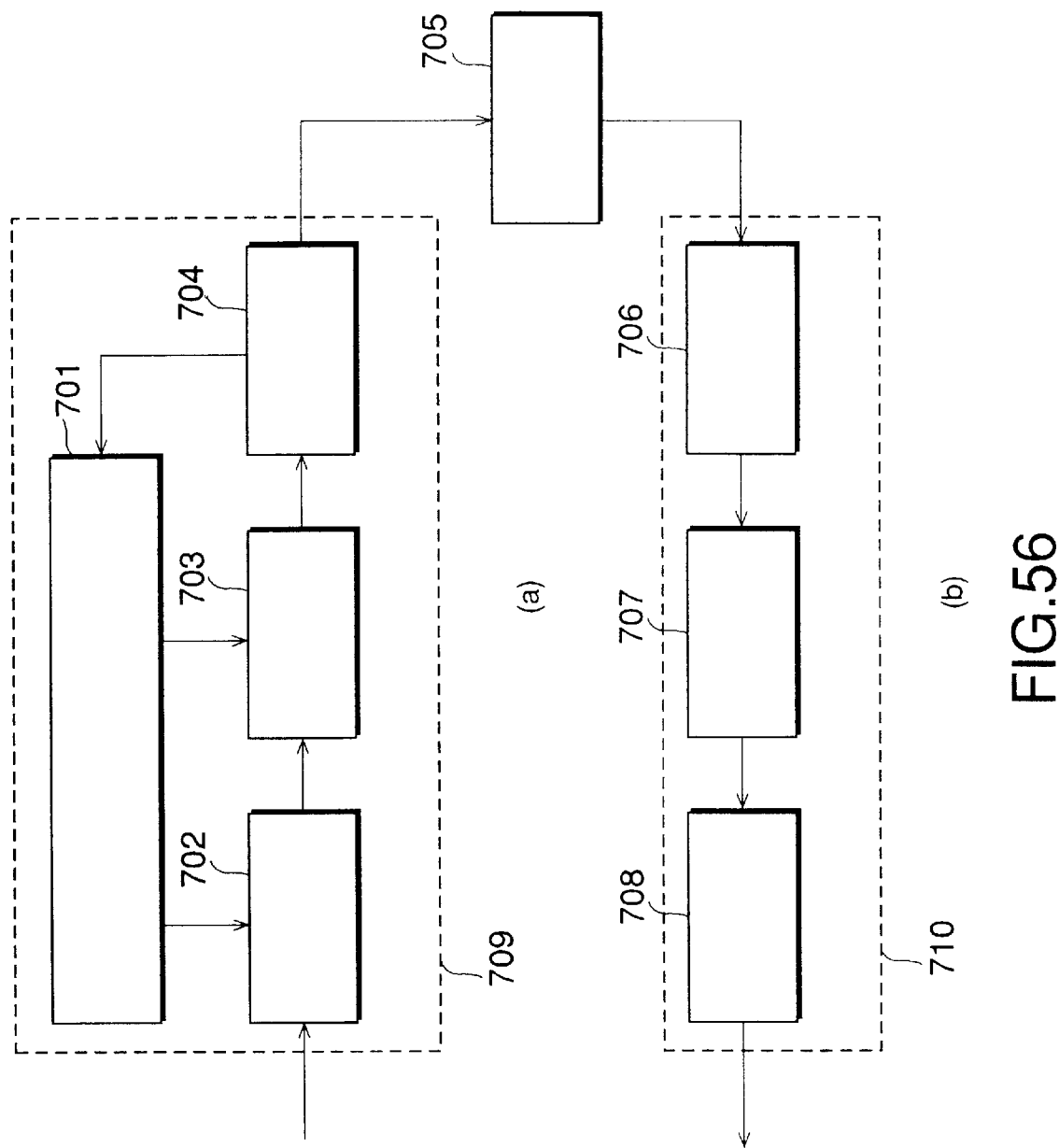
FIG. 56 is a block diagram showing a schematic construction of a moving picture coding and/or decoding system in which a variable-length coding and/or decoding system according to the present invention is built.

FIG. 56 is a block diagram which schematically shows a moving picture coding and/or decoding system in which the aforementioned variable-length coding and/or decoding system is incorporated.

In a moving picture encoder 709 as shown in FIG. 56A, the variable-length coding, the channel coding, the multiplexing and so forth of the data coded by a source encoder 702 are carried out by a moving picture multiplexing section 703. In addition, after the smoothing of transmitting speed is carried out by a transmitting buffer 704, they are transmitted to a transmitting or storing system 705 as coding data. A controlling section 701 controls the source encoder 702 and the moving picture multiplexing section 703 in view of the buffer capacity of the transmitting buffer 704.

On the other hand, in a moving picture decoding section 710 as shown in FIG. 56B, the coding data transmitted from the transmitting or storing system 705 is temporarily stored in a receiving buffer 706. In addition, after the multiplexing division, the channel code decoding and the variable-length code decoding of the decoding data are carried out by a moving picture multiplexing dividing section 707, the data is transmitted to a source decoder 708, and a moving picture is finally decoded.

Figure 57A:
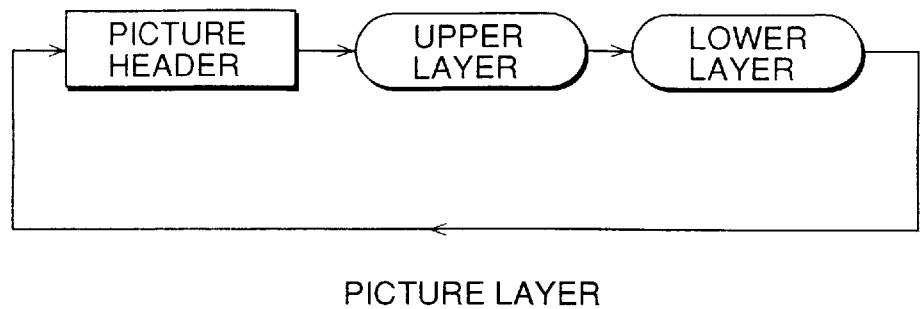
FIGS. 57A and 57C are views showing syntax of coding data in the moving picture coding and/or decoding system in this preferred embodiment.
Figure 57B:
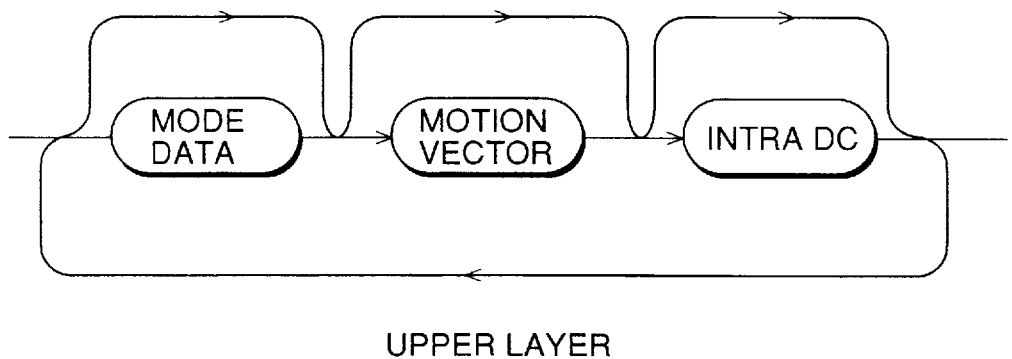
Figure 57C:
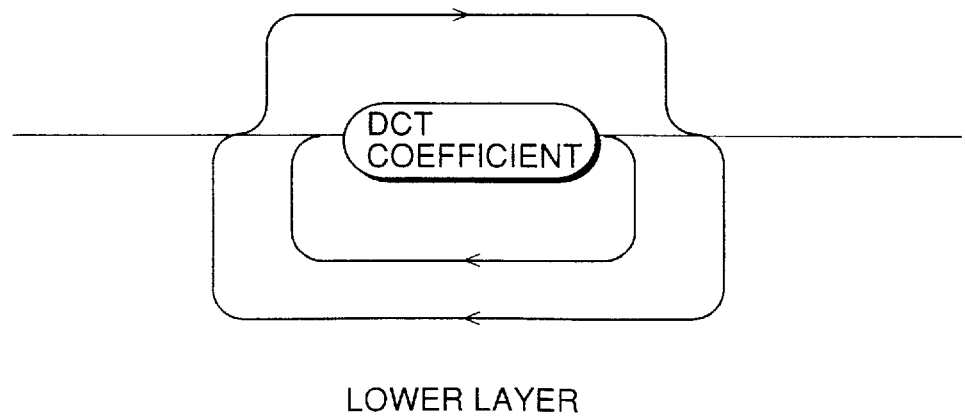

FIG. 57 shows the syntax of the moving picture coding method in the moving picture encoder 709 and the moving picture multiplexing dividing section 707 in FIG. 56. In the upper layer of the picture layers as shown in FIG. 57A, data such as mode data, motion vector data and INTRA DC of a macroblock, other than DCT coefficient data, are described, and in the lower layer thereof, DCT coefficient data are described. The reversible code according to the present invention is applied to the lower layer.

Figure 58A:
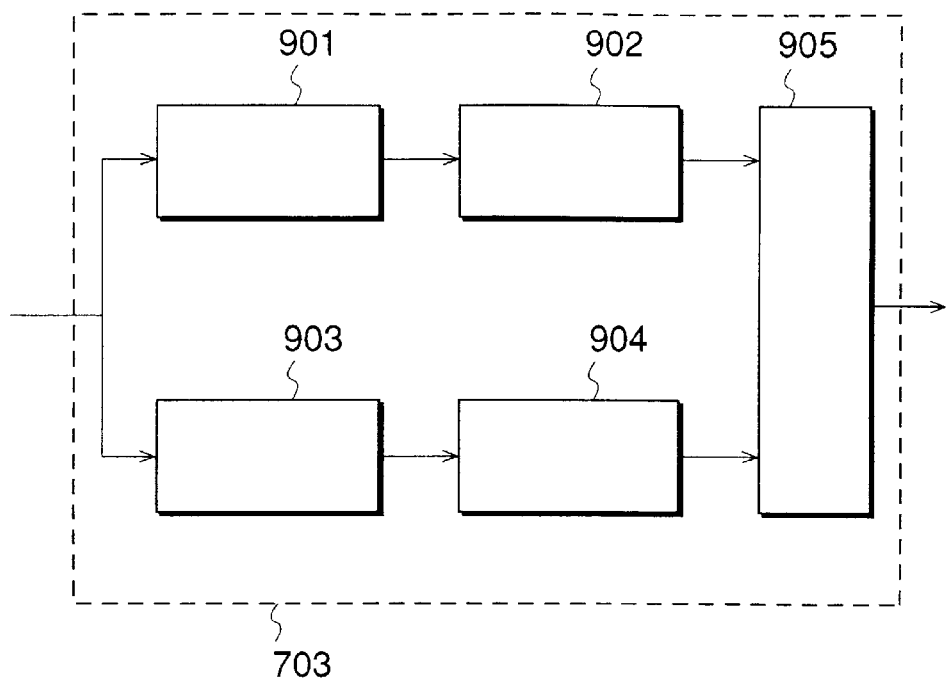
FIGS. 58A and 58B are block diagrams showing the moving picture multiplexing section and the moving picture multiplexing dividing section of FIG. 56.
Figure 58B:
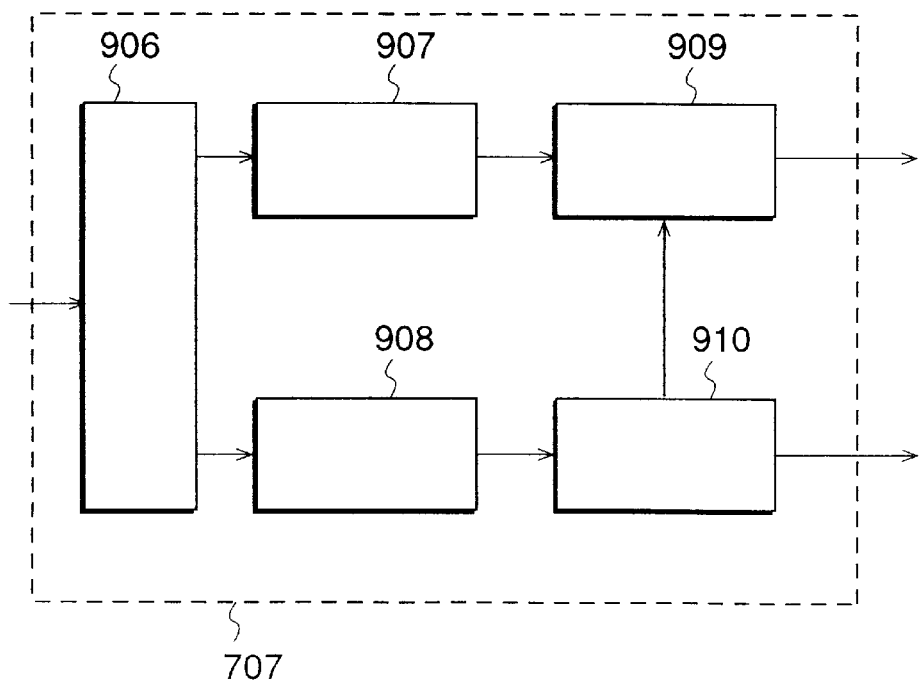

FIGS. 58A and 58B are block diagrams showing the detailed constructions of the moving picture multiplexing section 703 and the moving picture multiplexing dividing section 707 of FIG. 56. Out of the coding data supplied from the source encoder 702 of FIG. 56, with respect to the data such as the mode data, the motion vector data and the INTRA DC, other than the DCT coefficient data, described in the upper layer, after the usual variable-length coding is carried out in an upper-layer variable-length encoder 901, the channel coding is carried out in an upper-layer channel encoder 902 by means of an error correcting detection signal which has a high correction capacity although it has a high redundancy, and the data thus processed is transmitted to a multiplexing section 905.

On the other hand, out of the coding data supplied from the source encoder 702, the DCT coefficient data is coded into a reversible data by means of a lower-layer variable-length encoder 903. Then, after the channel coding thereof is carried out in a lower-layer channel encoder 904 by means of an error correcting detection signal which has a low redundancy, the data thus processed is transmitted to the multiplexing section 905. In the multiplexing section 905, the coding data of the upper and lower layers are multiplexed to be transmitted to the transmitting buffer 704.

In the moving picture multiplexing dividing section 707 as shown in FIG. 58B, the coded data supplied from the receiving buffer 706 is divided into the upper and lower layers by means of a multiplexing dividing section 906. The coded data in the upper layer is decoded by means of an upper-layer channel decoder 907, and the decoded result is transmitted to an upper-layer variable-length decoder 909. The coded data in the lower layer is decoded by means of a lower-layer channel decoder 908, and the decoded result is transmitted to a lower-layer variable-length decoder 910.

The lower-layer variable-length decoder 910 decodes the reversible code, and transmits the decoded result to the source decoder 708 and the upper-layer variable-length decoder 909. The upper-layer variable-length decoder 909 decodes the variable-length code serving as the coded data in the upper layer, and rewrites the coding results on the basis of the decoded result of the upper-layer variable-length decoder 910.

The lower-layer variable-length encoder 903 in FIG. 58A corresponds to the coding section 213 in FIG. 50, and the lower-layer variable-length decoder 910 in FIG. 58B corresponds to the decoding section 214 in FIG. 50.

As can be seen from the moving picture coding and/or decoding system in this preferred embodiment, when the coding method has syntax as shown in FIG. 57, it is not only necessary for the variable-length code itself to be able to be decoded in either directions, but it is also necessary for the variable-length code to be able to be decoded syntactically in either direction. In this preferred embodiment, this requirement can be satisfied by the code-word table as described below.

FIGS. 59 through 63 show examples of a code-word table of variable-length codes of DCT coefficients used in the lower-layer variable-length encoder 903. In addition, FIG. 64 shows a code-word table of escape codes.

In the source encoder 702, with respect to a block having DCT coefficients of 8×8 after quantization, the scanning in the block is carried out to derive a LAST (0: non-zero coefficient at the portion other than the last of the block, 1: non-zero coefficient at the last of the block), a RUN (the number of zero-run before the non-zero coefficient), and a LEVEL (the absolute value of the coefficient), to transmit the result to the moving picture encoder 709.

The lower-layer variable-length encoder 903 in the moving picture encoder 709 has a code-word table (a first code-word table) of non-LAST coefficients wherein the reversible codes (VLC-CODE) correspond to the non-LAST coefficients, RUN and LEVEL of INTRA and INTER as shown in FIGS. 59 and 60, and a code-word table (a second code-word table) of LAST coefficients wherein the reversible codes (VLC-CODE) correspond to the LAST coefficients, RUN and LEVEL of INTRA and INTER as shown in FIGS. 61 and 62. On the basis of the mode data, in the case of INTRA, the code-word tables of the non-LAST coefficients and the LAST coefficients of INTRA are selected, and in the case of INTER, the code-word tables of the non-LAST coefficients and the LAST coefficient of INTER are selected, to carry out the coding. Furthermore, "S" at the final bit of VLC-CODE in FIGS. 61 and 62 indicates the sign of the LEVEL. When "S" is "0", the sign of the LEVEL is positive, and when "S" is "1", it is negative.

Figure 64:
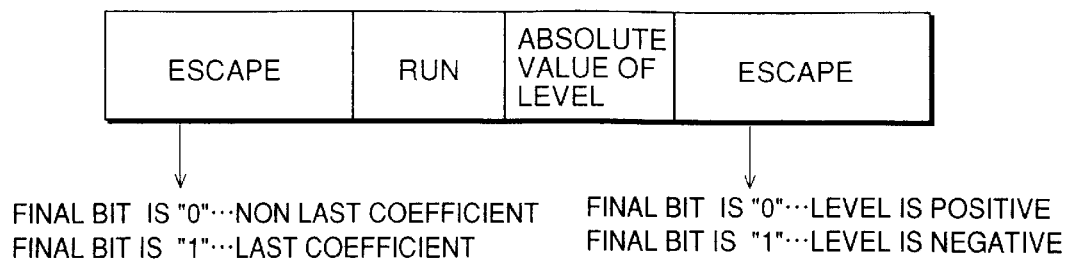
FIG. 64 is a view showing a coding method of code words which do not exist the code-word table in the same preferred embodiment.

With respect to the coefficients which do not exist in this code-word, the RUN and the absolute value of the LEVEL are coded into a fixed-length code as shown in FIG. 64, and escape codes are added to the head and end of the fixed-length code, so that the signs of the LAST coefficient and the LEVEL can be determined by the last bit of the escape code. FIG. 63 shows a code-word table of the escape codes. In this table, "t" at the last bit of VLC-CODE used as an escape code indicates whether the escape code is a LAST coefficient when "t" is added to the head of the fixed-length code. When "t" is "0", the escape code is an non-LAST coefficient, and when "t" is "1", the escape code is a LAST coefficient. In addition, "t" indicates the sign of the LEVEL. When it is "0", the sign of LEVEL is positive, and when it is "1", the sign of LEVEL is negative.

Figure 65:
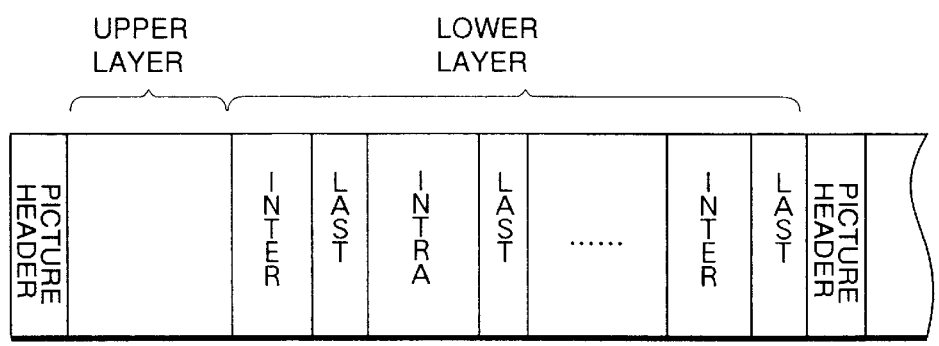
FIG. 65 is a view showing an example of coding data in the same preferred embodiment.

FIG. 65 shows an example of coding data in the preferred embodiment. As shown in FIG. 65, when the decoding is carried out in the forward direction in the lower layer, since the code of the LAST coefficient always exists at the end of a block having a DCT coefficient of 8×8 picture elements, it is possible to decide the end of the block. On the other hand, when the decoding is carried out in the backward direction, it is possible to decide the head of the block on the basis of the appearance of the code of the LAST coefficient of the last block in one address. In this code, the LAST coefficient is commonly used in INTRA mode and INTER mode so that it is possible to decide the head of the block even if the mode exists every macroblock.

With respect to the first block in the lower layer, a dummy LAST coefficient is previously coded at the prefix of the lower layer by means of the lower-layer variable-length encoder 903, or in the lower-layer variable-length decoder 910, the number of bits of the lower layer is previously calculated on the basis of the number of bits up to a synchronizing signal of the next frame, to compare it with the number of the decoded bits, or a dummy LAST coefficient is inserted to the head of the lower layer by means of a buffer in the lower-layer variable-length decoder 910, so that it is possible to decide the head of the lower layer when the decoding is carried out in the backward direction.

In the case of the forward direction, the reversible codes stored in the code-word table as shown in FIGS. 59 to 62 are read until two "0"s appear if the 1 bit of the head is "0", and until two "1"s appear if the 1 bit of the head is "1", so that it can be seen that the next 1 bit is the final bit representative of the sign of the LEVEL. In the case of the backward direction, the first 1 bit indicates the sign of the LEVEL, so that the reversible code may be read until two "0"s appear if the next 1 bit is 0, and until two "1"s appear if the next 1 bit is "1".

Figure 66:
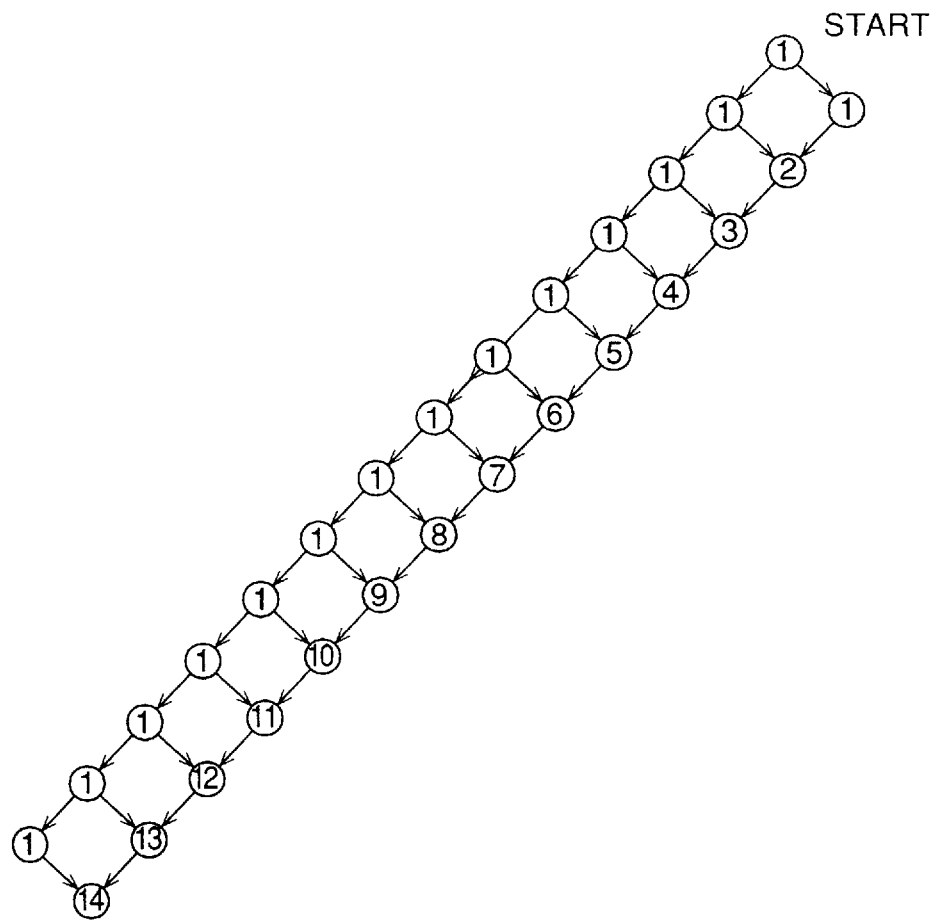
FIG. 66 is a view showing a decoding graph in the same preferred embodiment.

FIG. 66 shows a decoding graph for decoding the reversible code applied to the variable-length code of the DCT coefficient used in the lower-layer variable-length encoder 903 in the preferred embodiment. With respect to the coding data which remove the bit of the head and the two bits of the end in the forward direction, the decoded value can be calculated by this decoding graph.

In this decoding graph, if the bit at the head is "0", it goes along the right arrow when "0" appears, and it goes along the left arrow when "1" appears. If the bit at the head is "1", it goes along the right arrow when "1" appears, and it goes along the left arrow when "0" appears.

In accordance with the Shalkwijk's algorithm as mentioned above, when the left arrow is selected, a rank order value with respect to binary code systems of the same code-length may be the total of the values obtained by subtracting the value of the joint at the starting point of the arrow from the value of the joint at the end point thereof.

On the other hand, if the bit at the head is "0", the coded value may be a value obtained by adding the rank order value to twice as large as the total of the values of joints along the line inclined to the right from the joint at the end point. If the bit at the prefix is "1", the decoded value may be a value obtained by adding the value of the joint at the end point to twice as large as the total of the total of the values of joints along the line inclined to the right from the joint at the end point.

For example, if the code string to be decoded is "0110101", the bit at the head and the two bits at the end in the forward direction are removed to be "1101". Since the bit at the head is "0", it goes along the right arrow when "0" appears in the decoded graph, and it goes along the left arrow when "1" appears therein. In this case, since the difference between the values of the joints when it goes along the left arrow is (1−1)+(1−1)+(4−3)=1, the rank order value is 1. Since the most significant bit is "0", 13 is obtained by adding the rank order 1 to twice as large as the total of the values of the joints along the line inclined to the right from the joint at the end point, i.e. (1+2+3)×2=12, and it is possible to derive the decoded value of this code word to be 13.

FIGS. 67 through 69B show examples of decoded-value tables used in the lower-layer variable-length decoder 910. FIGS. 67 through 68 show examples of decoded-value tables of non-LAST coefficients wherein the non-LAST coefficients, RUNs and LEVELs of INTRA and INTER correspond to the decoded-values. FIGS. 69A and 69B show decoded-value tables of LAST coefficients wherein LAST coefficients, RUNs and LEVELs of INTRA and INTER correspond to the decoded-values. In addition, FIG. 69A is a decoded-value table of escape codes.

In these examples, it can be seen from FIG. 69A that for example, in the decoded value 13, the LAST coefficient is 1, the RUN number is 3, the absolute value of the LEVEL is 1. In addition, since the least significant bit is "1", it can be seen that the LEVEL is negative. Moreover, it can be seen from FIG. 70 that the escape code has been decoded when the decoded value 41 has been decoded. It is determined as to whether it is a LAST coefficient or a non-LAST coefficient at the last bit of the escape code. With respect to the subsequent 13 bits, the RUN and the absolute value of the LEVEL are decoded in the fixed-length decoding section 210. Thereafter, the escape code is decoded again, and the sign of the LEVEL is determined by the last bit.

As an example, the case that the code string of the subject to be coded is "11000001000011100010111100010" will be considered. In this case, since the final bit of the escape code "11000010" at the prefix is "0", it is a non-LAST coefficient, and the fixed-length code of the subsequent 13 bits is calculated. Since the more significant 6 bits of the subsequent 13 bits indicate the RUN, the RUN is 7 in "000111". Since the less significant 7 bits indicate the absolute value of the LEVEL, the absolute value of the LEVEL is 12 in "0001011". Since the final bit of the escape code "11000010" is "0", the LEVEL is positive. In this way, the decoding can be carried out.

Figure 71:
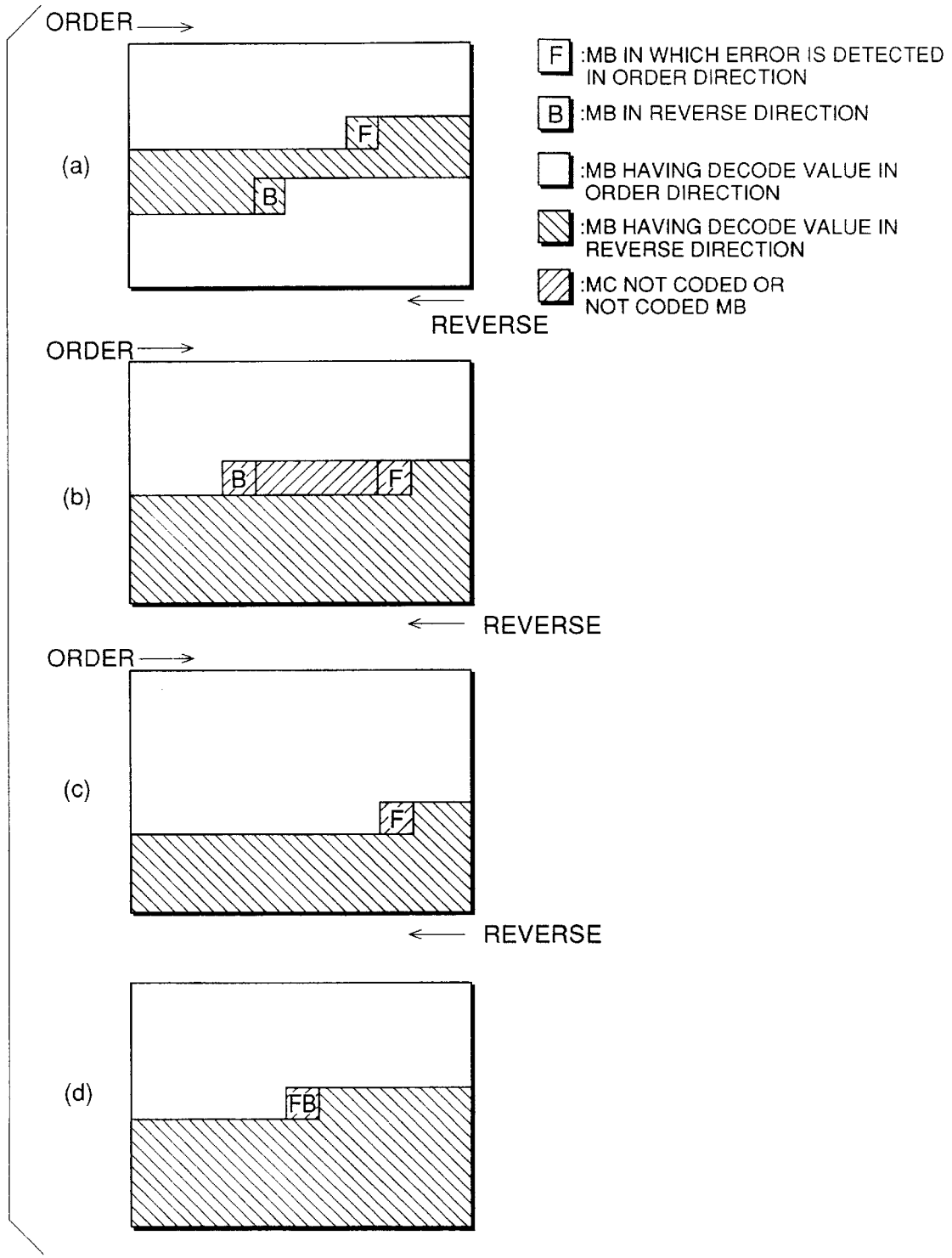
FIG. 71 is a view explaining the operation of the decoded-value deciding section of FIG. 50.

The decoded-value deciding section 212 decides a decoded value on the basis of the decoded result thus obtained by the forward decoder 209 (which will be hereinafter referred to as a "forward decoded result"), and the decoded result obtained by the backward decoder 211 (which will be hereinafter referred to as a "backward decoded result"), and outputs a final decoded result. That is, if there is an error in the coding data, since the bit pattern which has existed occurs as a decoded result of the lower-layer channel decoder 908 or as a code word, the existance of the error can be sought. Therefore, the decoded-value deciding section 212 decides the decoded value on the basis of the decoded results at these forward and backward directions as shown in FIG. 36. Furthermore, FIG. 71 shows a method for deciding a decoded value in the lower layer.

First, as shown in FIG. 71A, when the positions (error detected positions) of the macroblocks wherein errors are detected in the forward and backward decoded results do not pass each other, only the decoded result of the macroblock wherein no error has been detected is used as the decoded value, and the decoded results at the two error detected positions are not used as the decoded value. Then, on the basis of the decoded result of the mode data in the upper layer, the decoded result in the upper layer is rewritten so that the INTRA macroblock is indicated by the last frame as it is and the INTER macroblock is indicated only by the motion compensation from the last frame.

In addition, as shown in FIG. 71B, when the error detected positions pass each other in the forward and backward decoded results, the decoded result wherein no error has been detected in both of the decoded results is used as a decoded value. In this case, the decoded results between the code words of the two error detected positions are not used decoded values. In addition, on the basis of the decoded result of the mode data in the upper layer, the decoded result in the upper layer is rewritten so that the INTRA macroblock is indicated by the last frame as it is and the INTER macroblock is indicated only by the motion compensation from the last frame.

As shown in FIG. 71C, when an error has been detected in only one of the decoded results in the forward and backward directions (in this example, an error has been detected only in the forward detected result), the macroblock is not used as the decoded value. In addition, on the basis of the decoded result of the mode data in the upper layer, the decoded result in the upper layer is rewritten so that the INTRA macroblock is indicated by the last frame as it is and the INTER macroblock is indicated only by the motion compensation from the last frame. As the decoded value with respect to the subsequent macroblocks, the decoded value in the backward direction is used.

Moreover, as shown in FIG. 71D, when errors are detected in either of the forward decoded result and the backward decoded result in the same macroblock, the decoded value of the macroblock at the error detected position is abandoned so as not to be used as the decoded value. In addition, on the basis of the decoded result of the mode data in the upper layer, the decoded result in the upper layer is rewritten so that the INTRA macroblock is indicated by the last frame as it is and the INTER macroblock is indicated only by the motion compensation from the last frame. As the decoded value with respect to the subsequent macroblocks, the decoded value in the backward direction is used.

Figures 72, 73:
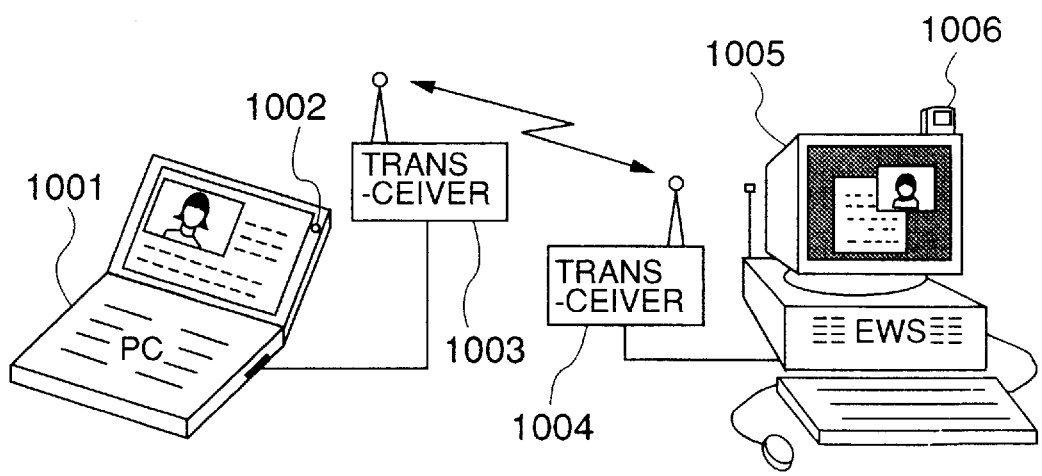
FIG. 72 is a view showing the coding/decoding order of a macroblock in the same preferred embodiment.
FIG. 73 is a view showing an example of a system in which a variable-length coding and/or decoding system according to the present invention is built.

The coding/decoding order of the macroblock may be determined by a method other than that in the aforementioned preferred embodiment. For example, a method for determining the order as shown in FIG. 72 may be used so that the important central portions of the decoded screen can be saved when an error exists. That is, on the basis of the decoding in either direction, since the possibility that the first portion and the last portion of the coding data between the adjacent synchronizing codes are correctly decoded is high, the order is determined so that these portions are arranged at the central portion.

Furthermore, while the preferred embodiments of the present invention have been applied to the variable-length coding of a DCT coefficient, the present invention can be applied to the variable-length coding of other source symbols.

In addition, in the aforementioned preferred embodiments, the present invention has been applied to only binary codes, but it can be easily applied to hypercomplex codes, and the same effects can be obtained.

Finally, referring to FIG. 72, as an application of the present invention, the preferred embodiment of an image transmitter-receiver to which a variable-length coding and/or decoding system according to the present invention is applied, will be described below.

An image data signal inputted by a camera 1002 provided in a personal computer (PC) 1001 is coded by means of a variable-length coding system built in the PC 1001. In this case, the source symbol is, for example, DCT coefficient data obtained by the discrete cosine transform of an input image data signal or a predictive error signal which is a difference between an input image data signal and a predictive image data signal, by means of a DCT circuit, to be quantized by a quantizing circuit. Of course, the source symbol is not limited to such DCT coefficient data. The coding data outputted from the variable-length coding system is multiplexed with other audio data and so forth, and then, transmitted by an audio transmitter-receiver 1003 to be received by another audio transmitter-receiver 1004. The signal received by the audio transmitter-receiver 1004 is divided into coding data, audio data and so forth. The coding data of the image data signal is decoded by a variable-length decoding system built in a work station (EWS) 1005, to be displayed on a display of the EWS 1005.

On the other hand, the image data signal inputted by a camera 1006 provided in the EWS 1005 is coded by means of a variable-length coding system built in the EWS 1005 similar to the aforementioned method. The coded data is multiplexed with other audio data and so forth, and transmitted by the audio transmitter-receiver 1004 to be received by the audio transmitter-receiver 1003. The signal received by the audio transmitter-receiver 1003 is divided into coded data, audio data and so forth. The coded data of the image data signal is decoded by means of a variable-length decoding system built in the PC 1001, and displayed on a display of the PC 1001.

The variable-length coding and/or decoding system according to the present invention has a code-length corresponding to the frequency of appearance of a source symbol. In addition, this system has a high efficiency since the number of useless bit patterns is smaller than that of the conventional system. Moreover, it can configure a reversible variable-length code which can be decoded in either of the forward and backward directions. Therefore, it is particularly useful for a transmitter-receiver using a channel wherein many errors occur such as an audio channel as shown in FIG. 73.

As mentioned above, a variable-length coding and/or decoding system according to the present invention can decode with a smaller memory capacity than those of conventional systems, and it can be applied to coding wherein the number of source symbols is great although conventional systems have not been able to be applied thereto.

Specifically, it can be applied to a moving picture coding and/or decoding system, and it can provide a moving picture coding and/or decoding system which is resistant to errors.

As mentioned above, according to the present invention, there is provided a variable-length coding and/or decoding system which can decode in either of the forward and backward directions and which is practical with respect to coding efficiency, the memory capacity necessary for the system, and so forth.

That is, the first preferred embodiment of a variable-length coding system, according to the present invention, includes a code-word table which can be decoded in either of the forward and backward directions and which stores a plurality of code words so as to correspond to source symbols, the plurality of code words being configured so that a pause of the code word can be sought by the weight of the code word, i.e. by the number of "1" or "0" of the code word. By selecting a code word corresponding to the inputted source symbol from the code-word table, it is possible to obtain a variable-length code wherein the number of useless bit patterns is small and the coding efficiency is high. In addition, by selecting a code having the minimum average code-length from a plurality of code configuring methods and parameters on the basis of the probability of the source symbol, it is possible to produce a variable-length code corresponding to the frequency of appearance of the source symbol.

According to the first preferred embodiment of a variable-length decoding system, when the decoded value is decided on the basis of the decoded results of the variable-length code in either of the forward and backward directions, by deciding the decoded value at the error detected position in accordance with the detected result of the error when these decoded result is obtained, when the reversible code outputted from the aforementioned variable-length coding system is transmitted through a channel wherein many errors occur such as an audio channel, the decoding is effectively carried out against the error, so that the original source symbol can be stably reproduced.

According to the second preferred embodiment of a variable-length coding and/or decoding system, it is possible to code a source symbol having a low probability of appearance as a fixed-length code to which an escape code is added, and to code/decode the fixed-length code portion independent of the reversible code. Therefore, if a source symbol wherein the number thereof is very great such as the quantized orthogonal transform coefficient in the image encoder/decoder is coded, it is possible to restrain the maximum code-length and to effectively reduce the memory capacity.

The third preferred embodiment of a variable-length decoding system uses a variable-length code word which can determine the code-length by the number of the weights of code words and which is configured by code words decodable in either of the forward and backward directions. In this system, the value determined by the Pascal's triangle is used as the value of a joint, and the decoded value is calculated on the basis of a directed graph (a decoded graph) wherein the arrows from the respective joints to the next joint correspond to "1" and "0", so that it is possible to decode a variable-length code with a small memory capacity even if the number of source symbols is great.

According to the fourth preferred embodiment of a variable-length coding and/or decoding system, a first code-word table corresponding to the orthogonal transform coefficients other than the last of a block is configured for each of a plurality of coding modes. However, by using a second code-word table corresponding to the last of the block in common for each of the coding modes, it is possible to cope with the change of the code-word table by the coding mode, and to seek a pause of the block by appearance of a code word representative of the last orthogonal transform coefficient of the last block. Therefore, the decoding can be carried out in either directions syntactically. In addition, by separately providing the second code-word table with respect to the produced orthogonal transform coefficients such as INTRA mode and INTER mode, and a plurality of coding mode having different frequency of appearance, the coding efficiency can be enhanced.

What is claimed is:

1. A variable-length coding system for assigning, to a plurality of source symbols, a code word of a code length corresponding to an occurrence probability of each of the source symbols, and for outputting coded data corresponding to an inputted source symbol, said variable-length coding system comprising:

a code word table for storing a plurality of code words corresponding to respective source symbols, the code words being able to be decoded in either of a forward direction and a backward direction; and coding means for selecting a code word corresponding to the inputted source symbol from said code word table if a code word corresponding to the inputted source symbol is stored in said code word table, and for generating a code word comprising an escape code including a prefix and a suffix added to a predetermined code representing the inputted source symbol when no code word corresponding to the inputted source symbol is stored in the code word table, the escape code being decodable in either of a forward and a backward direction, is added to the a prefix and a suffix of a fixed-length code, when the code word corresponding to the inputted source symbol has not been stored, and for outputting coded data corresponding to the inputted source symbol and comprising one of a selected code word and a generated code word.

2. A variable-length coding system for assigning, to a plurality of source symbols, a code word of a code length corresponding to an occurrence probability of each of the source symbols, and for outputting coded data corresponding to an inputted source symbol, said variable-length coding system comprising:

a code word table for storing a plurality of code words corresponding to respective source symbols, the code words being able to be decoded in either of a forward direction and a backward direction; and coding means for selecting a code word corresponding to the inputted source symbol from said code word table if a code word corresponding to the inputted source symbol is stored in the code word table, and for generating a code word comprising an escape code including a prefix and a suffix added to a fixed length code representing the inputted source symbol when no code word corresponding to the inputted source symbol is stored in the code word table, the escape code word being decodable in either of a forward and a backward direction, and for outputting coded data corresponding to the inputted source symbol and comprising one of a selected code word and a generated code word.

3. A variable-length coding system for assigning to a plurality of source symbols, a code word of a code length corresponding to an occurrence probability of each of the source symbols, and for outputting coded data corresponding to an inputted source symbol, said variable-length coding system comprising:

a code word table for storing a plurality of code words corresponding to respective source symbols, the code words being able to be decoded in either of a forward direction and a backward direction; and coding means for selecting a code word corresponding to the inputted source symbol from the code word table if a code word corresponding to the inputted source symbol is stored in the code word table, and for generating a code word corresponding to the inputted source symbol comprising a variable-length escape code and a predetermined code corresponding to the inputted source symbols when no code word corresponding to the inputted source symbol is stored in the code word table, a variable-length escape code of a generated code word being able to be decoded in either of a forward direction and a backward direction, and for outputting coded data corresponding to the inputted source symbol and comprising one of a selected code word and a generated code word.

4. A variable-length coding system for assigning, to a plurality of source symbols, a code word of a code length corresponding to an occurrence probability of each of the source symbols, and for outputting coded data corresponding to an inputted source symbol, said variable-length coding system comprising:

a code word table for storing a plurality of code words corresponding to respective source symbols, the code words being able to be decoded in either of a forward direction and a backward direction; and coding means for selecting a code word corresponding to the inputted source symbol from the code word table if a code word corresponding to the inputted source symbol is stored in the code word table, and for generating a code word corresponding to the inputted source symbol comprising a variable-length escape code and a fixed-length code corresponding to the inputted source symbols when no code word corresponding to the inputted source symbol is stored in the code word table, a variable-length escape code of a generated code word being able to be decoded in either of a forward direction and a backward direction, and for outputting coded data corresponding to the inputted source symbol and comprising one of a selected code word and a generated code word.

5. A variable-length coding method, comprising:

selecting a code word corresponding to an inputted source symbol from a code word table storing a plurality of code words corresponding to respective source symbols if a code word corresponding to the inputted source symbol is stored in the code word table;

generating a code word comprising an escape code including a prefix and a suffix added to a predetermined code representing the inputted source symbol when no code word corresponding to the inputted source symbol is stored in the code word table, the escape code being decodable in either of a forward and a backward direction; and outputting coded data corresponding to the inputted source symbol and comprising one of a selected code word and a generated code word.

6. A variable-length coding method, comprising:

selecting a code word corresponding to an inputted source symbol from a code word table storing a plurality of code words corresponding to respective source symbols if a code word corresponding to the inputted source symbol is stored in the code word table;

generating a code word comprising an escape code including a prefix and a suffix added to a fixed length code representing the inputted source symbol when no code word corresponding to the inputted source symbol is stored in the code word table, the escape code being decodable in either of a forward and a backward direction; and outputting coded data corresponding to the inputted source symbol and comprising one of a selected code word and a generated code word.

7. A variable length coding method, comprising:

selecting a code word corresponding to the inputted source symbol from the code word table storing a plurality of code words corresponding to respective source symbols if a code word corresponding to the inputted source symbol is stored in the code word table;

generating a code word corresponding to the inputted source symbol comprising a variable-length escape code and a predetermined code corresponding to the inputted source symbols when no code word corresponding to the inputted source symbol is stored in the code word table, a variable-length escape code of a generated code word being able to be decoded in either of a forward direction and a backward direction; and outputting coded data corresponding to the inputted source symbol and comprising one of a selected code word and a generated code word.

8. A variable length coding method, comprising:

selecting a code word corresponding to the inputted source symbol from the code word table storing a plurality of code words corresponding to respective source symbols if a code word corresponding to the inputted source symbol is stored in the code word table;

generating a code word corresponding to the inputted source symbol comprising a variable-length escape code and a fixed-length code corresponding to the inputted source symbols when no code word corresponding to the inputted source symbol is stored in the code word table, the variable-length escape code being able to be decoded in either of a forward direction and a backward direction; and outputting coded data corresponding to the inputted source symbol and comprising one of a selected code word and a generated code word.

* * * * *